(12) United States Patent
Pang et al.

(10) Patent No.: US 11,950,507 B2
(45) Date of Patent: Apr. 2, 2024

(54) ORGANIC ELECTROLUMINESCENCE DEVICE

(71) Applicant: BEIJING SUMMER SPROUT TECHNOLOGY CO., LTD., Beijing (CN)

(72) Inventors: Huiqing Pang, Beijing (CN); Ru Jia, Beijing (CN); Zhihao Cui, Beijing (CN); Xiao Chen, Beijing (CN); Chuanjun Xia, Beijing (CN); Chi Yuen Raymond Kwong, Beijing (CN); Jing Wang, Beijing (CN)

(73) Assignee: BEIJING SUMMER SPROUT TECHNOLOGY CO., LTD., Beijing (CN)

(*) Notice: Subject to any disclaimer, the term of this patent is extended or adjusted under 35 U.S.C. 154(b) by 548 days.

(21) Appl. No.: 17/108,448

(22) Filed: Dec. 1, 2020

(65) Prior Publication Data

US 2021/0167298 A1 Jun. 3, 2021

(30) Foreign Application Priority Data

Dec. 3, 2019 (CN) .................. 201911209540.X

(51) Int. Cl.
*H01L 51/50* (2006.01)
*H10K 85/60* (2023.01)
*H10K 50/155* (2023.01)

(52) U.S. Cl.
CPC ....... *H10K 85/6572* (2023.02); *H10K 85/631* (2023.02); *H10K 50/155* (2023.02)

(58) Field of Classification Search
None
See application file for complete search history.

(56) References Cited

U.S. PATENT DOCUMENTS

| 5,703,436 | A | 12/1997 | Forrest et al. |
| 5,707,745 | A | 1/1998 | Forrest et al. |
| 5,844,363 | A | 12/1998 | Gu et al. |
| 6,097,147 | A | 8/2000 | Baldo et al. |
| 6,360,562 | B1 | 3/2002 | Kodas et al. |
| 7,279,704 | B2 | 10/2007 | Walters et al. |
| 10,103,338 | B1 | 10/2018 | Nakano et al. |
| 2003/0230980 | A1 | 12/2003 | Forrest et al. |

(Continued)

FOREIGN PATENT DOCUMENTS

| CN | 101400757 A | 4/2009 |
| CN | 103664994 A | 3/2014 |

(Continued)

OTHER PUBLICATIONS

Japanese Second Office Action for Japanese Application No. 2020-201176, dated Feb. 4, 2022, 2 pages with translation.

(Continued)

*Primary Examiner* — Gregory D Clark
(74) *Attorney, Agent, or Firm* — Workman Nydegger

(57) ABSTRACT

Disclosed is an organic electroluminescence device. The organic electroluminescence device has an organic layer having a specific combination in which a hole transporting material is doped with a p-type conductive doped material. The organic electroluminescence device can provide better device performance, such as lifetime improvement and voltage reduction.

21 Claims, 1 Drawing Sheet

(56) References Cited

U.S. PATENT DOCUMENTS

| | | | |
|---|---|---|---|
| 2004/0174116 A1 | 9/2004 | Lu et al. | |
| 2008/0171228 A1 | 7/2008 | Chen et al. | |
| 2009/0284143 A1 | 11/2009 | Nomura et al. | |
| 2010/0289008 A1 | 11/2010 | Jang et al. | |
| 2011/0155976 A1* | 6/2011 | Furukawa | C09D 5/32 |
| | | | 252/588 |
| 2013/0112951 A1 | 5/2013 | Xia et al. | |
| 2014/0138627 A1 | 5/2014 | Kwong et al. | |
| 2014/0319472 A1* | 10/2014 | Cho | H10K 85/657 |
| | | | 257/40 |
| 2015/0349262 A1 | 12/2015 | Zoellner et al. | |
| 2015/0364696 A1 | 12/2015 | Park et al. | |
| 2017/0186970 A1 | 6/2017 | Chen et al. | |
| 2017/0213980 A1 | 7/2017 | Nakano | |
| 2017/0222170 A1 | 8/2017 | Rothe et al. | |
| 2019/0077754 A1 | 3/2019 | Kato et al. | |
| 2019/0165278 A1 | 5/2019 | Xia | |
| 2019/0181349 A1 | 6/2019 | Xia | |
| 2020/0062778 A1* | 2/2020 | Cui | H10K 85/6576 |
| 2020/0087311 A1 | 3/2020 | Cui et al. | |
| 2020/0392122 A1 | 12/2020 | Ito et al. | |
| 2021/0119162 A1 | 4/2021 | Gao et al. | |
| 2021/0280795 A1 | 9/2021 | Cui et al. | |
| 2021/0296594 A1 | 9/2021 | Ding et al. | |

FOREIGN PATENT DOCUMENTS

| | | |
|---|---|---|
| CN | 103896966 A | 7/2014 |
| CN | 109912619 A | 6/2019 |
| CN | 112745333 A | 5/2021 |
| JP | 10-340786 A | 12/1998 |
| JP | 2008-244430 A | 10/2008 |
| JP | 2009076817 A | 4/2009 |
| JP | 2009-242339 A | 10/2009 |
| JP | 2009298779 | 12/2009 |
| JP | 2015048350 | 3/2015 |
| JP | 2015-534702 A | 12/2015 |
| JP | 2016039187 | 3/2016 |
| JP | 2016507475 | 3/2016 |
| JP | 2017-518288 A | 7/2017 |
| JP | 2017-538282 A | 12/2017 |
| JP | 2010-502807 A | 12/2020 |
| KR | 20190113589 | 10/2019 |
| WO | WO2013129835 | 9/2013 |
| WO | WO2019088231 | 9/2019 |

OTHER PUBLICATIONS

Korean Notice of Reasons for Rejection for Korean Application No. 10-2020-0166516, dated Mar. 3, 2022, 8 pages with English translation.

Chinese Second Office Action for Chinese Application No. 2020-201176, dated Feb. 4, 2022, 2 pages with translation.

Lussem B., et al., "Doping of organic semiconductors", Phys. Status Solidi A 210, No. 1, 9-43 (2013).

Office Action cited in Japanese Patent Application No. 2020-201176 dated Sep. 13, 2021.

Chinese Search Report for Chinese Application No. 201911209540X, dated Jun. 20, 2023, 6 pages.

Japanese Search Report for Japanese Application No. 2020-201176, dated Aug. 31, 2021, 43 pages.

* cited by examiner

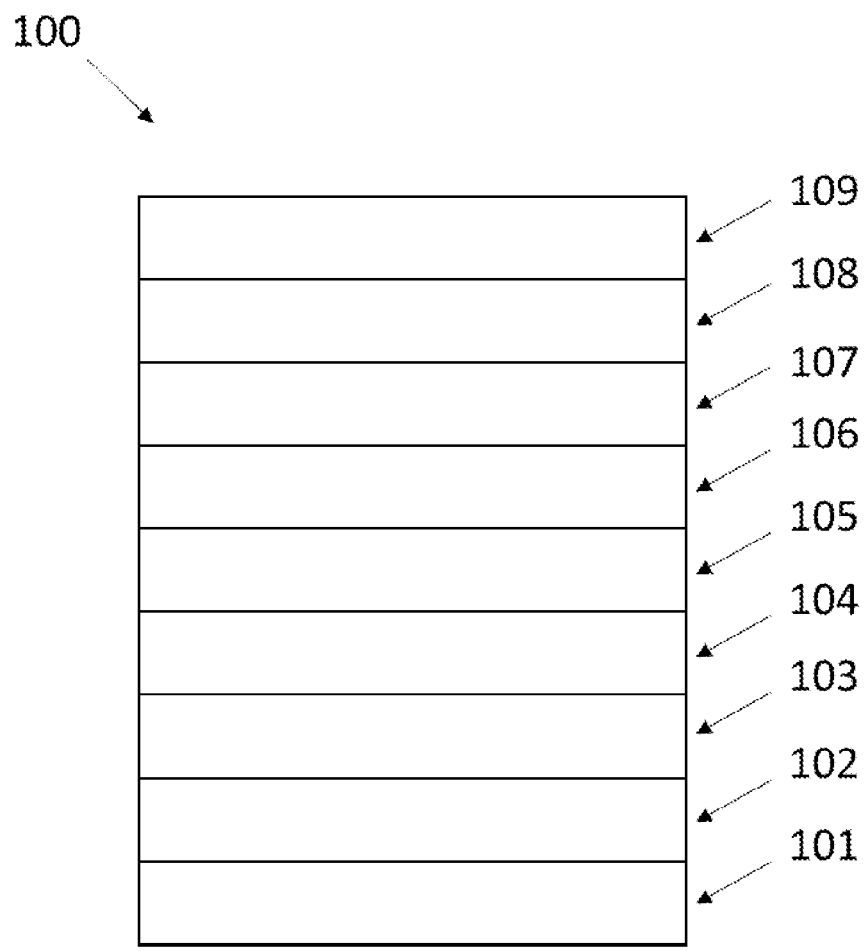

ORGANIC ELECTROLUMINESCENCE DEVICE

CROSS-REFERENCE TO RELATED APPLICATION(S)

This application claims priority to and the benefit of Chinese Patent Application No. CN 201911209540.X, filed Dec. 3, 2019, the disclosure of which is incorporated herein by reference in its entirety.

TECHNICAL FIELD

The present disclosure relates to an organic electroluminescence device, more particularly, relates to an organic electroluminescence device having a hole injection layer doped with a p-type conductive material, and a display assembly.

BACKGROUND

Organic electroluminescence devices (OLED) convert electrical energy into light by applying voltages across the device. Generally, one organic electroluminescence device includes an anode, a cathode and an organic layer disposed between the anode and the cathode. The organic layer of the electroluminescent device includes a hole injection layer, a hole transporting layer, an electron blocking layer, a light-emitting layer (including a host material and a doped material), an electron buffer layer, a hole blocking layer, an electron transporting layer, and an electron injection layer. According to different material functions, materials that consist of the organic layer can be divided into hole injection materials, hole transporting materials, electron blocking materials, host materials, light-emitting materials, electron buffer materials, hole blocking materials, electron transporting materials, and hole blocking materials. When a bias voltage is applied to the device, holes are injected from the anode to the light-emitting layer, and electrons are injected from the cathode to the light-emitting layer. The holes and electrons meet each other to form excitons, and the excitons recombine and emit light.

The hole injection layer can be a single-material layer, or can be a multiple-material layer. The multiple-material layer generally utilizes a hole transporting layer material doped with a certain proportion of p-type conductive doped material. The doping proportion is usually lower than 5%, and the most commonly used doping proportion is between 1% and 3%. The p-type doping effect can be achieved through the strong electron-capturing ability of the p-type conductive doped material, which improves hole injection and conductivity. Such hole injection layer doped with the p-type conductive material has been widely used, because it usually has a lower voltage than a single layer material. The LUMO energy level of commonly used p-type conductive materials is about −5.1 eV, so such materials can be matched with hole transporting materials whose HOMO energy level is about −5.1 eV. However, there are a variety of hole transporting materials in the industry nowadays, including those whose HOMO energy level is −5.2 eV or deeper. However, p-type conductive materials whose LUMO energy level is −5.1 eV or more shallow may not be able to effectively match hole transporting materials whose HOMO energy level is −5.2 eV or deeper to achieve the p-type doping effect. Therefore, in order to promote the widespread application of p-type doping technology, it is necessary to develop and utilize p-type conductive doped materials whose LUMO energy level is deeper than −5.1 eV. On the other hand, in OLED devices, the HOMO energy level of the host material of most light-emitting layers is around −5.4 eV to −5.6 eV, much deeper than that of the hole transporting layer material, causing holes to encounter a high barrier when they enter the light-emitting layer from the transporting layer. In order to solve this problem, an electron blocking layer (or called a second hole transporting layer) whose HOMO energy level is between the HOMO energy level of the hole transporting layer and the HOMO energy level of the light-emitting layer is usually inserted between the hole transporting layer and the light-emitting layer, that is, a first hole transporting layer and a second hole transporting layer are established between the hole injection layer and the light-emitting layer to form a structure in which potential energy shows a progressive change. However, the hole injection in such structure still faces a large total barrier height from the HOMO energy level of the first hole transporting layer to the HOMO energy level of the host material of the light-emitting layer, and the addition of an extra material also brings more interface defects, thereby affecting the lifetime and increasing the complexity of the process. Therefore, if a hole transporting material whose HOMO energy level is deeper can be used as the only hole transporting material layer between the hole injection layer and the light-emitting layer, not only the potential barrier that holes are faced with from the hole injection layer to the light-emitting layer can be reduced, but also an extra material can be dispensed with. Furthermore, if the same hole transporting material with deep HOMO energy level is also used in the hole injection layer and is doped with a p-type conductive doped material whose LUMO energy level is matched with that of such hole transporting material, the combination of both materials can reduce the total potential barrier for hole injection and avoid of utilization of simple and effective devices which use multiple hole transporting materials.

It is relatively common to use organic materials with deep HOMO energy levels as transporting materials in OLED devices. For example, the compound,

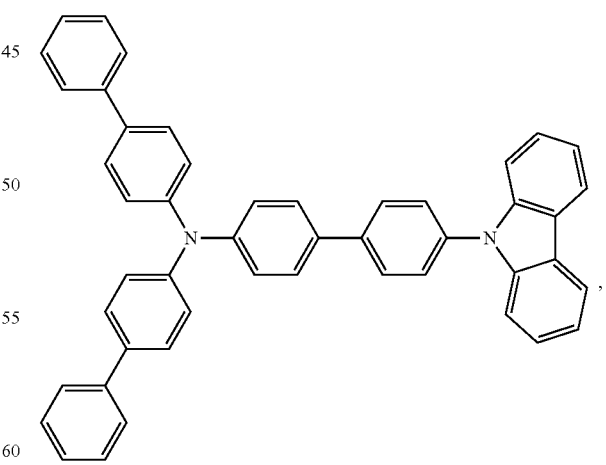

whose HOMO energy level is −5.28 eV, was disclosed as a hole transporting layer material in JP2009076817A, as an electron blocking layer material in WO2013129835A1, and as a host material in US20150364696A1. The compound,

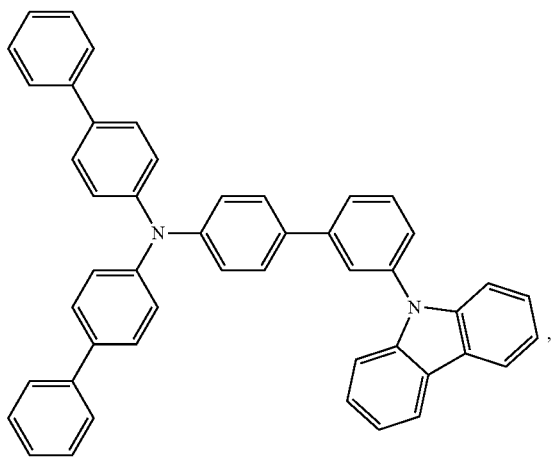

whose HOMO energy level is −5.29 eV, was also disclosed as an electron blocking layer material in WO2019088231A1 and as a hole transporting layer material in U.S. Ser. No. 10/103,338 and US20140319472A1. However, there is currently no public report that the above-mentioned deep-energy level transporting material is used as the hole injection layer material and is doped with the deep-energy level p-type conductive material.

SUMMARY

The present disclosure aims to provide an organic electroluminescence device including an organic layer having a specific combination in which a deep-HOMO energy level hole transporting material is doped with a deep-LUMO energy level p-type conductive doped material to solve at least part of the above-mentioned problems.

After in-depth research using the aforementioned ideas, the inventors have disclosed an organic electroluminescence device which includes an organic layer having a specific combination of a deep-LUMO energy level p-type conductive doped material and a deep-HOMO energy level hole transporting material. The organic electroluminescence device can provide better device performance, such as lifetime improvement and voltage reduction, and a more simplified manufacturing process.

According to an embodiment of the present disclosure, an organic electroluminescence device is disclosed. The organic electroluminescence device includes:
 an anode,
 a cathode,
 a light-emitting layer disposed between the anode and the cathode, and
 a first organic layer disposed between the anode and the light-emitting layer,
 wherein the first organic layer includes a compound of Formula 1 and a compound of Formula 2;

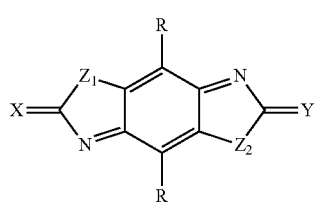

Formula 1 wherein, in Formula 1,
X and Y are, at each occurrence identically or differently, selected from NR', CR"R'", O, S or Se;
$Z_1$ and $Z_2$ are, at each occurrence identically or differently, selected from O, S or Se;
R, R', R" and R'" are, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;
each R can be identical or different, and at least one of R, R', R" and R'" is a group having at least one electron-withdrawing group;
in Formula 1, adjacent substituents are optionally joined to form a ring;

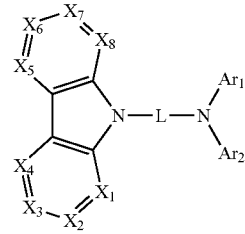

Formula 2 wherein, in Formula 2,
$X_1$ to $X_8$ are, at each occurrence identically or differently, selected from $CR_1$ or N;
L is, at each occurrence identically or differently, selected from a substituted or unsubstituted arylene group having 6 to 30 carbon atoms, a substituted or unsubstituted heteroarylene group having 3 to 30 carbon atoms, or combinations thereof;
$Ar_1$ and $Ar_2$ are, at each occurrence identically or differently, selected from a substituted or unsubstituted aryl group having 6 to 30 carbon atoms or a substituted or unsubstituted heteroaryl group having 3 to 30 carbon atoms;
$R_1$ is, at each occurrence identically or differently, selected from a group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and in Formula 2, adjacent substituents are optionally joined to form a ring.

According to another embodiment of the present disclosure, a display assembly is further disclosed. The display assembly comprises the organic electroluminescence device described above.

The present disclosure discloses an OLED device with a simple structure. The OLED device comprises an organic layer having a deep-LUMO energy level p-type conductive doped material and a deep-HOMO energy level hole transporting material, and can facilitate the injection and transporting of holes due to the effective matching of the two specific materials. In addition, since the HOMO energy level of the specific hole transporting material is close to the HOMO energy level of the host material of the light-emitting layer, the electron blocking layer can be dispensed with, achieving the simplification of the device structure, that is, the process steps are simplified. Meanwhile, because the energy levels are more matched, the process of the injection of holes from the anode and the transporting of holes to the light-emitting layer are smoother, thereby reducing the voltage. Finally, interfaces and the generation of interface defects are reduced due to the reduction of one material, and the lifetime of the device is also improved.

BRIEF DESCRIPTION OF DRAWINGS

FIG. 1 is a schematic diagram of an organic electroluminescence device 100.

DETAILED DESCRIPTION

The OLED can be fabricated on various types of substrates such as glass, plastic and metal. FIG. 1 schematically shows an organic electroluminescence device 100 without limitation. The FIGURE is not necessarily drawn to scale, and some of layer structures in the FIGURE can be omitted as needed. The organic electroluminescence device 100 includes an anode layer 101, a hole injection layer (HIL) 102, a hole transporting layer (HTL) 103, an electron blocking layer (also called a second hole transporting layer) (EBL) 104, a light-emitting layer (EML) 105, a hole blocking layer (HBL) 106, an electron transporting layer (ETL) 107, an electron injection layer (EIL) 108, and a cathode layer 109. The device 100 can be fabricated by sequentially depositing the layers described. The properties and functions of the layers as well as exemplary materials are described in detail in U.S. Pat. No. 7,279,704B2, Cols. 6 to 10, the entire contents of which are incorporated herein by reference.

There are more examples for each of these layers. For example, a flexible and transparent substrate-anode combination is disclosed in U.S. Pat. No. 5,844,363, which is incorporated by reference in its entirety. An example of p-doped hole transporting layers is m-MTDATA doped with $F_4$-TCNQ at a molar ratio of 50:1, as disclosed in U.S. Patent Application Publication No. 2003/0230980 which is incorporated by reference in its entirety. Examples of host materials are described in U.S. Pat. No. 6,360,562 issued to Thompson et al., which is incorporated by reference in its entirety. An example of n-doped electron transporting layers is BPhen doped with Li at a molar ratio of 1:1, as disclosed in U.S. Patent Application Publication No. 2003/0230980 which is incorporated by reference in its entirety. U.S. Pat. Nos. 5,703,436 and 5,707,745, both which are incorporated by reference in their entireties, disclose examples of cathodes, including composite cathodes having a thin metal layer such as Mg:Ag and an overlying transparent, conductive, sputter-deposited ITO layer. The principle and use of blocking layers are described in detail in U.S. Pat. No. 6,097,147 and U.S. Patent Application Publication No. 2003/0230980, both which are incorporated by reference in their entireties. U.S. Patent Application Publication No. 2004/0174116 which is incorporated by reference in its entirety provides examples of injection layers. The description about protective layers can be found in U.S. Patent Application Publication No. 2004/0174116 which is incorporated by reference in its entirety.

The above-mentioned layered structure is provided via non-limiting embodiments. The function of the OLED can be implemented by combining the various layers described above, or some layers can be omitted. The OLED can also include other layers that are not explicitly described herein. In each layer, a single material or a mixture of multiple materials can be used to achieve the best performance. Any functional layer can include several sub-layers. For example, the light-emitting layer can have two different layers of light-emitting materials to achieve a desired light-emitting spectrum.

In an embodiment, the OLED can be described as an OLED having an "organic layer" disposed between the cathode and the anode. This organic layer can include one or more layers.

The device fabricated in accordance with embodiments of the present disclosure can be incorporated into a wide variety of consumer products that have one or more of the electronic component modules (or units) of this device. Some examples of such consumer products include flat panel displays, monitors, medical monitors, televisions, billboards, lights for indoor or outdoor lighting and/or signaling, head-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein can also be used in other organic electronic devices listed above.

As used herein, "top" means being located furthest away from the substrate while "bottom" means being located closest to the substrate. In a case where a first layer is described as "being disposed over" a second layer, the first layer is disposed further away from the substrate. There may be other layers between the first and second layers, unless it is specified that the first layer is "in contact with" the second layer. For example, a cathode can still be described as "being disposed over" an anode, even though there are various organic layers between the cathode and the anode.

"Solution processible", as used herein, means that capable of being dissolved, dispersed or transported in a liquid medium in the form of a solution or suspension and/or deposited from a liquid medium.

The work function of the metal herein refers to the minimum amount of energy required to move an electron from the interior to the surface of an object. All "work functions of the metal" herein are expressed as negative values, that is, the smaller the numerical value (i.e., the larger the absolute value), the larger amount of energy required to pull the electron to the vacuum level. For example, "the work function of the metal is less than −5 eV" means that the amount of energy required to pull the electron to the vacuum level is greater than 5 eV.

The numerical values of highest occupied molecular orbital (HOMO) energy level and lowest occupied molecular orbital (LUMO) energy level herein are measured by electrochemical cyclic voltammetry. The electrochemical cyclic voltammetry is the most commonly used method of measuring organic material energy levels. The test method is as follows: the platinum disk electrode is used as the working electrode, the Ag/AgNO$_3$ electrode is used as the reference electrode, the platinum wire electrode is used as the auxiliary electrode, the scanning speed is 100 mV/s, the test temperature is 25° C., and the solvent is anhydrous DMF. For example, the LUMO level of HATCN measured by this method is −4.2 eV. All "HOMO energy levels" and "LUMO energy levels" herein are expressed as negative values, and the smaller the numerical value (i.e., the larger the absolute value), the deeper the energy level.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl 1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted aralkyl, substituted alkoxy, substituted aryloxy, substituted alkenyl, substituted alkynyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphoroso is used, it means that any group of alkyl, cycloalkyl, heteroalkyl, aralkyl, alkoxy, aryloxy, alkenyl, alkynyl, aryl, heteroaryl, alkylsilyl, arylsilyl, amine, acyl, carbonyl, carboxylic acid group, ester group, sulfinyl, sulfonyl and phosphoroso may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted aralkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an alkynyl group, an acyl group, a carbonyl group, a carboxylic acid group, an ester group, an ether group, a cyano group, an isocyano group, a thiol group, a sulfonyl group, a sulfinyl group and a phosphoroso group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

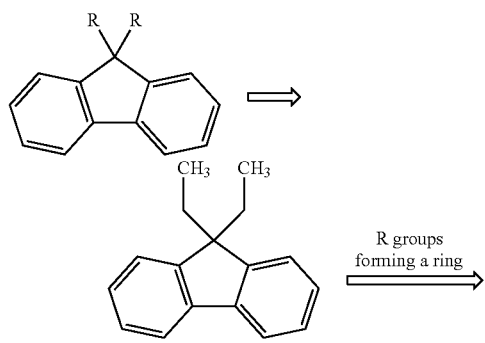

-continued

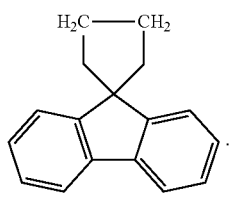

The expression that adjacent substituents can be optionally joined to form a ring is also intended to mean that two substituents bonded to carbon atoms which are directly bonded to each other are joined to each other via a chemical bond to form a ring, which can be exemplified by the following formula:

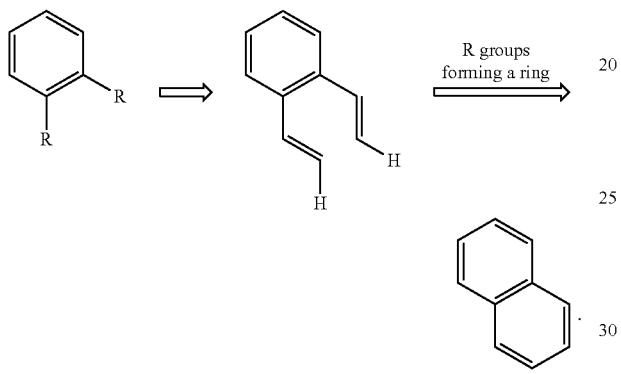

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

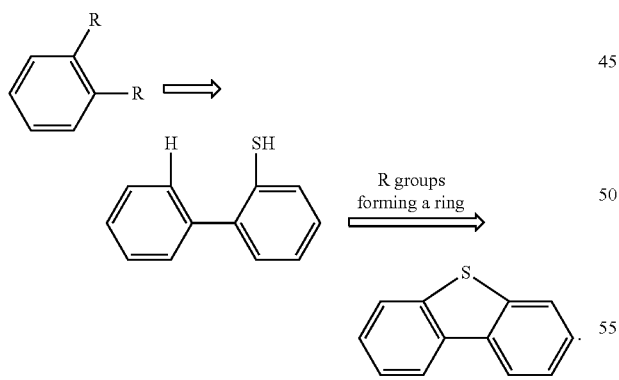

According to an embodiment of the present disclosure, an organic electroluminescence device is disclosed. The organic electroluminescence device includes:
an anode,
a cathode,
a light-emitting layer disposed between the anode and the cathode, and
a first organic layer disposed between the anode and the light-emitting layer, wherein the first organic layer includes a compound of Formula 1 and a compound of Formula 2;

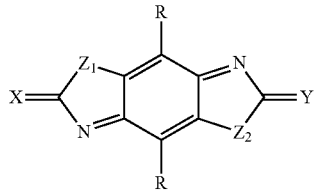

Formula 1 wherein, in Formula 1,
X and Y are, at each occurrence identically or differently, selected from NR', CR"R''', O, S or Se;
$Z_1$ and $Z_2$ are, at each occurrence identically or differently, selected from O, S or Se;
R, R', R" and R''' are, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;
each R can be identical or different, and at least one of R, R', R" and R''' is a group having at least one electron-withdrawing group;
in Formula 1, adjacent substituents are optionally joined to form a ring;

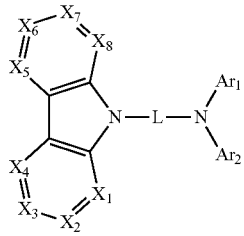

Formula 2 wherein, in Formula 2,
$X_1$ to $X_8$ are, at each occurrence identically or differently, selected from $CR_1$ or N;
L is, at each occurrence identically or differently, selected from a substituted or unsubstituted arylene group having 6 to 30 carbon atoms, a substituted or unsubstituted heteroarylene group having 3 to 30 carbon atoms, or combinations thereof;

$Ar_1$ and $Ar_2$ are, at each occurrence identically or differently, selected from a substituted or unsubstituted aryl group having 6 to 30 carbon atoms or a substituted or unsubstituted heteroaryl group having 3 to 30 carbon atoms;

$R_1$ is, at each occurrence identically or differently, selected from a group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and in Formula 2, adjacent substituents are optionally joined to form a ring.

In this embodiment, the expression that in Formula 1, adjacent substituents are optionally joined to form a ring refers to that adjacent substituents R" and R'" in Formula 1 may be joined to form a ring. It is apparent for those skilled in the art to determine that adjacent substituents R" and R'" in Formula 1 may not be joined to form a ring.

In this embodiment, the expression that in Formula 2, adjacent substituents are optionally joined to form a ring refers to that adjacent substituents $R_1$ in Formula 2 may be joined to form a ring. It is apparent for those skilled in the art to determine that adjacent substituents $R_1$ in Formula 2 may not be joined to form a ring.

According to an embodiment of the present disclosure, X and Y are, at each occurrence identically or differently, selected from NR' or CR"R'", and R', R" and R'" are a group having at least one electron-withdrawing group; preferably, R, R', R" and R'" are a group having at least one electron-withdrawing group.

According to an embodiment of the present disclosure, X and Y are, at each occurrence identically or differently, selected from O, S or Se, and at least one of R is a group having at least one electron-withdrawing group; preferably, all of R are groups having at least one electron-withdrawing group.

According to an embodiment of the present disclosure, the Hammett constant of the electron-withdrawing group is greater than or equal to 0.05, preferably greater than or equal to 0.3, more preferably greater than or equal to 0.5. In the present disclosure, the Hammett substituent constant value of the electron-withdrawing group is greater than or equal to 0.05, preferably greater than or equal to 0.3, more preferably greater than or equal to 0.5. The electron withdrawing ability is relatively strong, which can significantly reduce the LUMO energy level of the compound and achieve the improvement of the charge mobility effect. It should be noted that the Hammett substituent constant value includes a para constant and/or meta constant of the Hammett substituent. As long as one of the para constant and meta constant is greater than or equal to 0.05, the electron-withdrawing group can be used as the group selected in the present disclosure.

According to an embodiment of the present disclosure, the electron-withdrawing group is selected from a group consisting of: halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, an aza-aromatic ring group, and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, and an aza-aromatic ring group: an alkyl group having 1 to 20 carbon atoms, a cycloalkyl group having 3 to 20 ring carbon atoms, a heteroalkyl group having 1 to 20 carbon atoms, an arylalkyl group having 7 to 30 carbon atoms, an alkoxy group having 1 to 20 carbon atoms, an aryloxy group having 6 to 30 carbon atoms, an alkenyl group having 2 to 20 carbon atoms, an alkynyl group having 2 to 20 carbon atoms, an aryl group having 6 to 30 carbon atoms, a heteroaryl group having 3 to 30 carbon atoms, an alkylsilyl group having 3 to 20 carbon atoms, an arylsilyl group having 6 to 20 carbon atoms, and combinations thereof;

preferably, the electron-withdrawing group is selected from a group consisting of: F, $CF_3$, $OCF_3$, $SF_5$, $SO_2CF_3$, a cyano group, an isocyano group, SCN, OCN, a pyrimidinyl group, a triazinyl group, and combinations thereof.

According to an embodiment of the present disclosure, X and Y are, at each occurrence identically or differently, selected from a group consisting of the following structures:

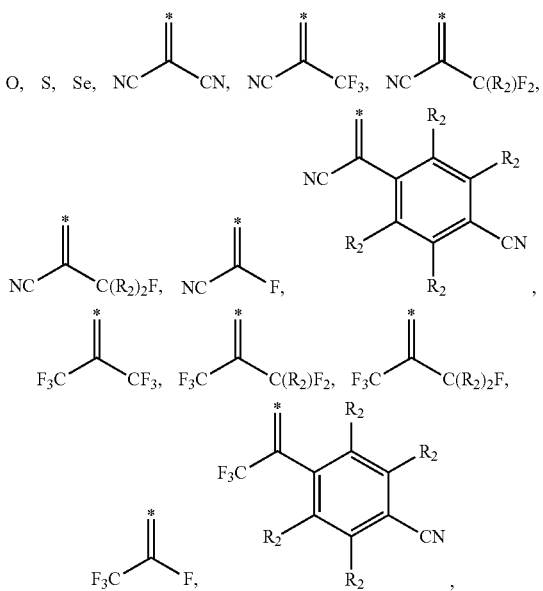

-continued

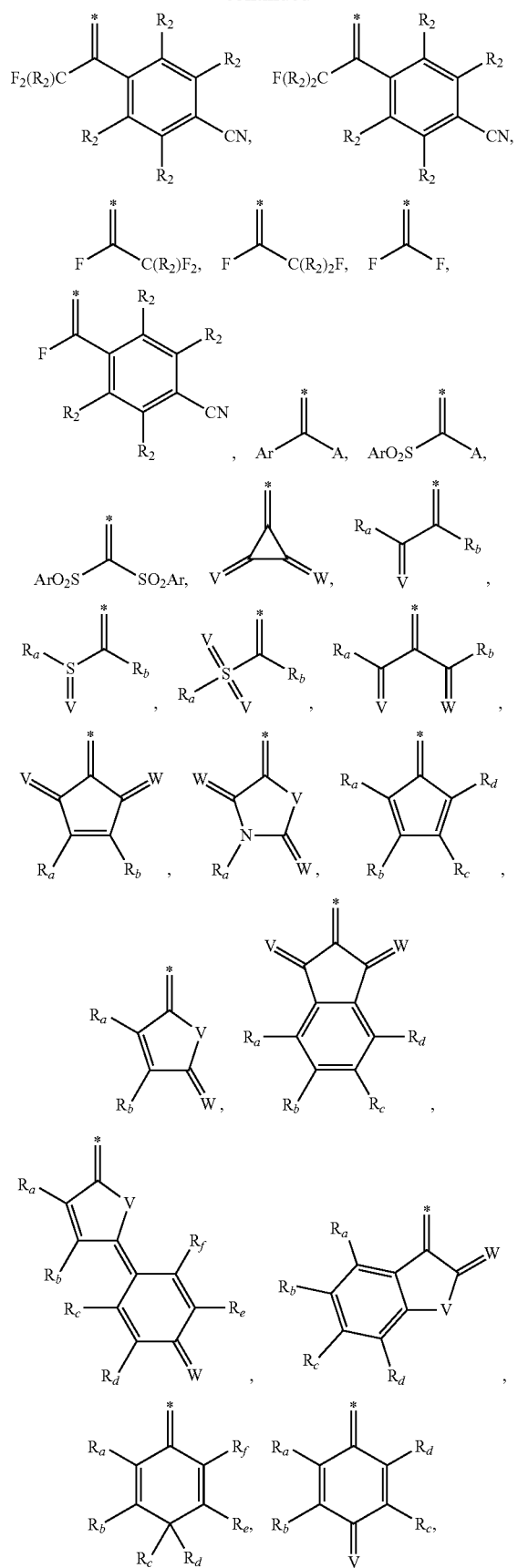

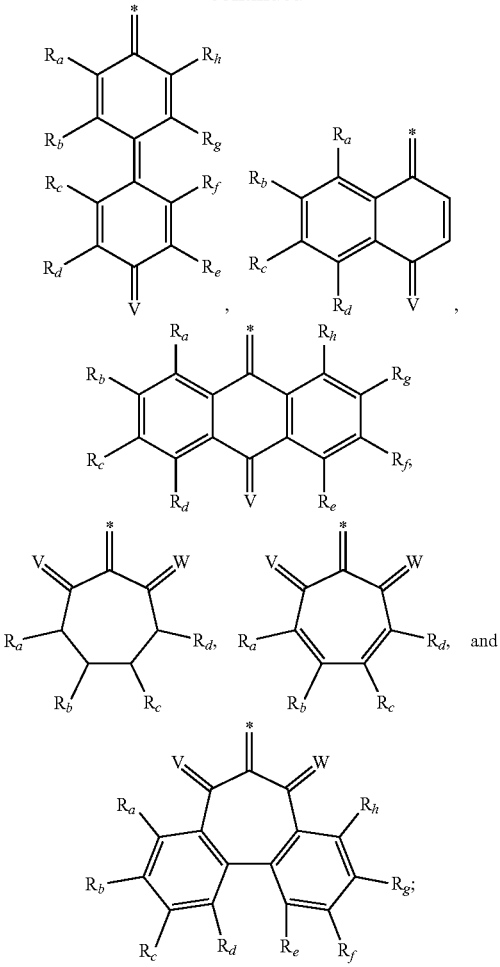

wherein R$_2$ is, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, SF$_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;

preferably, R$_2$ is, at each occurrence identically or differently, selected from a group consisting of: F, CF$_3$, OCF$_3$, SF$_5$, SO$_2$CF$_3$, a cyano group, an isocyano group, SCN, OCN, a pentafluorophenyl group, a 4-cyanotetrafluorophenyl group, a tetrafluoropyridyl group, a pyrimidyl group, a triazinyl group, and combinations thereof;

wherein V and W are, at each occurrence identically or differently, selected from $CR_vR_w$, $NR_v$, O, S or Se;

wherein Ar is, at each occurrence identically or differently, selected from a substituted or unsubstituted aryl group having 6 to 30 carbon atoms, or a substituted or unsubstituted heteroaryl group having 3 to 30 carbon atoms;

wherein A, $R_a$, $R_b$, $R_c$, $R_d$, $R_e$, $R_f$, $R_g$, $R_h$, $R_v$ and $R_w$ are, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;

wherein A is a group having at least one electron-withdrawing group, and for any of the structures, when one or more of $R_a$, $R_b$, $R_c$, $R_d$, $R_e$, $R_f$, $R_g$, $R_h$, $R_v$ and $R_w$ occur, at least one of $R_a$, $R_b$, $R_c$, $R_d$, $R_e$, $R_f$, $R_g$, $R_h$, $R_v$ and $R_w$ is a group having at least one electron-withdrawing group; preferably, the group having at least one electron-withdrawing group is selected from a group consisting of: F, $CF_3$, $OCF_3$, $SF_5$, $SO_2CF_3$, a cyano group, an isocyano group, SCN, OCN, a pentafluorophenyl group, a 4-cyanotetrafluorophenyl group, a tetrafluoropyridyl group, a pyrimidyl group, a triazinyl group, and combinations thereof.

In this embodiment, "*" represents a position where the X and Y groups are joined to a dehydrobenzodioxazole ring, a dehydrobenzodithiazole ring, or a dehydrobenzodiselenazole in Formula 1.

According to an embodiment of the present disclosure, X and Y are, at each occurrence identically or differently, selected from a group consisting of the following structures:

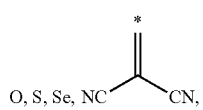
A1

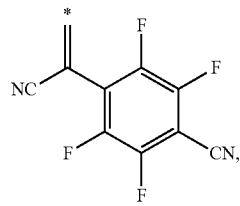
A2

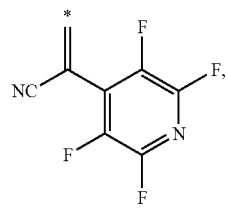
A3

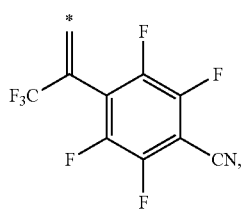
A4

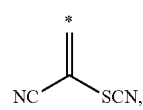
A5

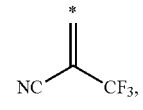
A6

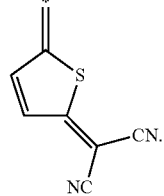
A7

In this embodiment, "*" represents a position where the X and Y groups are joined to a dehydrobenzodioxazole ring, a dehydrobenzodithiazole ring, or a dehydrobenzodiselenazole in Formula 1.

According to an embodiment of the present disclosure, R is, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, an unsubstituted alkyl group having 1 to 20 carbon atoms, an unsubstituted cycloalkyl group having 3 to 20 ring carbon atoms, an unsubstituted alkoxy group having 1 to 20 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, and any one of following groups substituted by one or more of halogen, a nitroso group, a nitro group, an acyl group, a carbonyl group, a carboxylic acid group, an ester group, a cyano group, an isocyano group, SCN, OCN, SF$_5$, a boryl group, a sulfinyl group, a sulfonyl group, and a phosphoroso group: an alkyl group having 1 to 20 carbon atoms, a cycloalkyl group having 3 to 20 ring carbon atoms, an alkoxy group having 1 to 20 carbon atoms, an alkenyl group having 2 to 20 carbon atoms, an aryl group having 6 to 30 carbon atoms, a heteroaryl group having 3 to 30 carbon atoms, and combinations thereof;

preferably, R is, at each occurrence identically or differently, selected from a group consisting of: hydrogen, deuterium, a methyl group, an isopropyl group, NO$_2$, SO$_2$CH$_3$, SCF$_3$, C$_2$F$_5$, OC$_2$F$_5$, OCH$_3$, a diphenylmethylsilyl group, a phenyl group, a methoxyphenyl group, a p-methylphenyl group, a 2,6-diisopropylphenyl group, a biphenylyl group, a polyfluorophenyl group, a difluopyridyl group, a nitrophenyl group, a dimethylthiazolyl group, a vinyl group substituted by one or more of CN or CF$_3$, an acetenyl group substituted by one of CN or CF$_3$, a dimethylphosphoroso group, a diphenylphosphoroso group, F, CF$_3$, OCF$_3$, SF$_5$, SO$_2$CF$_3$, a cyano group, an isocyano group, SCN, OCN, a trifluoromethylphenyl group, a trifluoromethoxyphenyl group, a bis(trifluoromethyl)phenyl group, a bis(trifluoromethoxy)phenyl group, a 4-cyanotetrafluorophenyl group, a phenyl or biphenylyl group substituted by one or more of F, CN or CF$_3$, a tetrafluoropyridyl group, a pyrimidinyl group, a triazinyl group, a diphenylboryl group, an oxaboraanthryl group, and combinations thereof.

According to an embodiment of the present disclosure, X and Y are

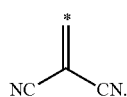

According to an embodiment of the present disclosure, R is, at each occurrence identically or differently, selected from a group consisting of the following structures:

B1

B2

B3

B4

B5

B6

B7

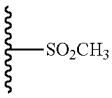

B8

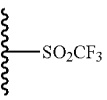

B9

B10

B11

B12

B13

B14

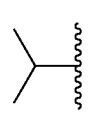

B15

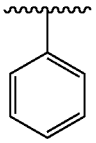

B16

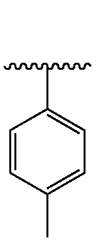

B17

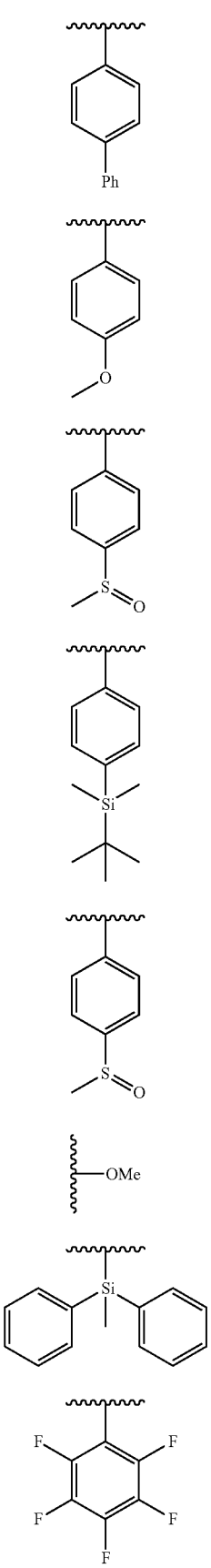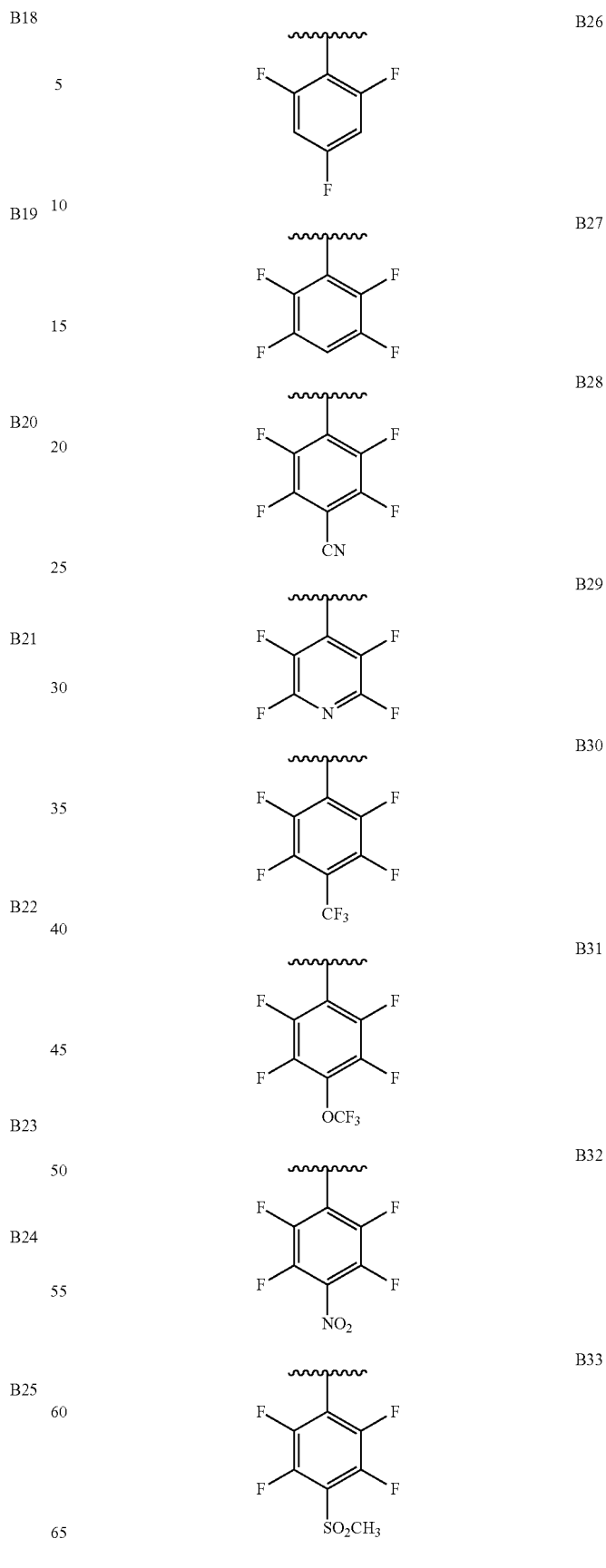

-continued
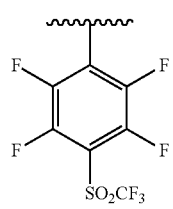 B34
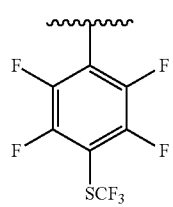 B35
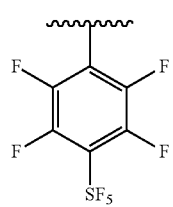 B36
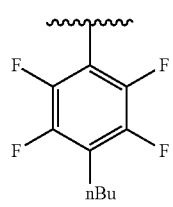 B37
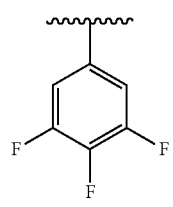 B38
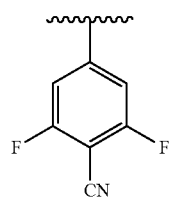 B39
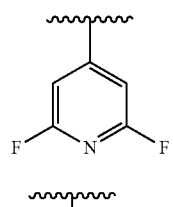 B40
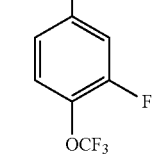 B41
-continued
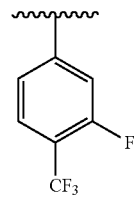 B42
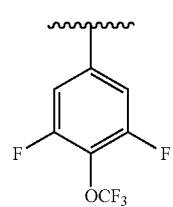 B43
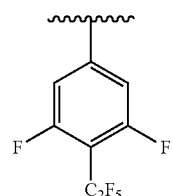 B44
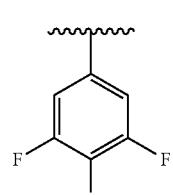 B45
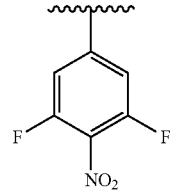 B46
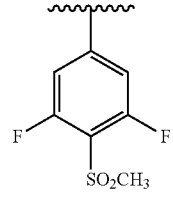 B47
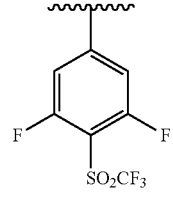 B48
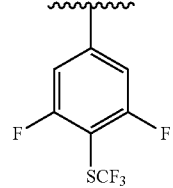 B49

| | |
|---|---|
| 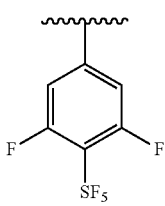 B50 | 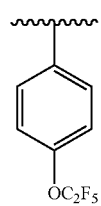 B58 |
| 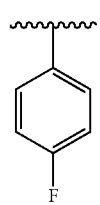 B51 | 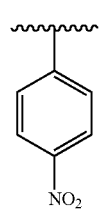 B59 |
| 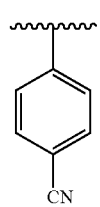 B52 | 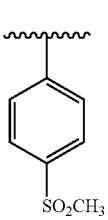 B60 |
| 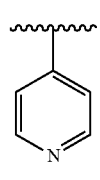 B53 | 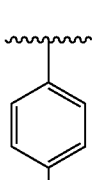 B61 |
| 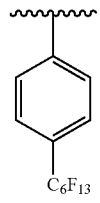 B54 | 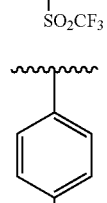 B62 |
| 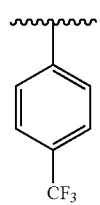 B55 | 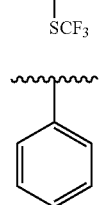 B63 |
| 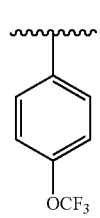 B56 | 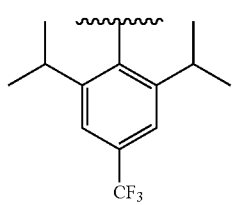 B64 |
| 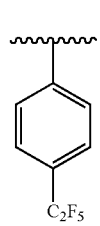 B57 | 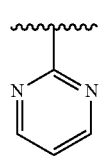 B65 |

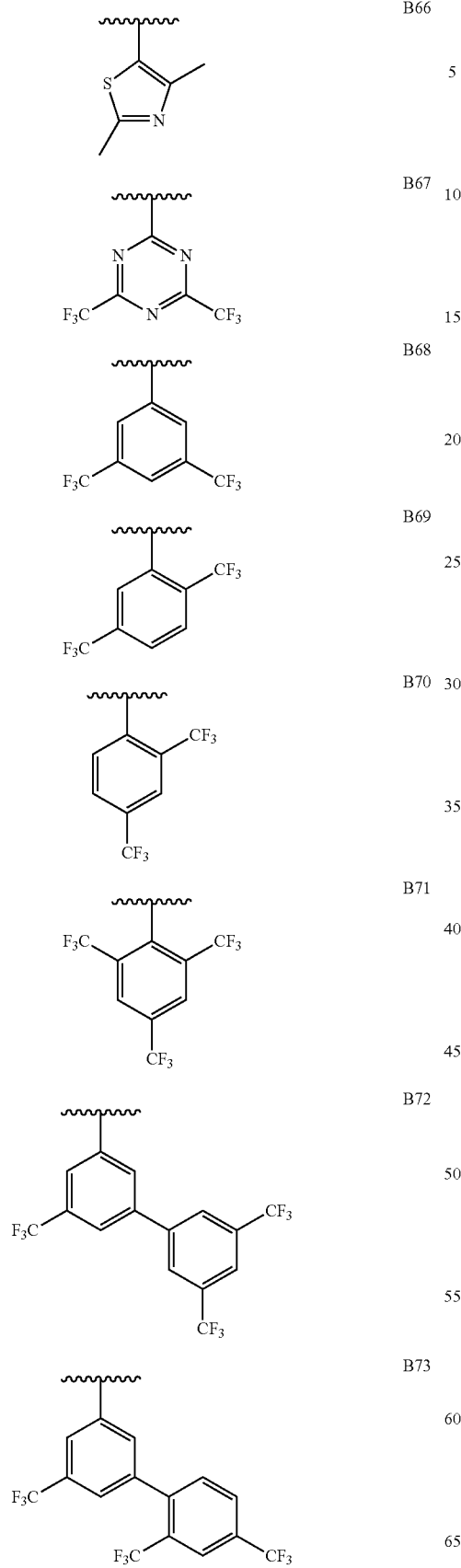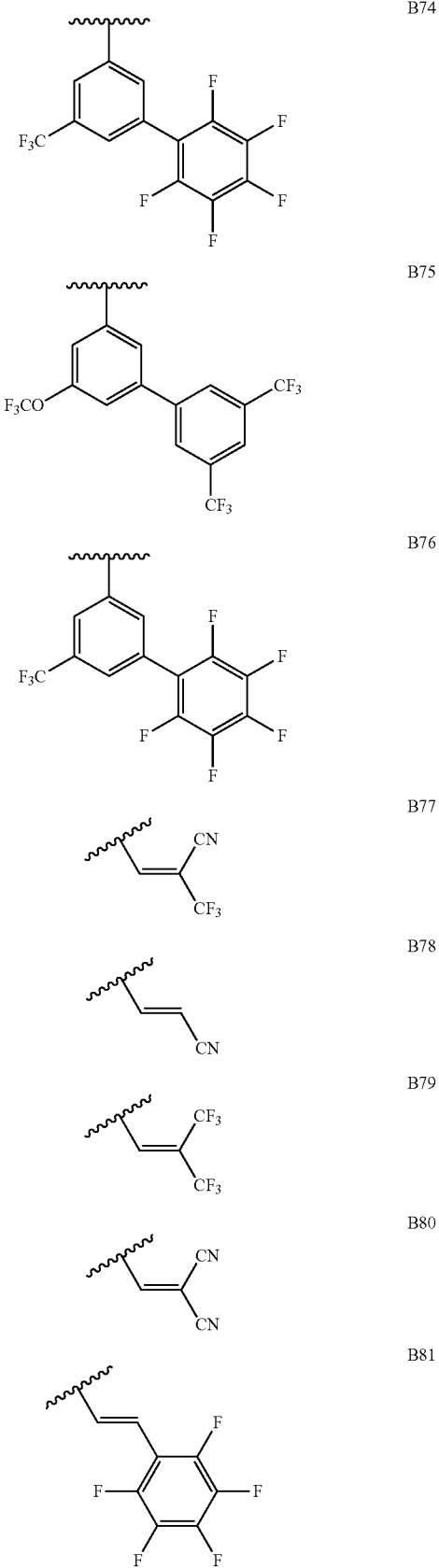

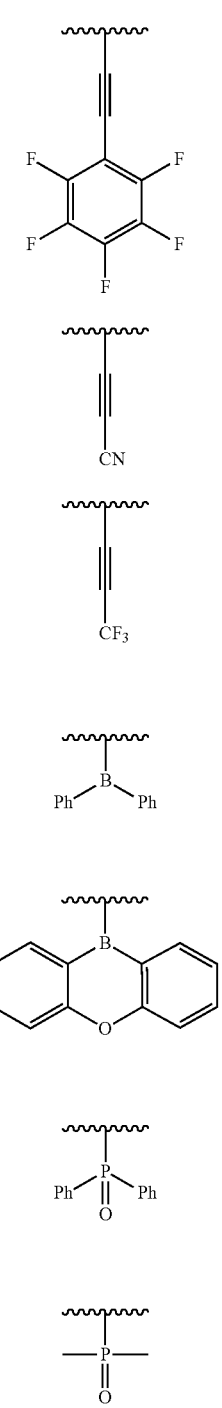

In this embodiment, " ～～ " represents a position where the R group is joined to a dehydrobenzodioxazole ring, a dehydrobenzodithiazole ring, or a dehydrobenzodiselenazole in Formula 1.

According to an embodiment of the present disclosure, both of R in a compound represented by Formula 1 are identical.

According to an embodiment of the present disclosure, the compound of Formula 1 has a structure represented by Formula 3:

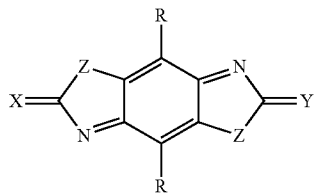

wherein, in Formula 3, structures of both Z are identical, structures of both R are identical or different, and the Z, X, Y and R are respectively and correspondingly selected from atoms or groups shown in the table in claim 11;

wherein, the compound having the structure of Formula 3 is selected from Compound 1 to Compound 1356, wherein specific structures of Compound 1 to Compound 1356 are shown in claim 11.

According to an embodiment of the present disclosure, L is a substituted or unsubstituted phenylene group, a substituted or unsubstituted biphenylene group, a substituted or unsubstituted terphenylene group, a substituted or unsubstituted naphthylene group, a substituted or unsubstituted fluorenylidene group, a substituted or unsubstituted silafluorenylidene group, a substituted or unsubstituted carbazolylene group, a substituted or unsubstituted dibenzofurylidene group, a substituted or unsubstituted dibenzothienylene group, a substituted or unsubstituted dibenzoselenophenylene group, a substituted or unsubstituted phenanthrylene group, a substituted or unsubstituted triphenylenylene group, a substituted or unsubstituted pyridylene group, a substituted or unsubstituted spirobifluorenylidene group, a substituted or unsubstituted anthrylene group, a substituted or unsubstituted pyrenylene group, or combinations thereof; preferably, L is a substituted or unsubstituted phenylene group or a substituted or unsubstituted biphenylene group; more preferably, L is a phenylene group or a biphenylene group.

According to an embodiment of the present disclosure, $R_1$ is hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted aryl group having 6 to 30 carbon atoms, or a substituted or unsubstituted heteroaryl group having 3 to 30 carbon atoms; preferably, $R_1$ is hydrogen, deuterium, a substituted or unsubstituted aryl group having 6 to 30 carbon atoms, or a substituted or unsubstituted heteroaryl group having 3 to 30 carbon atoms.

According to an embodiment of the present disclosure, $Ar_1$ and $Ar_2$ are a substituted or unsubstituted aryl group having 6 to 20 carbon atoms or a substituted or unsubstituted heteroaryl group having 3 to 20 carbon atoms; preferably, $Ar_1$ and $Ar_2$ are a phenyl group, a biphenylyl group, a terphenyl group, a naphthyl group, a fluorenyl group, a dibenzothienyl group, a spirobifluorenyl group, a pyridyl group, or a pyrimidinyl group.

According to an embodiment of the present disclosure, the compound having the structure of Formula 2 is selected from a group consisting of Compound H-1 to Compound H-176, wherein specific structures of Compound H-1 to Compound H-176 are shown in claim 15.

According to an embodiment of the present disclosure, the organic electroluminescence device further comprises a second organic layer disposed between the anode and the light-emitting layer, and the second organic layer includes the compound of Formula 2.

According to an embodiment of the present disclosure, the first organic layer is in contact with the anode.

According to an embodiment of the present disclosure, the compound of Formula 1 included in the first organic layer accounts for not higher than 5% or not higher than 3%, preferably not higher than 2% or not higher than 1% by weight of the entire first organic layer.

According to an embodiment of the present disclosure, the second organic layer is in contact with the light-emitting layer.

According to an embodiment of the present disclosure, the organic electroluminescence device further comprises a third organic layer disposed between the anode and the light-emitting layer, and the third organic layer comprises a compound different from the compound included in the second organic layer.

According to another embodiment of the present disclosure, a display assembly is further disclosed. The display assembly comprises the organic electroluminescence device described in any one of the embodiments described above.

A typical OLED device structure diagram is shown in FIG. 1. The OLED device 100 includes an anode layer 101, a hole injection layer (HIL) 102, a hole transporting layer (HTL) 103, an electron blocking layer (also called a second hole transporting layer) (EBL) 104, a light-emitting layer (EML) 105, a hole blocking layer (HBL) 106, an electron transporting layer (ETL) 107, an electron injection layer (EIL) 108, and a cathode layer 109. The light-emitting layer 105 generally further comprises at least one host material and at least one light-emitting material, and the electron blocking layer 104 and the hole blocking layer 106 are optional layers. The hole injection layer 102 can be a single-material layer such as the commonly used HATCN. The hole injection layer 102 can also be a hole transporting layer material doped with a certain proportion of p-type conductive doped material. The doping proportion is generally lower than 5%, and the most commonly used doping proportion is between 1% and 3%. Such a hole injection layer doped with the p-type conductive material generally has a lower voltage than the single layer material, and thus is widely applied. The HOMO energy level of commonly used hole transporting layer materials, such as compound HT materials, is generally around −5.1 eV, which is close to the work function of commonly used anode layer ITO, −4.8 eV, ensuring effective injection of holes from the anode layer. However, the HOMO energy level of most host materials of light-emitting layers is around −5.4 eV to −5.6 eV, much deeper than that of the hole transporting layer material, causing holes to encounter a high barrier when they enter the light-emitting layer from the transporting layer. In order to solve this problem, a second hole transporting layer whose HOMO energy level is between the HOMO energy level of the hole transporting layer and the HOMO energy level of the light-emitting layer is usually inserted between the hole transporting layer and the light-emitting layer, forming a structure in which potential energy shows a progressive change. However, the holes in such structure still face a large total barrier height, and the addition of an extra material also brings more interface defects, thereby affecting the lifetime and increasing the complexity of the process. If the HOMO energy level of the hole injection layer can also be close to a host energy level, the barrier before the holes are transported into the light-emitting layer will be reduced or even disappear. However, a too deep HOMO energy level will make it difficult to inject holes from the anode layer, and the ohmic contact will become poor, resulting in an increase in voltage. Injecting p-type conductive doped material into deep-energy level hole injection materials can alleviate this phenomenon [Lussem et al. PSS A 210, No. 1, 9-43 (2013)]. However, the LUMO energy level of commonly used p-type conductive doped materials such as Compound PD, is just −5.06 eV, and thus the combination of such doped materials and deep-energy level hole transporting materials cannot form a good doping effect. For better matching, the LUMO energy level of the p-type conductive doped materials also needs to be deeper.

In the present disclosure, a p-type conductive doped material having a deep LUMO energy level (such as the compound shown in Formula 1, whose LUMO energy level is around −5.2 eV) and a hole transporting material having a deep HOMO energy level (such as the compound shown in Formula 2, whose HOMO energy level is around −5.2 eV) are co-evaporated to form a hole injection layer, then this hole transporting material is used as a hole transporting layer, and a light emitting layer is directly evaporated on the hole transporting layer. Since the energy levels are more matched, film layers and materials are reduced, so that the voltage of the device is reduced, the lifetime is improved, and the process is simplified.

EXAMPLES

Hereinafter, the present disclosure will be described in more detail with reference to the following examples. The compounds used in the following examples can be easily obtained by those skilled in the art, so synthesis methods of these compounds will not be repeated herein. For example, these compounds can be found in the Chinese patent CN201911046002.3 which is incorporated by reference in its entirety. Apparently, the following examples are only for illustrative purposes and are not intended to limit the scope of the present disclosure. Based on the following examples, those skilled in the art can obtain other examples of the present disclosure by conducting improvements on these examples.

Example 1-1: First, a glass substrate having a thickness of 0.7 mm, on which an Indium Tin Oxide (ITO) anode with a thickness of 80 mm had been patterned, was washed with deionized water and detergent, and then the ITO surface was treated with oxygen plasma and UV ozone. Then, the substrate was dried in a glove box to remove moisture, and loaded on a support and transferred into a vacuum chamber. The organic layers specified below were sequentially deposited on the ITO anode layer by vacuum thermal evaporation at a rate of 0.1 to 5 angstroms/sec under the condition of a vacuum of about $10^{-8}$ Torr: Compound H-26 and Compound 70 were deposited simultaneously to form the hole injection layer (HIL, 97:3, 100 Å), Compound H-26 was deposited to form the hole transporting layer (HTL, 1250 Å), Compound BH and Compound BD were deposited simultaneously to form the light-emitting layer (EML, 96:4, 250 Å), Compound HB was deposited to form the hole blocking layer (HBL, 50 Å), Compound ET and Liq were co-deposited to form the electron transporting layer (ETL, 40:60, 300 Å), and finally, Liq with a thickness of 10 Å was deposited to form the electron injection layer (EIL), and aluminum with a thickness of 120 nm was deposited to form the cathode. The device was transferred back to the glove box and encapsulated with a glass lid to complete the fabrication of the device.

Comparative Example 1-1: The preparation method was the same as that in Example 1-1, except that Compound PD and Compound H-26 were deposited simultaneously to form the hole injection layer (HIL, 3:97, 100 Å).

Comparative Example 1-2: The preparation method was the same as that in Example 1-1, except that Compound PD and Compound HT were deposited simultaneously to form the hole injection layer (HIL, 3:97, 100 Å), Compound HT was deposited to form the hole transporting layer (HTL, 1200 Å), and Compound H-26 was deposited on the HTL to form the second hole transporting layer (HTL2, 50 Å).

Structures and thicknesses of part of layers of the device are shown in the following table in detail. The layers using more than one material were obtained by doping different compounds at weight proportions as recorded.

TABLE 1

Structures of devices in Example 1-1, Comparative Example 1-1 and Comparative Example 1-2

| Device ID | HIL | HTL | HTL2 | EML | HBL | ETL |
|---|---|---|---|---|---|---|
| Example 1-1 | H-26:70 (97:3) (100 Å) | H-26 (1250Å) | | BH:BD (96:4) (250 Å) | HB (50 Å) | ET:Liq (40:60) (300Å) |
| Comparative Example 1-1 | H-26:PD (97:3) (100 Å) | H-26 (1250Å) | | BH:BD (96:4) (250 Å) | HB (50 Å) | ET:Liq (40:60) (300 Å) |
| Comparative Example 1-2 | HT:PD (97:3) (100 Å) | HT (1200 Å) | H-26 (50 Å) | BH:BD (96:4) (250 Å) | HB (50 Å) | ET:Liq (40:60) (300 Å) |

The structure formulas of Compounds 70, H-26, HT, PD, BH, BD, HB, ET and Liq are as follows:

Compound 70

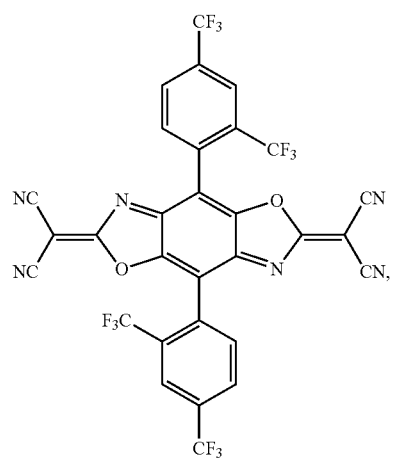

Compound H-26

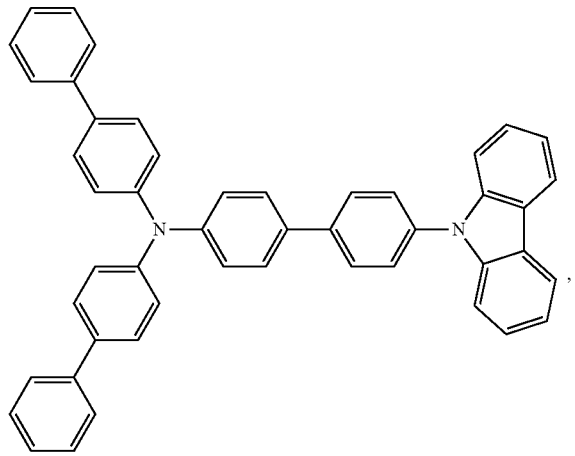 [SMILES: c1ccc(-c2ccc(N(c3ccc(-c4ccccc4)cc3)c3ccc(-c4ccc(-n5c6ccccc6c6ccccc65)cc4)cc3)cc2)cc1]

Compound BH

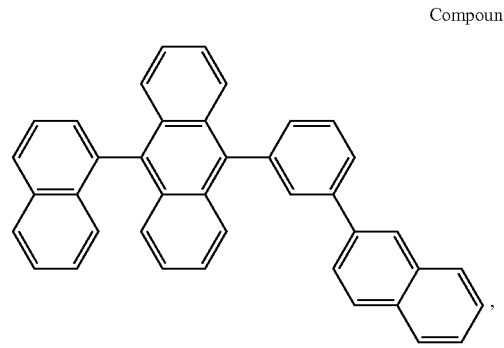

-continued

Compound BD

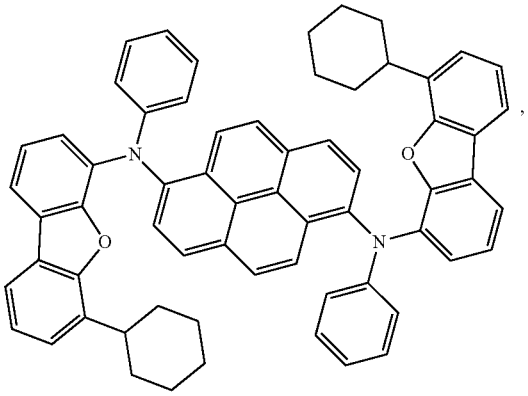

Compound HB

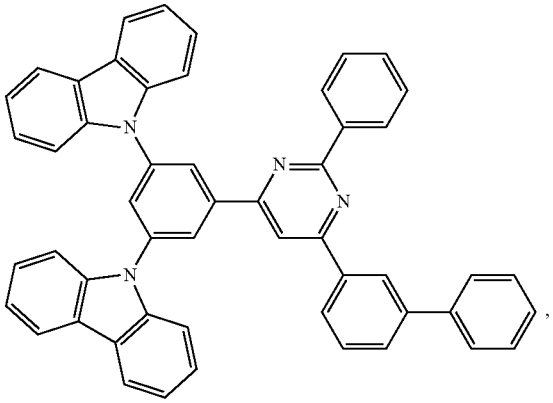

Compound ET

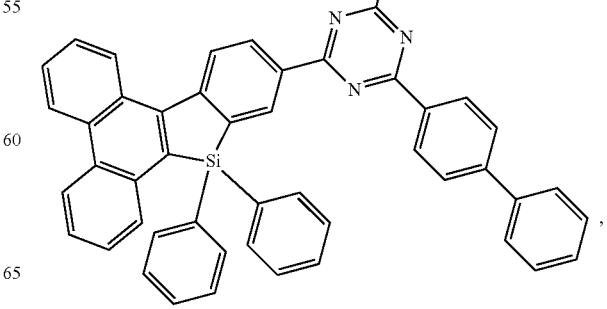

-continued

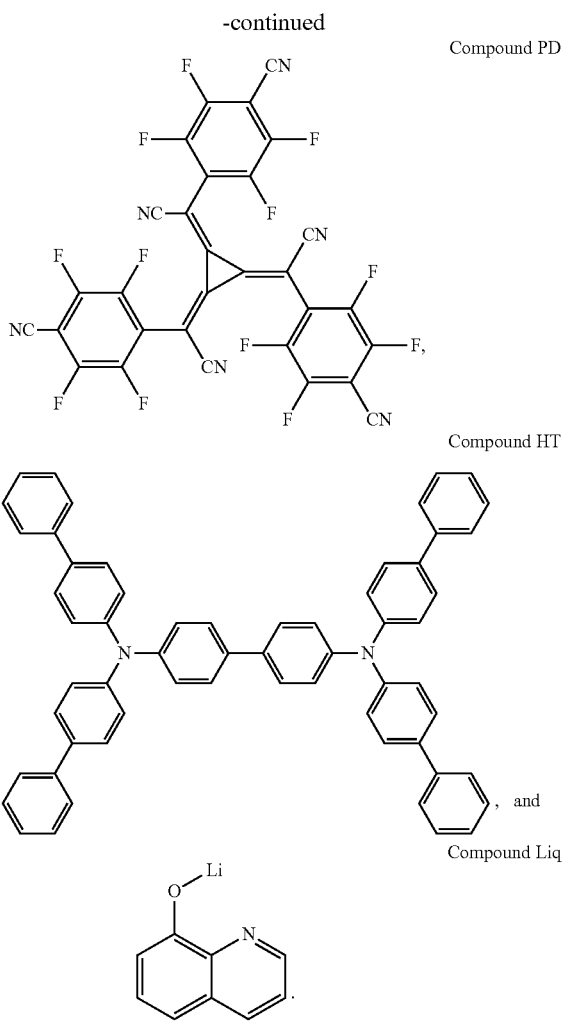

Compound PD

Compound HT

, and

Compound Liq

The performance of devices in Example 1-1, Comparative Example 1-1 and Comparative Example 1-2 is summarized in Table 2. The chromaticity coordinates and voltage were measured at the current density of 15 mA/cm$^2$, and the lifetime of the device (LT95) was the measured time for the device to decay to 95% of initial brightness at 80 mA/cm$^2$.

TABLE 2

Performance data of devices in Example 1-1, Comparative Example 1-1 and Comparative Example 1-2

| | At 15 mA/cm$^2$ | | | At 80 mA/cm$^2$ |
|---|---|---|---|---|
| | CIEx | CIEy | Voltage [V] | LT95 [h] |
| Example 1-1 | 0.138 | 0.094 | 4.2 | 14.7 |
| Comparative Example 1-1 | 0.138 | 0.093 | 4.5 | 6.8 |
| Comparative Example 1-2 | 0.139 | 0.094 | 4.3 | 7.2 |

In Example 1-1, Compound 70 with a LUMO energy level of −5.20 eV was used as a p-type conductive doped material, and was doped in Compound H-26, a hole transporting material with a HOMO energy level of −5.28 eV. In Comparative Example 1-1, Compound PD with a LUMO energy level of −5.06 eV was used as a p-type conductive doped material, and was doped in Compound H-26, a hole transporting material with a HOMO energy level of −5.28 eV. Although the color of the two devices were similar, the voltage of the device in Example 1-1 was 0.3 V lower than that in Comparative Example 1-1, and the lifetime was more than doubled. It is indicated that by combining a hole transporting material having a deep HOMO energy level and a p-type conductive doped material having a deep LUMO energy level, the injection and transporting of holes are facilitated, and the device performance of such device is better than that of the device formed by the combination of a p-type conductive doped material having a shallow LUMO energy level and a hole transporting material having a deep HOMO energy level.

Since the p-type conductive doped material having a shallow LUMO energy level and the hole transporting material having a shallow HOMO energy level constitute a relatively better combination in the prior art, the example of the present disclosure is compared with such a combination. In Comparative Example 1-2, Compound PD with a LUMO energy level of −5.06 eV was used as a p-type conductive doped material and was doped to Compound HT, a hole transporting material with a HOMO energy level of −5.14 eV to form the hole injection layer, and Compound HT was used to form the hole transporting layer. However, a large barrier is presented between the HOMO energy level of Compound HT and the HOMO energy level of the light-emitting layer BH (−5.66 eV). Compound H-26 was thus added as the second hole transporting layer, thereby forming a potential energy progression to facilitate the injection of holes to the light-emitting layer. Such a device structure is also a method commonly used in the industry. Results showed that the voltage of the device in Example 1-1 was 0.1 V lower than that in Comparative Example 1-2, and the lifetime was more than doubled. It is indicated that although the method commonly used in industry uses the combination of a p-type conductive doped material having a shallow LUMO energy level and a hole transporting material having a shallow HOMO energy level and adds a second hole transporting layer to form potential energy progression, the method commonly used in the industry is still inferior to the method in the examples of the present disclosure, especially in terms of lifetime. The advantages of the present disclosure are obvious.

Example 2-1: The preparation method was the same as that in Example 1-1, except that all Compounds H-26 were replaced by Compound H-124.

Comparative Example 2-1: The preparation method was the same as that in Example 2-1, except that Compound PD and Compound H-124 were used to form the hole injection layer (HIL, 3:97, 100 Å).

Comparative Example 2-2: The preparation method was the same as that in Example 2-1, except that Compound PD and Compound HT were used to form the hole injection layer (HIL, 3:97, 100 Å), Compound HT was used to form the hole transporting layer (HTL, 1200 Å), and Compound H-124 was deposited on the HTL to form the second hole transporting layer (HTL2, 50 Å).

Structures and thicknesses of part of layers of the device are shown in the following table in detail. The layers using more than one material were obtained by doping different compounds at weight proportions as recorded.

TABLE 3

Structures of devices in Example 2-1, Comparative Example 2-1 and Comparative Example 2-2

| Device ID | HIL | HTL | HTL2 | EML | HBL | ETL |
|---|---|---|---|---|---|---|
| Example 2-1 | H-124:70 (97:3) (100 Å) | H-124 (1250Å) | | BH:BD (96:4) (250 Å) | HB (50 Å) | ET:Liq (40:60) (300 Å) |
| Comparative Example 2-1 | H-124:PD (97:3) (100 Å) | H-124 (1250Å) | | BH:BD (96:4) (250 Å) | HB (50 Å) | ET:Liq (40:60) (300 Å) |
| Comparative Example 2-2 | HT:PD (97:3) (100 Å) | HT (1200 Å) | H-124 (50 Å) | BH:BD (96:4) (250 Å) | HB (50 Å) | ET:Liq (40:60) (300 Å) |

The example of Compound H-124 is as follows:

Compound H-124

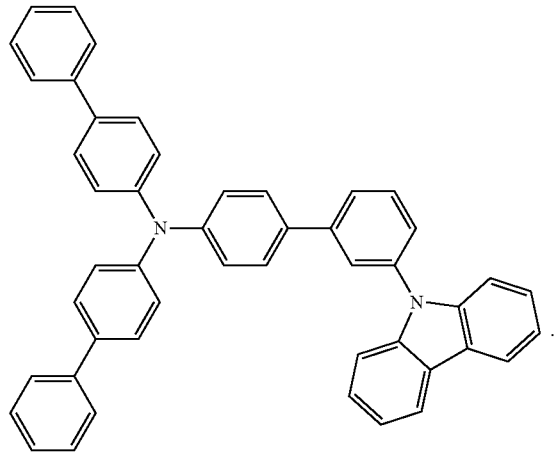

The performance of devices in Example 2-1, Comparative Example 2-1 and Comparative Example 2-2 is summarized in Table 4. The chromaticity coordinates and voltage were measured at the current density of 15 mA/cm², and the lifetime of the device (LT95) was the measured time for the device to decay to 95% of initial brightness at 80 mA/cm².

TABLE 4

Performance data of devices in Example 2-1, Comparative Example 2-1 and Comparative Example 2-2

| | At 15 mA/cm² | | | At 80 mA/cm² |
|---|---|---|---|---|
| | CIEx | CIEy | Voltage [V] | LT95 [h] |
| Example 2-1 | 0.140 | 0.098 | 4.4 | 128 |
| Comparative Example 2-1 | 0.140 | 0.100 | 6.1 | 107 |
| Comparative Example 2-2 | 0.138 | 0.094 | 4.3 | 18 |

In Example 2-1, Compound 70 with a LUMO energy level of −5.20 eV was used as a p-type conductive doped material and was doped to Compound H-124, a hole transporting material with a HOMO energy level of −5.29 eV. In Comparative Example 2-1, Compound PD with a LUMO energy level of −5.06 eV was used as a p-type conductive doped material and was doped to Compound H-124, a hole transporting material with a HOMO energy level of −5.29 eV. The color of the two devices were similar, and results showed that the voltage of the device in Example 2-1 was 1.7 V lower than that in Comparative Example 2-1, and the lifetime was increased by 20%. It is indicated that by combining a hole transporting material having a deep HOMO energy level and a p-type conductive doped material having a deep LUMO energy level, the injection and transporting of holes are facilitated, and the device performance of such device is better than that of the device formed by the combination of a p-type conductive doped material having a shallow LUMO energy level and a hole transporting material having a deep HOMO energy level.

Since the p-type conductive doped material having a shallow LUMO energy level and the hole transporting material having a shallow HOMO energy level constitute a relatively better combination in the prior art, the example of the present disclosure is compared with such a combination. In Comparative Example 2-2, Compound PD with a LUMO energy level of −5.06 eV was used as a p-type conductive doped material and was doped to Compound HT, a hole transporting material with a HOMO energy level of −5.14 eV to form the hole injection layer, and Compound HT was used to form the hole transporting layer. However, a large barrier is presented between the HOMO energy level of Compound HT and the HOMO energy level of the light-emitting layer BH (−5.66 eV). Compound H-124 was thus added as the second hole transporting layer, thereby forming a potential energy progression to facilitate the injection of holes to the light-emitting layer. Such a device structure is also a method commonly used in the industry. Although the voltage of the device in Example 2-1 was 0.1 V higher than that in Comparative Example 2-2, the lifetime was increased more than 6 times. It is indicated that although the method commonly used in industry uses the combination of a p-type conductive doped material having a shallow LUMO energy level and a hole transporting material having a shallow HOMO energy level and adds a second hole transporting layer to form potential energy progression, the method commonly used in the industry is still inferior to the method in the examples of the present disclosure, especially in terms of lifetime. The advantages of the present disclosure are highlighted again.

Example 3-1: The preparation method was the same as that in Example 1-1, except that all Compounds H-26 were replaced by Compound H-176.

Comparative Example 3-1: The preparation method was the same as that in Example 3-1, except that Compound PD and Compound H-176 were used to form the hole injection layer (HIL, 3:97, 100 Å).

Comparative Example 3-2: The preparation method was the same as that in Example 3-1, except that Compound PD and Compound HT were used to form the hole injection layer (HIL, 3:97, 100 Å), Compound HT was used to form the hole transporting layer (HTL, 1200 Å), and Compound H-176 was deposited on the HTL to form the second hole transporting layer (HTL2, 50 Å).

Structures and thicknesses of part of layers of the device are shown in the following table in detail. The layers using more than one material were obtained by doping different compounds at weight proportions as recorded.

TABLE 5

Structures of devices in Example 3-1, Comparative Example 3-1 and Comparative Example 3-2

| Device ID | HIL | HTL | HTL2 | EML | HBL | ETL |
|---|---|---|---|---|---|---|
| Example 3-1 | H-176:70 (97:3)(100 Å) | H-176 (1250 Å) | | BH:BD (96:4) (250 Å) | HB (50 Å) | ET:Liq (40:60) (300 Å) |
| Comparative Example 3-1 | H-176:PD (97:3) (100 Å) | H-176 (1250 Å) | | BH:BD (96:4) (250 Å) | HB (50 Å) | ET:Liq (40:60) (300 Å) |
| Comparative Example 3-2 | HT:PD (97:3) (100 Å) | HT (1200 Å) | H-176 (50 Å) | BH:BD (96:4) (250 Å) | HB (50 Å) | ET:Liq (40:60) (300 Å) |

The example of Compound H-176 is as follows:

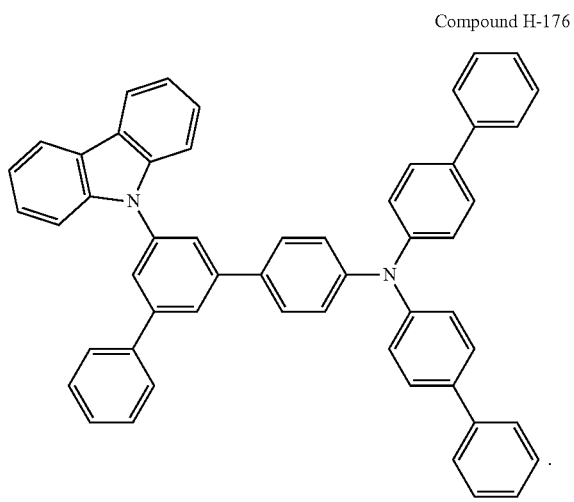 [SMILES: c1ccc(-c2ccc(N(c3ccc(-c4ccccc4)cc3)c3ccc(-c4cc(-c5ccccc5)cc(-n5c6ccccc6c6ccccc65)c4)cc3)cc2)cc1]

Compound H-176

The performance of devices in Example 3-1, Comparative Example 3-1 and Comparative Example 3-2 is summarized in Table 6. The chromaticity coordinates, external quantum efficiency and voltage were measured at the current density of 15 mA/cm$^2$, and the lifetime of the device (LT95) was the measured time for the device to decay to 95% of initial brightness at 80 mA/cm$^2$.

TABLE 6

Performance data of devices in Example 3-1, Comparative Example 3-1 and Comparative Example 3-2

| | At 15 mA/cm$^2$ | | | | At 80 mA/cm$^2$ |
|---|---|---|---|---|---|
| | CIEx | CIEy | Voltage [V] | EQE [%] | LT95 [h] |
| Example 3-1 | 0.137 | 0.093 | 4.7 | 9.4 | 40 |
| Comparative Example 3-1 | 0.140 | 0.097 | 6.1 | 8.7 | 1.3 |
| Comparative Example 3-2 | 0.139 | 0.089 | 4.3 | 9.1 | 20 |

In Example 3-1, Compound 70 with a LUMO energy level of −5.20 eV was used as a p-type conductive doped material and was doped to Compound H-176, a hole transporting material with a HOMO energy level of −5.29 eV. In Comparative Example 3-1, Compound PD with a LUMO energy level of −5.06 eV was used as a p-type conductive doped material and was doped to Compound H-176, a hole transporting material with a HOMO energy level of −5.29 eV. Although the color of the two devices were similar, the voltage of the device in Example 3-1 was 1.4 V lower than that in Comparative Example 3-1, and the lifetime was increased more than 30 times. It is indicated that by combining a hole transporting material having a deep HOMO energy level and a p-type conductive doped material having a deep LUMO energy level, the injection and transporting of holes are facilitated, and the device performance of such device is better than that of the device formed by the combination of a p-type conductive doped material having a shallow LUMO energy level and a hole transporting material having a deep HOMO energy level.

Since the p-type conductive doped material having a shallow LUMO energy level and the hole transporting material having a shallow HOMO energy level constitute a relatively better combination in the prior art, the example of the present disclosure is compared with such a combination. In Comparative Example 3-2, Compound PD with a LUMO energy level of −5.06 eV was used as a p-type conductive doped material and was doped to Compound HT hole transporting material with a HOMO energy level of −5.09 eV to form the hole injection layer, and Compound HT was used to form the hole transporting layer. However, a large barrier is presented between the HOMO energy level of Compound HT and the HOMO energy level of the light-emitting layer BH (−5.66 eV), Compound H-176 was added as the second hole transporting layer, thereby forming a potential energy progression to facilitate the injection of holes to the light-emitting layer. Such a device structure is also a method commonly used in the industry. Although the voltage of the device in Example 3-1 was 0.4 V higher than that in Comparative Example 3-2, the lifetime was doubled. It is indicated that although the method commonly used in industry uses the combination of a p-type conductive doped material having a shallow LUMO energy level and a hole transporting material having a shallow HOMO energy level and adds a second hole transporting layer to form potential energy progression, the method commonly used in the industry is still inferior to the method in the examples of the present disclosure, especially in terms of lifetime. The advantages of the present disclosure are highlighted again.

Example 4-1: First, a glass substrate having a thickness of 0.7 mm, on which an Indium Tin Oxide (ITO) anode with a thickness of 120 mm had been patterned, was washed with deionized water and detergent, and then the ITO surface was treated with oxygen plasma and UV ozone. Then, the substrate was dried in a glove box to remove moisture, and loaded on a support and transferred into a vacuum chamber. The organic layers specified below were sequentially deposited on the ITO anode layer by vacuum thermal evaporation at a rate of 0.1 to 5 angstroms/sec under the condition of a vacuum of about $10^{-8}$ Torr: Compound H-124 and Compound 70 were deposited simultaneously to form the hole injection layer (HIL, 97:3, 100 Å), Compound H-124 was deposited to form the hole transporting layer (HTL, 450 Å), Compound RH and Compound RD were deposited simultaneously to form the light-emitting layer (EML, 98:2, 400 Å), Compound GH2 was deposited to form the hole blocking layer (HBL, 50 Å), Compound ET2 and Liq were co-deposited to form the electron transporting layer (ETL, 40:60, 350 Å), and finally, Liq with a thickness of 10 Å was deposited to form the electron injection layer (EIL), and aluminum with a thickness of 120 nm was deposited to form the cathode. The device was transferred back to the glove box and encapsulated with a glass lid to complete the fabrication of the device.

Comparative Example 4-1: The preparation method was the same as that in Example 4-1, except that Compound HATCN was used to form the hole injection layer (HIL, 100 Å), Compound HT was used to form the hole transporting layer (HTL, 400 Å), and Compound H-124 was used to form the second hole transporting layer (HTL2, 50 Å).

TABLE 7

Structures of devices in Example 4-1 and Comparative Example 4-1

| Device ID | HIL | HTL | HTL2 | EML | HBL | ETL |
|---|---|---|---|---|---|---|
| Example 4-1 | H-124:70 (97:3)(100 Å) | H-124 (450 Å) | | RH:RD (98:2)(400 Å) | GH2 (50 Å) | ET2:Liq (40:60) (350 Å) |
| Comparative Example 4-1 | HATCN (100 Å) | HT (400 Å) | H-124 (50 Å) | RH:RD (98:2)(400 Å) | GH2 (50 Å) | ET2:Liq (40:60) (350 Å) |

Examples of Compounds HATCN, RH, RD, GH2 and ET2 are as follows:

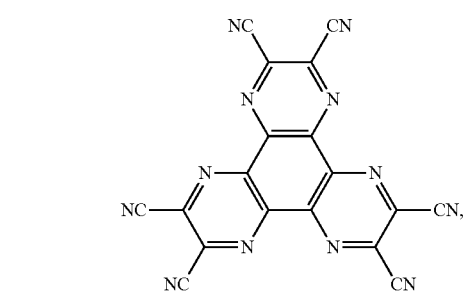

HATCN

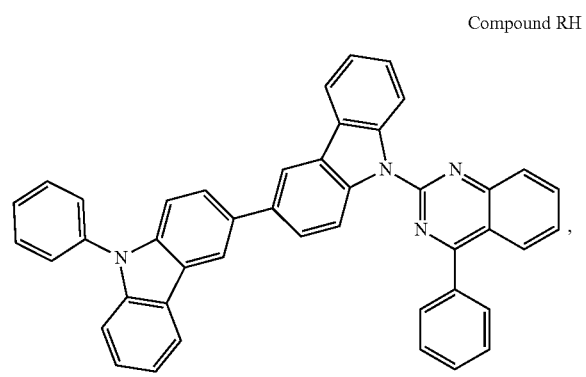

Compound RH

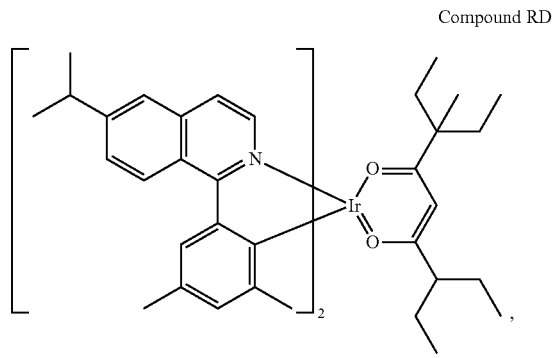

Compound RD

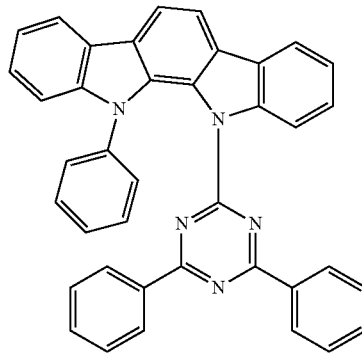

Compound GH2 and

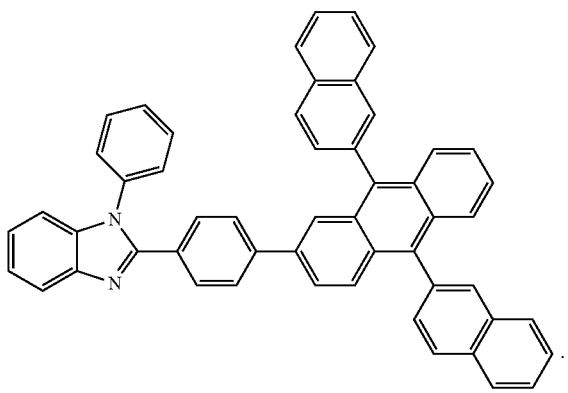

Compound ET2

The performance of devices in Example 4-1 and Comparative Example 4-1 is summarized in Table 8. The chromaticity coordinates, external quantum efficiency and voltage were measured at the current density of 15 mA/cm$^2$, and the lifetime of the device (LT95) was the measured time for the device to decay to 95% of initial brightness at 80 mA/cm$^2$.

TABLE 8

Performance data of devices in Example 4-1 and Comparative Example 4-1

| | At 15 mA/cm$^2$ | | | At 80 mA/cm$^2$ |
|---|---|---|---|---|
| | CIEx | CIEy | Voltage [V] | EQE [%] | LT95 [h] |
| Example 4-1 | 0.682 | 0.317 | 4.8 | 22.9 | 160 |
| Comparative Example 4-1 | 0.681 | 0.317 | 4.8 | 23.2 | 140 |

In Example 4-1, in the red light device, Compound 70 with a LUMO energy level of −5.20 eV was used as a p-type conductive doped material and was doped to Compound H-124, a hole transporting material with a HOMO energy level of −5.29 eV. Comparative Example 4-1 was a structure of a red light device commonly used in the industry, and it can be known from the device data that it had the high performance of a red light device in the industry. Compared with Comparative Example 4-1, under the premise of ensuring the color, the voltage and efficiency of the device in Example 4-1 were basically maintained, and the lifetime was increased by 14%. That is, the simple device structure that utilizes the combination of a hole transporting material having a deep HOMO energy level and a p-type conductive doped material also having a deep LUMO energy level can significantly improve the performance of a red light device, especially in terms of lifetime of the device.

Example 5-1: The preparation method was the same as that in Example 4-1, except that all Compounds H-124 were replaced by Compound H-176.

Comparative Example 5-1: The preparation method was the same as that in Example 5-1, except that Compound HATCN was used to form the hole injection layer (HIL, 100 Å), Compound HT was used to form the hole transporting layer (HTL, 400 Å), and Compound H-176 was used to form the second hole transporting layer (HTL2, 50 Å).

TABLE 9

Structures of devices in Example 5-1 and Comparative Example 5-1

| Device ID | HIL | HTL | HTL2 | EML | HBL | ETL |
|---|---|---|---|---|---|---|
| Example 5-1 | H-176:70 (97:3)(100 Å) | H-176 (450 Å) | | RH:RD (98:2)(400 Å) | GH2 (50 Å) | ET2:Liq (40:60) (350 Å) |
| Comparative Example 5-1 | HATCN (100 Å) | HT (400 Å) | H-176 (50 Å) | RH:RD (98:2)(400 Å) | GH2 (50 Å) | ET2:Liq (40:60) (350 Å) |

The performance of devices in Example 5-1 and Comparative Example 5-1 is summarized in Table 10. The chromaticity coordinates, external quantum efficiency and voltage were measured at the current density of 15 mA/cm$^2$, and the lifetime of the device (LT95) was the measured time for the device to decay to 95% of initial brightness at 80 mA/cm$^2$.

TABLE 10

Performance data of devices in Example 5-1 and Comparative Example 5-1

| | At 15 mA/cm$^2$ | | | At 80 mA/cm$^2$ |
|---|---|---|---|---|
| | CIEx | CIEy | Voltage [V] | EQE [%] | LT95 [h] |
| Example 5-1 | 0.681 | 0.318 | 4.8 | 23.7 | 150 |
| Comparative Example 5-1 | 0.681 | 0.317 | 4.8 | 23.6 | 135 |

In Example 5-1, in the red light device, Compound 70 with a LUMO energy level of −5.20 eV was used as a p-type conductive doped material and was doped to Compound H-176, a hole transporting material with a HOMO energy level of −5.29 eV. Comparative Example 5-1 was a structure of a red light device commonly used in the industry, and it can be known from the device data that it had the high performance of a red light device in the industry. Compared with Comparative Example 5-1, under the premise of ensuring the color, the voltage and efficiency of the device in Example 5-1 were basically maintained the same, and the lifetime was increased by 11%. That is, it is further proved that the simple device structure that utilizes the combination of a hole transporting material having a deep HOMO energy level and a p-type conductive doped material having a deep LUMO energy level can also significantly improve the performance of a red light device, especially in terms of lifetime of the device.

In summary, by combining a hole transporting material having a deep HOMO energy level and a p-type conductive doped material having a deep LUMO energy level, the injection and transporting of holes are facilitated, and the device performance of such device is better than that of the device formed by the combination of a p-type conductive doped material having a shallow LUMO energy level and a hole transporting material having a deep HOMO energy level. Furthermore, the combination in the present disclosure can effectively improve device performance when applied to various organic electroluminescence devices, and is a material combination with great development potential.

It should be understood that various embodiments described herein are examples and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It should be understood that various theories as to why the present disclosure works are not intended to be limitative.

What is claimed is:

1. An organic electroluminescence device, comprising:
an anode,
a cathode,
a light-emitting layer disposed between the anode and the cathode, and
a first organic layer disposed between the anode and the light-emitting layer,
wherein the first organic layer comprises a compound of Formula 1 and a compound of Formula 2;

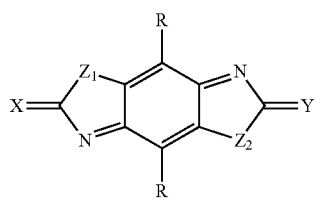

Formula 1 wherein, in Formula 1,
X and Y are, at each occurrence identically or differently, selected from NR', CR"R'", O, S or Se;
$Z_1$ and $Z_2$ are, at each occurrence identically or differently, selected from O, S or Se;
R, R', R" and R'" are, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;
each R is identical or different, and at least one of R, R', R" and R'" is a group having at least one electron-withdrawing group; and
in Formula 1, adjacent substituents are optionally joined to form a ring;
wherein, in Formula 2,

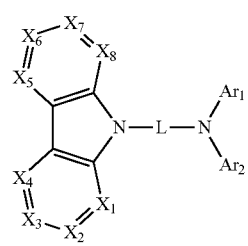

Formula 2

$X_1$ to $X_8$ are, at each occurrence identically or differently, selected from $CR_1$ or N;
L is, at each occurrence identically or differently, selected from a substituted or unsubstituted arylene group having 6 to 30 carbon atoms, a substituted or unsubstituted heteroarylene group having 3 to 30 carbon atoms, or combinations thereof;
$Ar_1$ and $Ar_2$ are, at each occurrence identically or differently, selected from a substituted or unsubstituted aryl group having 6 to 30 carbon atoms or a substituted or unsubstituted heteroaryl group having 3 to 30 carbon atoms;
$R_1$ is, at each occurrence identically or differently, selected from a group consisting of:
hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and
in Formula 2, adjacent substituents are optionally joined to form a ring.

2. The organic electroluminescence device according to claim 1, wherein X and Y are, at each occurrence identically or differently, selected from CR"R'" or NR', and R', R" and R'" are a group having at least one electron-withdrawing group; optionally, R, R', R" and R'" are a group having at least one electron-withdrawing group.

3. The organic electroluminescence device according to claim 1, wherein X and Y are, at each occurrence identically or differently, selected from O, S or Se, and at least one of R is a group having at least one electron-withdrawing group; optionally, all of R are groups having at least one electron-withdrawing group.

4. The organic electroluminescence device according to claim 1, wherein the Hammett constant of the electron-withdrawing group is greater than or equal to 0.05, optionally is greater than or equal to 0.3, and optionally is greater than or equal to 0.5.

5. The organic electroluminescence device according to claim 1, wherein the electron-withdrawing group is selected from a group consisting of: halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, an aza-aromatic ring group, and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, and an aza-aromatic ring group: an alkyl group having 1 to 20 carbon atoms, a cycloalkyl group having 3 to 20 ring carbon atoms, a heteroalkyl group having 1 to 20 carbon atoms, an arylalkyl group having 7 to 30 carbon atoms, an alkoxy group having 1 to 20 carbon atoms, an aryloxy group having 6 to 30 carbon atoms, an alkenyl group having 2 to 20 carbon atoms, an alkynyl group having 2 to 20 carbon atoms, an aryl group having 6 to 30 carbon atoms, a heteroaryl group having 3 to 30 carbon atoms, an alkylsilyl group having 3 to 20 carbon atoms, an arylsilyl group having 6 to 20 carbon atoms, and combinations thereof;

optionally, the electron-withdrawing group is selected from a group consisting of: F, CF$_3$, OCF$_3$, SF$_5$, SO$_2$CF$_3$, a cyano group, an isocyano group, SCN, OCN, a pyrimidinyl group, a triazinyl group, and combinations thereof.

6. The organic electroluminescence device according to claim 1, wherein X and Y are, at each occurrence identically or differently, selected from a group consisting of the following structures:

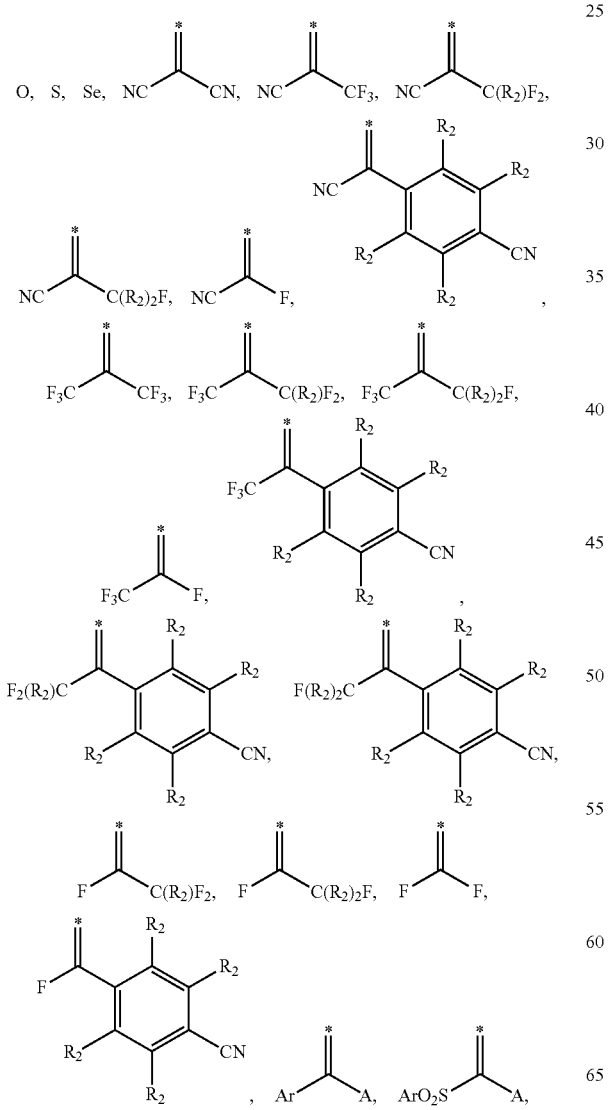

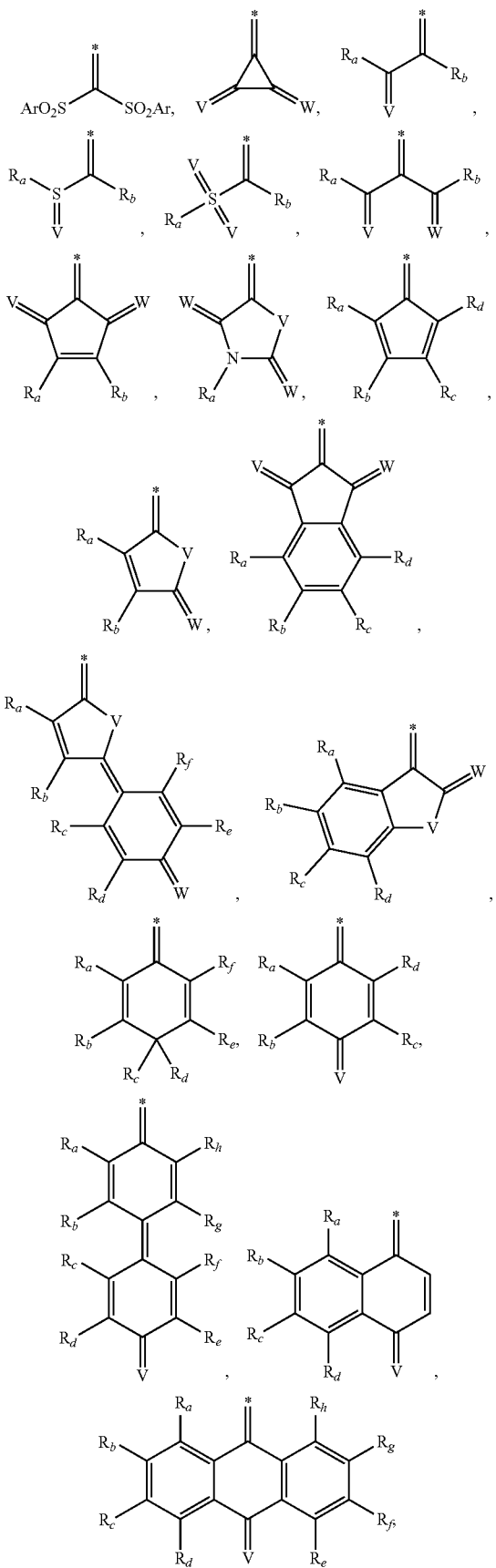

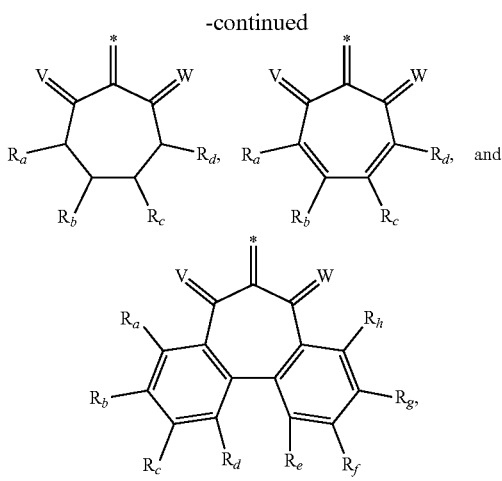

wherein $R_2$ is, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;

optionally, $R_2$ is, at each occurrence identically or differently, selected from a group consisting of: F, $CF_3$, $OCF_3$, $SF_5$, $SO_2CF_3$, a cyano group, an isocyano group, SCN, OCN, a pentafluorophenyl group, a 4-cyanotetrafluorophenyl group, a tetrafluoropyridyl group, a pyrimidyl group, a triazinyl group, and combinations thereof;

wherein V and W are, at each occurrence identically or differently, selected from $CR_vR_w$, $NR_v$, O, S or Se;

wherein Ar is, at each occurrence identically or differently, selected from a substituted or unsubstituted aryl group having 6 to 30 carbon atoms or a substituted or unsubstituted heteroaryl group having 3 to 30 carbon atoms;

wherein A, $R_a$, $R_b$, $R_c$, $R_d$, $R_e$, $R_f$, $R_g$, $R_h$, $R_v$ and $R_w$ are, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkynyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, and combinations thereof;

wherein A is a group having at least one electron-withdrawing group, and for any of the structures, when one or more of $R_a$, $R_b$, $R_c$, $R_d$, $R_e$, $R_f$, $R_g$, $R_h$, $R_v$ and $R_w$ occur, at least one of $R_a$, $R_b$, $R_c$, $R_d$, $R_e$, $R_f$, $R_g$, $R_h$, $R_v$ and $R_w$ is a group having at least one electron-withdrawing group;

optionally, the group having at least one electron-withdrawing group is selected from a group consisting of: F, $CF_3$, $OCF_3$, $SF_5$, $SO_2CF_3$, a cyano group, an isocyano group, SCN, OCN, a pentafluorophenyl group, a 4-cyanotetrafluorophenyl group, a tetrafluoropyridyl group, a pyrimidyl group, a triazinyl group, and combinations thereof;

wherein "*" represents a position where the X and Y groups are joined to a dehydrobenzodioxazole ring, a dehydrobenzodithiazole ring, or a dehydrobenzodiselenazole in Formula 1.

7. The organic electroluminescence device according to claim 1, wherein X and Y are, at each occurrence identically or differently, selected from a group consisting of the following structures:

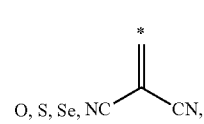

A1

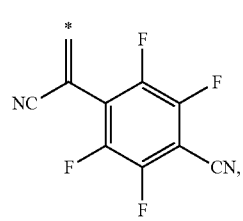

A2

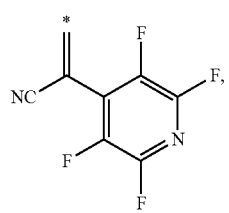

A3

-continued

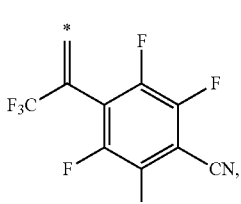
A4

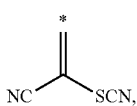
A5

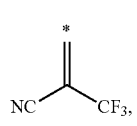
A6

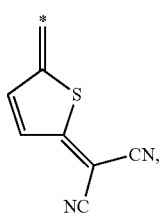
A7 wherein "*" represents a position where the X and Y groups are joined to a dehydrobenzodioxazole ring, a dehydrobenzodithiazole ring, or a dehydrobenzodiselenazole in Formula 1.

8. The organic electroluminescence device according to claim 1, wherein R is, at each occurrence identically or differently, selected from a group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, an unsubstituted alkyl group having 1 to 20 carbon atoms, an unsubstituted cycloalkyl group having 3 to 20 ring carbon atoms, an unsubstituted alkoxy group having 1 to 20 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, and a phosphoroso group: an alkyl group having 1 to 20 carbon atoms, a cycloalkyl group having 3 to 20 ring carbon atoms, an alkoxy group having 1 to 20 carbon atoms, an alkenyl group having 2 to 20 carbon atoms, an aryl group having 6 to 30 carbon atoms, a heteroaryl group having 3 to 30 carbon atoms, and combinations thereof;

optionally, R is, at each occurrence identically or differently, selected from a group consisting of: hydrogen, deuterium, a methyl group, an isopropyl group, $NO_2$, $SO_2CH_3$, $SCF_3$, $C_2F_5$, $OC_2F_5$, $OCH_3$, a diphenylmethylsilyl group, a phenyl group, a methoxyphenyl group, a p-methylphenyl group, a 2,6-diisopropylphenyl group, a biphenylyl group, a polyfluorophenyl group, a difluopyridyl group, a nitrophenyl group, a dimethylthiazolyl group, a vinyl group substituted by one or more of CN or $CF_3$, an acetenyl group substituted by one of CN or $CF_3$, a dimethylphosphoroso group, a diphenylphosphoroso group, F, $CF_3$, $OCF_3$, $SF_5$, $SO_2CF_3$, a cyano group, an isocyano group, SCN, OCN, a trifluoromethylphenyl group, a trifluoromethoxyphenyl group, a bis(trifluoromethyl)phenyl group, a bis(trifluoromethoxy)phenyl group, a 4-cyanotetrafluorophenyl group, a phenyl or biphenylyl group substituted by one or more of F, CN or $CF_3$, a tetrafluoropyridyl group, a pyrimidinyl group, a triazinyl group, a diphenylboryl group, an oxaboraanthryl group, and combinations thereof.

9. The organic electroluminescence device according to claim 8, wherein X and Y are

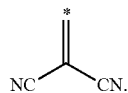

10. The organic electroluminescence device according to claim 1, wherein R is, at each occurrence identically or differently, selected from a group consisting of the following structures:

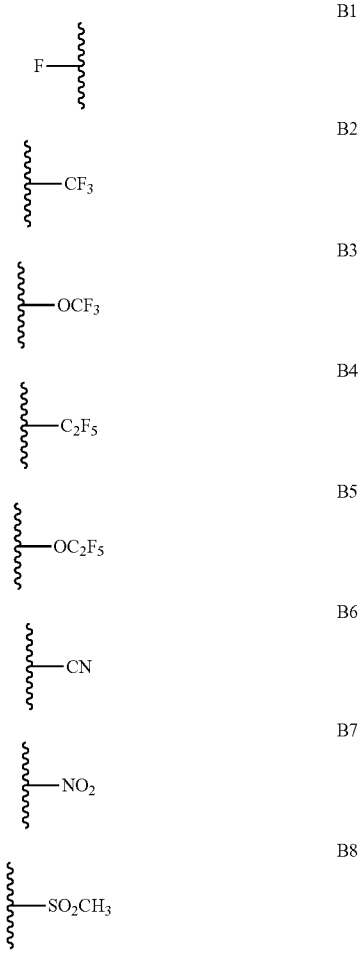

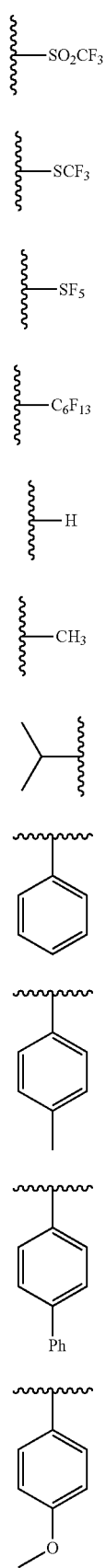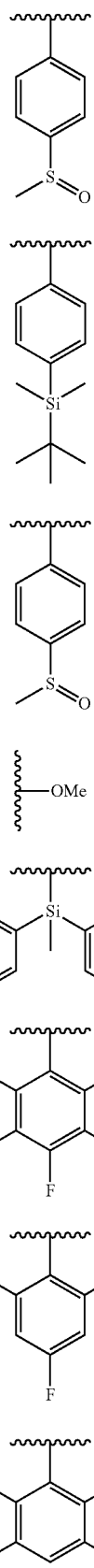

-continued
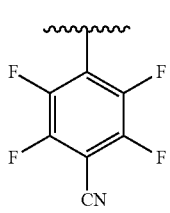 B28
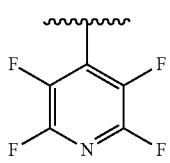 B29
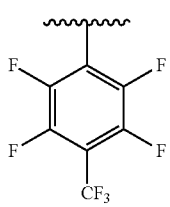 B30
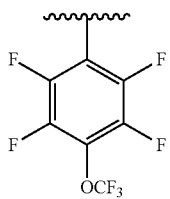 B31
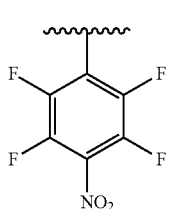 B32
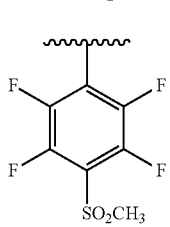 B33
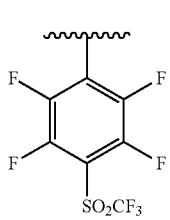 B34
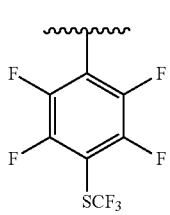 B35
-continued
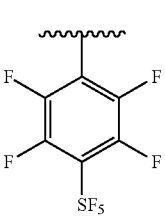 B36
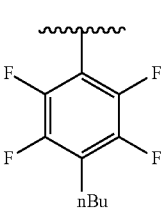 B37
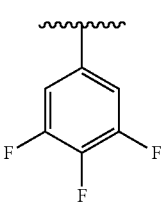 B38
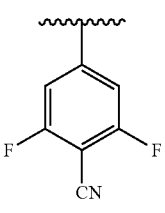 B39
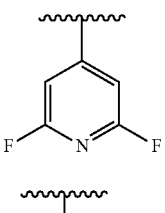 B40
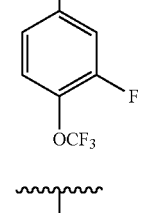 B41
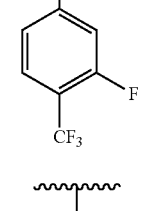 B42
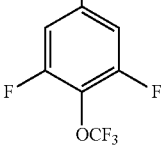 B43

-continued
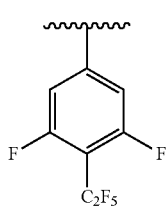 B44
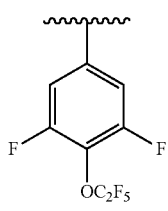 B45
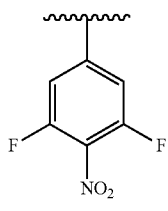 B46
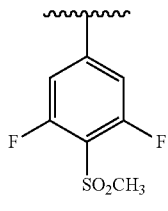 B47
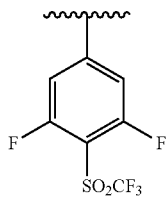 B48
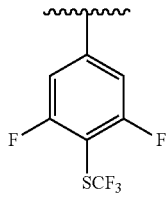 B49
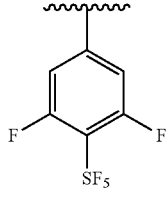 B50
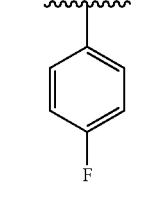 B51
-continued
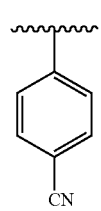 B52
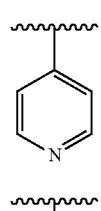 B53
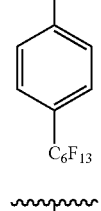 B54
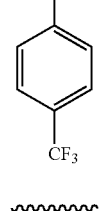 B55
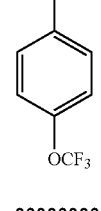 B56
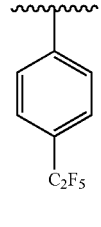 B57
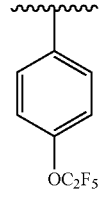 B58
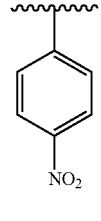 B59

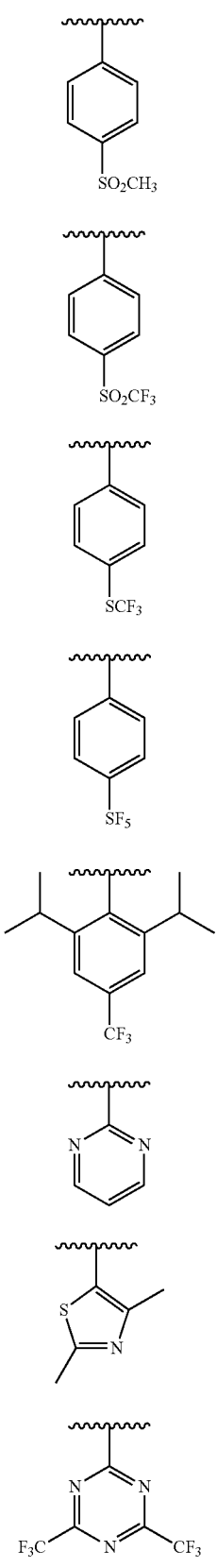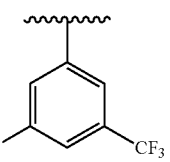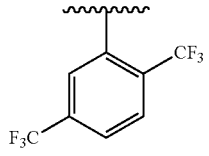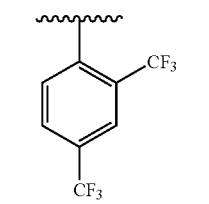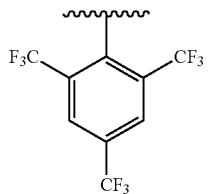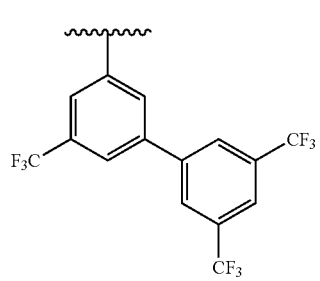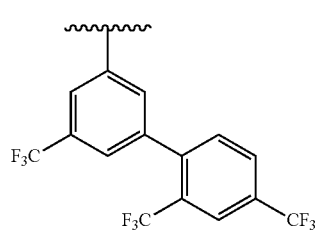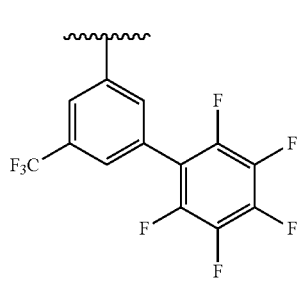

-continued

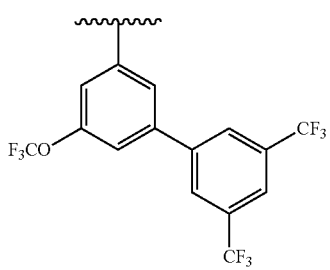 B75

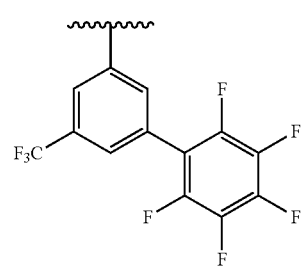 B76

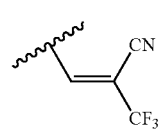 B77

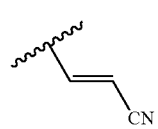 B78

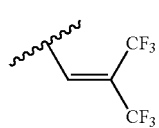 B79

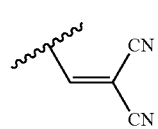 B80

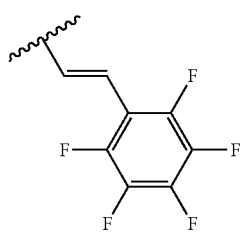 B81

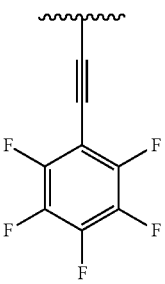 B82

-continued

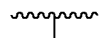 B83

 B84

 B85

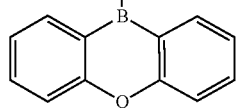 B86

 B87

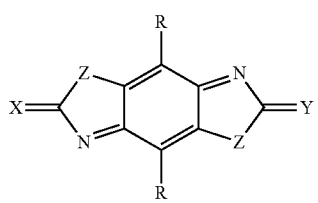 B88 optionally, both of R in a compound represented by Formula 1 are identical;

wherein "z,?" represents a position where the R group is joined to a dehydrobenzodioxazole ring, a dehydrobenzodithiazole ring, or a dehydrobenzodiselenazole in Formula 1.

11. The organic electroluminescence device according to claim 10, wherein the compound of Formula 1 has a structure represented by Formula 3:

Formula 3

$$\text{(structure shown)}$$

wherein, in Formula 3, structures of both Z are identical, structures of both R are identical or different, and the Z, X, Y and R are respectively and correspondingly selected from atoms or groups shown in the following table;

wherein, the compound having the structure of Formula 3 is selected from a group consisting of the following compounds:

| No. | Z | X | Y | R | R |
|---|---|---|---|---|---|
| Compound 1 | O | A1 | A1 | B1 | B1 |
| Compound 2 | O | A1 | A1 | B2 | B2 |
| Compound 3 | O | A1 | A1 | B3 | B3 |
| Compound 4 | O | A1 | A1 | B4 | B4 |
| Compound 5 | O | A1 | A1 | B5 | B5 |
| Compound 6 | O | A1 | A1 | B6 | B6 |
| Compound 7 | O | A1 | A1 | B7 | B7 |
| Compound 8 | O | A1 | A1 | B8 | B8 |
| Compound 9 | O | A1 | A1 | B9 | B9 |
| Compound 10 | O | A1 | A1 | B10 | B10 |
| Compound 11 | O | A1 | A1 | B11 | B11 |
| Compound 12 | O | A1 | A1 | B12 | B12 |
| Compound 13 | O | A1 | A1 | B13 | B13 |
| Compound 14 | O | A1 | A1 | B14 | B14 |
| Compound 15 | O | A1 | A1 | B15 | B15 |
| Compound 16 | O | A1 | A1 | B16 | B16 |
| Compound 17 | O | A1 | A1 | B17 | B17 |
| Compound 18 | O | A1 | A1 | B18 | B18 |
| Compound 19 | O | A1 | A1 | B19 | B19 |
| Compound 20 | O | A1 | A1 | B20 | B20 |
| Compound 21 | O | A1 | A1 | B21 | B21 |
| Compound 22 | O | A1 | A1 | B22 | B22 |
| Compound 23 | O | A1 | A1 | B23 | B23 |
| Compound 24 | O | A1 | A1 | B24 | B24 |
| Compound 25 | O | A1 | A1 | B25 | B25 |
| Compound 26 | O | A1 | A1 | B26 | B26 |
| Compound 27 | O | A1 | A1 | B27 | B27 |
| Compound 28 | O | A1 | A1 | B28 | B28 |
| Compound 29 | O | A1 | A1 | B29 | B29 |
| Compound 30 | O | A1 | A1 | B30 | B30 |
| Compound 31 | O | A1 | A1 | B31 | B31 |
| Compound 32 | O | A1 | A1 | B32 | B32 |
| Compound 33 | O | A1 | A1 | B33 | B33 |
| Compound 34 | O | A1 | A1 | B34 | B34 |
| Compound 35 | O | A1 | A1 | B35 | B35 |
| Compound 36 | O | A1 | A1 | B36 | B36 |
| Compound 37 | O | A1 | A1 | B37 | B37 |
| Compound 38 | O | A1 | A1 | B38 | B38 |
| Compound 39 | O | A1 | A1 | B39 | B39 |
| Compound 40 | O | A1 | A1 | B40 | B40 |
| Compound 41 | O | A1 | A1 | B41 | B41 |
| Compound 42 | O | A1 | A1 | B42 | B42 |
| Compound 43 | O | A1 | A1 | B43 | B43 |
| Compound 44 | O | A1 | A1 | B44 | B44 |
| Compound 45 | O | A1 | A1 | B45 | B45 |
| Compound 46 | O | A1 | A1 | B46 | B46 |
| Compound 47 | O | A1 | A1 | B47 | B47 |
| Compound 48 | O | A1 | A1 | B48 | B48 |
| Compound 49 | O | A1 | A1 | B49 | B49 |
| Compound 50 | O | A1 | A1 | B50 | B50 |
| Compound 51 | O | A1 | A1 | B51 | B51 |
| Compound 52 | O | A1 | A1 | B52 | B52 |
| Compound 53 | O | A1 | A1 | B53 | B53 |
| Compound 54 | O | A1 | A1 | B54 | B54 |
| Compound 55 | O | A1 | A1 | B55 | B55 |
| Compound 56 | O | A1 | A1 | B56 | B56 |
| Compound 57 | O | A1 | A1 | B57 | B57 |
| Compound 58 | O | A1 | A1 | B58 | B58 |
| Compound 59 | O | A1 | A1 | B59 | B59 |
| Compound 60 | O | A1 | A1 | B60 | B60 |
| Compound 61 | O | A1 | A1 | B61 | B61 |
| Compound 62 | O | A1 | A1 | B62 | B62 |
| Compound 63 | O | A1 | A1 | B63 | B63 |
| Compound 64 | O | A1 | A1 | B64 | B64 |
| Compound 65 | O | A1 | A1 | B65 | B65 |
| Compound 66 | O | A1 | A1 | B66 | B66 |
| Compound 67 | O | A1 | A1 | B67 | B67 |
| Compound 68 | O | A1 | A1 | B68 | B68 |
| Compound 69 | O | A1 | A1 | B69 | B69 |
| Compound 70 | O | A1 | A1 | B70 | B70 |
| Compound 71 | O | A1 | A1 | B71 | B71 |
| Compound 72 | O | A1 | A1 | B72 | B72 |
| Compound 73 | O | A1 | A1 | B73 | B73 |
| Compound 74 | O | A1 | A1 | B74 | B74 |
| Compound 75 | O | A1 | A1 | B75 | B75 |
| Compound 76 | O | A1 | A1 | B76 | B76 |
| Compound 77 | O | A1 | A1 | B77 | B77 |
| Compound 78 | O | A1 | A1 | B78 | B78 |
| Compound 79 | O | A1 | A1 | B79 | B79 |
| Compound 80 | O | A1 | A1 | B80 | B80 |
| Compound 81 | O | A1 | A1 | B81 | B81 |
| Compound 82 | O | A1 | A1 | B82 | B82 |
| Compound 83 | O | A1 | A1 | B83 | B83 |
| Compound 84 | O | A1 | A1 | B84 | B84 |
| Compound 85 | O | A1 | A1 | B85 | B85 |
| Compound 86 | O | A1 | A1 | B86 | B86 |
| Compound 87 | O | A1 | A1 | B87 | B87 |
| Compound 88 | O | A1 | A1 | B88 | B88 |
| Compound 89 | S | A1 | A1 | B1 | B1 |
| Compound 90 | S | A1 | A1 | B2 | B2 |
| Compound 91 | S | A1 | A1 | B3 | B3 |
| Compound 92 | S | A1 | A1 | B4 | B4 |
| Compound 93 | S | A1 | A1 | B5 | B5 |
| Compound 94 | S | A1 | A1 | B6 | B6 |
| Compound 95 | S | A1 | A1 | B7 | B7 |
| Compound 96 | S | A1 | A1 | B8 | B8 |
| Compound 97 | S | A1 | A1 | B9 | B9 |
| Compound 98 | S | A1 | A1 | B10 | B10 |
| Compound 99 | S | A1 | A1 | B11 | B11 |
| Compound 100 | S | A1 | A1 | B12 | B12 |
| Compound 101 | S | A1 | A1 | B13 | B13 |
| Compound 102 | S | A1 | A1 | B14 | B14 |
| Compound 103 | S | A1 | A1 | B15 | B15 |
| Compound 104 | S | A1 | A1 | B16 | B16 |
| Compound 105 | S | A1 | A1 | B17 | B17 |
| Compound 106 | S | A1 | A1 | B18 | B18 |
| Compound 107 | S | A1 | A1 | B19 | B19 |
| Compound 108 | S | A1 | A1 | B20 | B20 |
| Compound 109 | S | A1 | A1 | B21 | B21 |
| Compound 110 | S | A1 | A1 | B22 | B22 |
| Compound 111 | S | A1 | A1 | B23 | B23 |
| Compound 112 | S | A1 | A1 | B24 | B24 |
| Compound 113 | S | A1 | A1 | B25 | B25 |
| Compound 114 | S | A1 | A1 | B26 | B26 |
| Compound 115 | S | A1 | A1 | B27 | B27 |
| Compound 116 | S | A1 | A1 | B28 | B28 |
| Compound 117 | S | A1 | A1 | B29 | B29 |
| Compound 118 | S | A1 | A1 | B30 | B30 |
| Compound 119 | S | A1 | A1 | B31 | B31 |
| Compound 120 | S | A1 | A1 | B32 | B32 |
| Compound 121 | S | A1 | A1 | B33 | B33 |
| Compound 122 | S | A1 | A1 | B34 | B34 |
| Compound 123 | S | A1 | A1 | B35 | B35 |
| Compound 124 | S | A1 | A1 | B36 | B36 |
| Compound 125 | S | A1 | A1 | B37 | B37 |
| Compound 126 | S | A1 | A1 | B38 | B38 |
| Compound 127 | S | A1 | A1 | B39 | B39 |
| Compound 128 | S | A1 | A1 | B40 | B40 |
| Compound 129 | S | A1 | A1 | B41 | B41 |
| Compound 130 | S | A1 | A1 | B42 | B42 |
| Compound 131 | S | A1 | A1 | B43 | B43 |
| Compound 132 | S | A1 | A1 | B44 | B44 |
| Compound 133 | S | A1 | A1 | B45 | B45 |
| Compound 134 | S | A1 | A1 | B46 | B46 |
| Compound 135 | S | A1 | A1 | B47 | B47 |
| Compound 136 | S | A1 | A1 | B48 | B48 |
| Compound 137 | S | A1 | A1 | B49 | B49 |
| Compound 138 | S | A1 | A1 | B50 | B50 |
| Compound 139 | S | A1 | A1 | B51 | B51 |
| Compound 140 | S | A1 | A1 | B52 | B52 |
| Compound 141 | S | A1 | A1 | B53 | B53 |
| Compound 142 | S | A1 | A1 | B54 | B54 |
| Compound 143 | S | A1 | A1 | B55 | B55 |
| Compound 144 | S | A1 | A1 | B56 | B56 |
| Compound 145 | S | A1 | A1 | B57 | B57 |
| Compound 146 | S | A1 | A1 | B58 | B58 |
| Compound 147 | S | A1 | A1 | B59 | B59 |
| Compound 148 | S | A1 | A1 | B60 | B60 |
| Compound 149 | S | A1 | A1 | B61 | B61 |
| Compound 150 | S | A1 | A1 | B62 | B62 |
| Compound 151 | S | A1 | A1 | B63 | B63 |
| Compound 152 | S | A1 | A1 | B64 | B64 |
| Compound 153 | S | A1 | A1 | B65 | B65 |
| Compound 154 | S | A1 | A1 | B66 | B66 |
| Compound 155 | S | A1 | A1 | B67 | B67 |
| Compound 156 | S | A1 | A1 | B68 | B68 |

| No. | Z | X | Y | R | R |
|---|---|---|---|---|---|
| Compound 157 | S | A1 | A1 | B69 | B69 |
| Compound 158 | S | A1 | A1 | B70 | B70 |
| Compound 159 | S | A1 | A1 | B71 | B71 |
| Compound 160 | S | A1 | A1 | B72 | B72 |
| Compound 161 | S | A1 | A1 | B73 | B73 |
| Compound 162 | S | A1 | A1 | B74 | B74 |
| Compound 163 | S | A1 | A1 | B75 | B75 |
| Compound 164 | S | A1 | A1 | B76 | B76 |
| Compound 165 | S | A1 | A1 | B77 | B77 |
| Compound 166 | S | A1 | A1 | B78 | B78 |
| Compound 167 | S | A1 | A1 | B79 | B79 |
| Compound 168 | S | A1 | A1 | B80 | B80 |
| Compound 169 | S | A1 | A1 | B81 | B81 |
| Compound 170 | S | A1 | A1 | B82 | B82 |
| Compound 171 | S | A1 | A1 | B83 | B83 |
| Compound 172 | S | A1 | A1 | B84 | B84 |
| Compound 173 | S | A1 | A1 | B85 | B85 |
| Compound 174 | S | A1 | A1 | B86 | B86 |
| Compound 175 | S | A1 | A1 | B87 | B87 |
| Compound 176 | S | A1 | A1 | B88 | B88 |
| Compound 177 | Se | A1 | A1 | B1 | B1 |
| Compound 178 | Se | A1 | A1 | B2 | B2 |
| Compound 179 | Se | A1 | A1 | B3 | B3 |
| Compound 180 | Se | A1 | A1 | B4 | B4 |
| Compound 181 | Se | A1 | A1 | B5 | B5 |
| Compound 182 | Se | A1 | A1 | B6 | B6 |
| Compound 183 | Se | A1 | A1 | B7 | B7 |
| Compound 184 | Se | A1 | A1 | B8 | B8 |
| Compound 185 | Se | A1 | A1 | B9 | B9 |
| Compound 186 | Se | A1 | A1 | B10 | B10 |
| Compound 187 | Se | A1 | A1 | B11 | B11 |
| Compound 188 | Se | A1 | A1 | B12 | B12 |
| Compound 189 | Se | A1 | A1 | B13 | B13 |
| Compound 190 | Se | A1 | A1 | B14 | B14 |
| Compound 191 | Se | A1 | A1 | B15 | B15 |
| Compound 192 | Se | A1 | A1 | B16 | B16 |
| Compound 193 | Se | A1 | A1 | B17 | B17 |
| Compound 194 | Se | A1 | A1 | B18 | B18 |
| Compound 195 | Se | A1 | A1 | B19 | B19 |
| Compound 196 | Se | A1 | A1 | B20 | B20 |
| Compound 197 | Se | A1 | A1 | B21 | B21 |
| Compound 198 | Se | A1 | A1 | B22 | B22 |
| Compound 199 | Se | A1 | A1 | B23 | B23 |
| Compound 200 | Se | A1 | A1 | B24 | B24 |
| Compound 201 | Se | A1 | A1 | B25 | B25 |
| Compound 202 | Se | A1 | A1 | B26 | B26 |
| Compound 203 | Se | A1 | A1 | B27 | B27 |
| Compound 204 | Se | A1 | A1 | B28 | B28 |
| Compound 205 | Se | A1 | A1 | B29 | B29 |
| Compound 206 | Se | A1 | A1 | B30 | B30 |
| Compound 207 | Se | A1 | A1 | B31 | B31 |
| Compound 208 | Se | A1 | A1 | B32 | B32 |
| Compound 209 | Se | A1 | A1 | B33 | B33 |
| Compound 210 | Se | A1 | A1 | B34 | B34 |
| Compound 211 | Se | A1 | A1 | B35 | B35 |
| Compound 212 | Se | A1 | A1 | B36 | B36 |
| Compound 213 | Se | A1 | A1 | B37 | B37 |
| Compound 214 | Se | A1 | A1 | B38 | B38 |
| Compound 215 | Se | A1 | A1 | B39 | B39 |
| Compound 216 | Se | A1 | A1 | B40 | B40 |
| Compound 217 | Se | A1 | A1 | B41 | B41 |
| Compound 218 | Se | A1 | A1 | B42 | B42 |
| Compound 219 | Se | A1 | A1 | B43 | B43 |
| Compound 220 | Se | A1 | A1 | B44 | B44 |
| Compound 221 | Se | A1 | A1 | B45 | B45 |
| Compound 222 | Se | A1 | A1 | B46 | B46 |
| Compound 223 | Se | A1 | A1 | B47 | B47 |
| Compound 224 | Se | A1 | A1 | B48 | B48 |
| Compound 225 | Se | A1 | A1 | B49 | B49 |
| Compound 226 | Se | A1 | A1 | B50 | B50 |
| Compound 227 | Se | A1 | A1 | B51 | B51 |
| Compound 228 | Se | A1 | A1 | B52 | B52 |
| Compound 229 | Se | A1 | A1 | B53 | B53 |
| Compound 230 | Se | A1 | A1 | B54 | B54 |
| Compound 231 | Se | A1 | A1 | B55 | B55 |
| Compound 232 | Se | A1 | A1 | B56 | B56 |
| Compound 233 | Se | A1 | A1 | B57 | B57 |
| Compound 234 | Se | A1 | A1 | B58 | B58 |
| Compound 235 | Se | A1 | A1 | B59 | B59 |
| Compound 236 | Se | A1 | A1 | B60 | B60 |
| Compound 237 | Se | A1 | A1 | B61 | B61 |
| Compound 238 | Se | A1 | A1 | B62 | B62 |
| Compound 239 | Se | A1 | A1 | B63 | B63 |
| Compound 240 | Se | A1 | A1 | B64 | B64 |
| Compound 241 | Se | A1 | A1 | B65 | B65 |
| Compound 242 | Se | A1 | A1 | B66 | B66 |
| Compound 243 | Se | A1 | A1 | B67 | B67 |
| Compound 244 | Se | A1 | A1 | B68 | B68 |
| Compound 245 | Se | A1 | A1 | B69 | B69 |
| Compound 246 | Se | A1 | A1 | B70 | B70 |
| Compound 247 | Se | A1 | A1 | B71 | B71 |
| Compound 248 | Se | A1 | A1 | B72 | B72 |
| Compound 249 | Se | A1 | A1 | B73 | B73 |
| Compound 250 | Se | A1 | A1 | B74 | B74 |
| Compound 251 | Se | A1 | A1 | B75 | B75 |
| Compound 252 | Se | A1 | A1 | B76 | B76 |
| Compound 253 | Se | A1 | A1 | B77 | B77 |
| Compound 254 | Se | A1 | A1 | B78 | B78 |
| Compound 255 | Se | A1 | A1 | B79 | B79 |
| Compound 256 | Se | A1 | A1 | B80 | B80 |
| Compound 257 | Se | A1 | A1 | B81 | B81 |
| Compound 258 | Se | A1 | A1 | B82 | B82 |
| Compound 259 | Se | A1 | A1 | B83 | B83 |
| Compound 260 | Se | A1 | A1 | B84 | B84 |
| Compound 261 | Se | A1 | A1 | B85 | B85 |
| Compound 262 | Se | A1 | A1 | B86 | B86 |
| Compound 263 | Se | A1 | A1 | B87 | B87 |
| Compound 264 | Se | A1 | A1 | B88 | B88 |
| Compound 265 | O | A2 | A2 | B1 | B1 |
| Compound 266 | O | A2 | A2 | B6 | B6 |
| Compound 267 | O | A2 | A2 | B10 | B10 |
| Compound 268 | O | A2 | A2 | B16 | B16 |
| Compound 269 | O | A2 | A2 | B25 | B25 |
| Compound 270 | O | A2 | A2 | B28 | B28 |
| Compound 271 | O | A2 | A2 | B29 | B29 |
| Compound 272 | O | A2 | A2 | B30 | B30 |
| Compound 273 | O | A2 | A2 | B38 | B38 |
| Compound 274 | O | A2 | A2 | B39 | B39 |
| Compound 275 | O | A2 | A2 | B40 | B40 |
| Compound 276 | O | A2 | A2 | B41 | B41 |
| Compound 277 | O | A2 | A2 | B43 | B43 |
| Compound 278 | O | A2 | A2 | B52 | B52 |
| Compound 279 | O | A2 | A2 | B56 | B56 |
| Compound 280 | O | A2 | A2 | B67 | B67 |
| Compound 281 | O | A2 | A2 | B68 | B68 |
| Compound 282 | O | A2 | A2 | B69 | B69 |
| Compound 283 | O | A2 | A2 | B70 | B70 |
| Compound 284 | O | A2 | A2 | B71 | B71 |
| Compound 285 | O | A2 | A2 | B72 | B72 |
| Compound 286 | O | A2 | A2 | B74 | B74 |
| Compound 287 | O | A2 | A2 | B79 | B79 |
| Compound 288 | O | A2 | A2 | B80 | B80 |
| Compound 289 | O | A2 | A2 | B82 | B82 |
| Compound 290 | O | A2 | A2 | B83 | B83 |
| Compound 291 | O | A2 | A2 | B86 | B86 |
| Compound 292 | O | A2 | A2 | B88 | B88 |
| Compound 293 | S | A2 | A2 | B1 | B1 |
| Compound 294 | S | A2 | A2 | B6 | B6 |
| Compound 295 | S | A2 | A2 | B10 | B10 |
| Compound 296 | S | A2 | A2 | B16 | B16 |
| Compound 297 | S | A2 | A2 | B25 | B25 |
| Compound 298 | S | A2 | A2 | B28 | B28 |
| Compound 299 | S | A2 | A2 | B29 | B29 |
| Compound 300 | S | A2 | A2 | B30 | B30 |
| Compound 301 | S | A2 | A2 | B38 | B38 |
| Compound 302 | S | A2 | A2 | B39 | B39 |
| Compound 303 | S | A2 | A2 | B40 | B40 |
| Compound 304 | S | A2 | A2 | B41 | B41 |
| Compound 305 | S | A2 | A2 | B43 | B43 |
| Compound 306 | S | A2 | A2 | B52 | B52 |
| Compound 307 | S | A2 | A2 | B56 | B56 |
| Compound 308 | S | A2 | A2 | B67 | B67 |
| Compound 309 | S | A2 | A2 | B68 | B68 |
| Compound 310 | S | A2 | A2 | B69 | B69 |

| No. | Z | X | Y | R | R |
|---|---|---|---|---|---|
| Compound 311 | S | A2 | A2 | B70 | B70 |
| Compound 312 | S | A2 | A2 | B71 | B71 |
| Compound 313 | S | A2 | A2 | B72 | B72 |
| Compound 314 | S | A2 | A2 | B74 | B74 |
| Compound 315 | S | A2 | A2 | B79 | B79 |
| Compound 316 | S | A2 | A2 | B80 | B80 |
| Compound 317 | S | A2 | A2 | B82 | B82 |
| Compound 318 | S | A2 | A2 | B83 | B83 |
| Compound 319 | S | A2 | A2 | B86 | B86 |
| Compound 320 | S | A2 | A2 | B88 | B88 |
| Compound 321 | Se | A2 | A2 | B1 | B1 |
| Compound 322 | Se | A2 | A2 | B6 | B6 |
| Compound 323 | Se | A2 | A2 | B10 | B10 |
| Compound 324 | Se | A2 | A2 | B16 | B16 |
| Compound 325 | Se | A2 | A2 | B25 | B25 |
| Compound 326 | Se | A2 | A2 | B28 | B28 |
| Compound 327 | Se | A2 | A2 | B29 | B29 |
| Compound 328 | Se | A2 | A2 | B30 | B30 |
| Compound 329 | Se | A2 | A2 | B38 | B38 |
| Compound 330 | Se | A2 | A2 | B39 | B39 |
| Compound 331 | Se | A2 | A2 | B40 | B40 |
| Compound 332 | Se | A2 | A2 | B41 | B41 |
| Compound 333 | Se | A2 | A2 | B43 | B43 |
| Compound 334 | Se | A2 | A2 | B52 | B52 |
| Compound 335 | Se | A2 | A2 | B56 | B56 |
| Compound 336 | Se | A2 | A2 | B67 | B67 |
| Compound 337 | Se | A2 | A2 | B68 | B68 |
| Compound 338 | Se | A2 | A2 | B69 | B69 |
| Compound 339 | Se | A2 | A2 | B70 | B70 |
| Compound 340 | Se | A2 | A2 | B71 | B71 |
| Compound 341 | Se | A2 | A2 | B72 | B72 |
| Compound 342 | Se | A2 | A2 | B74 | B74 |
| Compound 343 | Se | A2 | A2 | B79 | B79 |
| Compound 344 | Se | A2 | A2 | B80 | B80 |
| Compound 345 | Se | A2 | A2 | B82 | B82 |
| Compound 346 | Se | A2 | A2 | B83 | B83 |
| Compound 347 | Se | A2 | A2 | B86 | B86 |
| Compound 348 | Se | A2 | A2 | B88 | B88 |
| Compound 349 | O | A3 | A3 | B1 | B1 |
| Compound 350 | O | A3 | A3 | B6 | B6 |
| Compound 351 | O | A3 | A3 | B10 | B10 |
| Compound 352 | O | A3 | A3 | B16 | B16 |
| Compound 353 | O | A3 | A3 | B25 | B25 |
| Compound 354 | O | A3 | A3 | B28 | B28 |
| Compound 355 | O | A3 | A3 | B29 | B29 |
| Compound 356 | O | A3 | A3 | B30 | B30 |
| Compound 357 | O | A3 | A3 | B38 | B38 |
| Compound 358 | O | A3 | A3 | B39 | B39 |
| Compound 359 | O | A3 | A3 | B40 | B40 |
| Compound 360 | O | A3 | A3 | B41 | B41 |
| Compound 361 | O | A3 | A3 | B43 | B43 |
| Compound 362 | O | A3 | A3 | B52 | B52 |
| Compound 363 | O | A3 | A3 | B56 | B56 |
| Compound 364 | O | A3 | A3 | B67 | B67 |
| Compound 365 | O | A3 | A3 | B68 | B68 |
| Compound 366 | O | A3 | A3 | B69 | B69 |
| Compound 367 | O | A3 | A3 | B70 | B70 |
| Compound 368 | O | A3 | A3 | B71 | B71 |
| Compound 369 | O | A3 | A3 | B72 | B72 |
| Compound 370 | O | A3 | A3 | B74 | B74 |
| Compound 371 | O | A3 | A3 | B79 | B79 |
| Compound 372 | O | A3 | A3 | B80 | B80 |
| Compound 373 | O | A3 | A3 | B82 | B82 |
| Compound 374 | O | A3 | A3 | B83 | B83 |
| Compound 375 | O | A3 | A3 | B86 | B86 |
| Compound 376 | O | A3 | A3 | B88 | B88 |
| Compound 377 | S | A3 | A3 | B1 | B1 |
| Compound 378 | S | A3 | A3 | B6 | B6 |
| Compound 379 | S | A3 | A3 | B10 | B10 |
| Compound 380 | S | A3 | A3 | B16 | B16 |
| Compound 381 | S | A3 | A3 | B25 | B25 |
| Compound 382 | S | A3 | A3 | B28 | B28 |
| Compound 383 | S | A3 | A3 | B29 | B29 |
| Compound 384 | S | A3 | A3 | B30 | B30 |
| Compound 385 | S | A3 | A3 | B38 | B38 |
| Compound 386 | S | A3 | A3 | B39 | B39 |
| Compound 387 | S | A3 | A3 | B40 | B40 |
| Compound 388 | S | A3 | A3 | B41 | B41 |
| Compound 389 | S | A3 | A3 | B43 | B43 |
| Compound 390 | S | A3 | A3 | B52 | B52 |
| Compound 391 | S | A3 | A3 | B56 | B56 |
| Compound 392 | S | A3 | A3 | B67 | B67 |
| Compound 393 | S | A3 | A3 | B68 | B68 |
| Compound 394 | S | A3 | A3 | B69 | B69 |
| Compound 395 | S | A3 | A3 | B70 | B70 |
| Compound 396 | S | A3 | A3 | B71 | B71 |
| Compound 397 | S | A3 | A3 | B72 | B72 |
| Compound 398 | S | A3 | A3 | B74 | B74 |
| Compound 399 | S | A3 | A3 | B79 | B79 |
| Compound 400 | S | A3 | A3 | B80 | B80 |
| Compound 401 | S | A3 | A3 | B82 | B82 |
| Compound 402 | S | A3 | A3 | B83 | B83 |
| Compound 403 | S | A3 | A3 | B86 | B86 |
| Compound 404 | S | A3 | A3 | B88 | B88 |
| Compound 405 | Se | A3 | A3 | B1 | B1 |
| Compound 406 | Se | A3 | A3 | B6 | B6 |
| Compound 407 | Se | A3 | A3 | B10 | B10 |
| Compound 408 | Se | A3 | A3 | B16 | B16 |
| Compound 409 | Se | A3 | A3 | B25 | B25 |
| Compound 410 | Se | A3 | A3 | B28 | B28 |
| Compound 411 | Se | A3 | A3 | B29 | B29 |
| Compound 412 | Se | A3 | A3 | B30 | B30 |
| Compound 413 | Se | A3 | A3 | B38 | B38 |
| Compound 414 | Se | A3 | A3 | B39 | B39 |
| Compound 415 | Se | A3 | A3 | B40 | B40 |
| Compound 416 | Se | A3 | A3 | B41 | B41 |
| Compound 417 | Se | A3 | A3 | B43 | B43 |
| Compound 418 | Se | A3 | A3 | B52 | B52 |
| Compound 419 | Se | A3 | A3 | B56 | B56 |
| Compound 420 | Se | A3 | A3 | B67 | B67 |
| Compound 421 | Se | A3 | A3 | B68 | B68 |
| Compound 422 | Se | A3 | A3 | B69 | B69 |
| Compound 423 | Se | A3 | A3 | B70 | B70 |
| Compound 424 | Se | A3 | A3 | B71 | B71 |
| Compound 425 | Se | A3 | A3 | B72 | B72 |
| Compound 426 | Se | A3 | A3 | B74 | B74 |
| Compound 427 | Se | A3 | A3 | B79 | B79 |
| Compound 428 | Se | A3 | A3 | B80 | B80 |
| Compound 429 | Se | A3 | A3 | B82 | B82 |
| Compound 430 | Se | A3 | A3 | B83 | B83 |
| Compound 431 | Se | A3 | A3 | B86 | B86 |
| Compound 432 | Se | A3 | A3 | B88 | B88 |
| Compound 433 | O | A4 | A4 | B1 | B1 |
| Compound 434 | O | A4 | A4 | B6 | B6 |
| Compound 435 | O | A4 | A4 | B10 | B10 |
| Compound 436 | O | A4 | A4 | B16 | B16 |
| Compound 437 | O | A4 | A4 | B25 | B25 |
| Compound 438 | O | A4 | A4 | B28 | B28 |
| Compound 439 | O | A4 | A4 | B29 | B29 |
| Compound 440 | O | A4 | A4 | B30 | B30 |
| Compound 441 | O | A4 | A4 | B38 | B38 |
| Compound 442 | O | A4 | A4 | B39 | B39 |
| Compound 443 | O | A4 | A4 | B40 | B40 |
| Compound 444 | O | A4 | A4 | B41 | B41 |
| Compound 445 | O | A4 | A4 | B43 | B43 |
| Compound 446 | O | A4 | A4 | B52 | B52 |
| Compound 447 | O | A4 | A4 | B56 | B56 |
| Compound 448 | O | A4 | A4 | B67 | B67 |
| Compound 449 | O | A4 | A4 | B68 | B68 |
| Compound 450 | O | A4 | A4 | B69 | B69 |
| Compound 451 | O | A4 | A4 | B70 | B70 |
| Compound 452 | O | A4 | A4 | B71 | B71 |
| Compound 453 | O | A4 | A4 | B72 | B72 |
| Compound 454 | O | A4 | A4 | B74 | B74 |
| Compound 455 | O | A4 | A4 | B79 | B79 |
| Compound 456 | O | A4 | A4 | B80 | B80 |
| Compound 457 | O | A4 | A4 | B82 | B82 |
| Compound 458 | O | A4 | A4 | B83 | B83 |
| Compound 459 | O | A4 | A4 | B86 | B86 |
| Compound 460 | O | A4 | A4 | B88 | B88 |
| Compound 461 | S | A4 | A4 | B1 | B1 |
| Compound 462 | S | A4 | A4 | B6 | B6 |
| Compound 463 | S | A4 | A4 | B10 | B10 |
| Compound 464 | S | A4 | A4 | B16 | B16 |

-continued

| No. | Z | X | Y | R | R |
|---|---|---|---|---|---|
| Compound 465 | S | A4 | A4 | B25 | B25 |
| Compound 466 | S | A4 | A4 | B28 | B28 |
| Compound 467 | S | A4 | A4 | B29 | B29 |
| Compound 468 | S | A4 | A4 | B30 | B30 |
| Compound 469 | S | A4 | A4 | B38 | B38 |
| Compound 470 | S | A4 | A4 | B39 | B39 |
| Compound 471 | S | A4 | A4 | B40 | B40 |
| Compound 472 | S | A4 | A4 | B41 | B41 |
| Compound 473 | S | A4 | A4 | B43 | B43 |
| Compound 474 | S | A4 | A4 | B52 | B52 |
| Compound 475 | S | A4 | A4 | B56 | B56 |
| Compound 476 | S | A4 | A4 | B67 | B67 |
| Compound 477 | S | A4 | A4 | B68 | B68 |
| Compound 478 | S | A4 | A4 | B69 | B69 |
| Compound 479 | S | A4 | A4 | B70 | B70 |
| Compound 480 | S | A4 | A4 | B71 | B71 |
| Compound 481 | S | A4 | A4 | B72 | B72 |
| Compound 482 | S | A4 | A4 | B74 | B74 |
| Compound 483 | S | A4 | A4 | B79 | B79 |
| Compound 484 | S | A4 | A4 | B80 | B80 |
| Compound 485 | S | A4 | A4 | B82 | B82 |
| Compound 486 | S | A4 | A4 | B83 | B83 |
| Compound 487 | S | A4 | A4 | B86 | B86 |
| Compound 488 | S | A4 | A4 | B88 | B88 |
| Compound 489 | Se | A4 | A4 | B1 | B1 |
| Compound 490 | Se | A4 | A4 | B6 | B6 |
| Compound 491 | Se | A4 | A4 | B10 | B10 |
| Compound 492 | Se | A4 | A4 | B16 | B16 |
| Compound 493 | Se | A4 | A4 | B25 | B25 |
| Compound 494 | Se | A4 | A4 | B28 | B28 |
| Compound 495 | Se | A4 | A4 | B29 | B29 |
| Compound 496 | Se | A4 | A4 | B30 | B30 |
| Compound 497 | Se | A4 | A4 | B38 | B38 |
| Compound 498 | Se | A4 | A4 | B39 | B39 |
| Compound 499 | Se | A4 | A4 | B40 | B40 |
| Compound 500 | Se | A4 | A4 | B41 | B41 |
| Compound 501 | Se | A4 | A4 | B43 | B43 |
| Compound 502 | Se | A4 | A4 | B52 | B52 |
| Compound 503 | Se | A4 | A4 | B56 | B56 |
| Compound 504 | Se | A4 | A4 | B67 | B67 |
| Compound 505 | Se | A4 | A4 | B68 | B68 |
| Compound 506 | Se | A4 | A4 | B69 | B69 |
| Compound 507 | Se | A4 | A4 | B70 | B70 |
| Compound 508 | Se | A4 | A4 | B71 | B71 |
| Compound 509 | Se | A4 | A4 | B72 | B72 |
| Compound 510 | Se | A4 | A4 | B74 | B74 |
| Compound 511 | Se | A4 | A4 | B79 | B79 |
| Compound 512 | Se | A4 | A4 | B80 | B80 |
| Compound 513 | Se | A4 | A4 | B82 | B82 |
| Compound 514 | Se | A4 | A4 | B83 | B83 |
| Compound 515 | Se | A4 | A4 | B86 | B86 |
| Compound 516 | Se | A4 | A4 | B88 | B88 |
| Compound 517 | O | A5 | A5 | B1 | B1 |
| Compound 518 | O | A5 | A5 | B6 | B6 |
| Compound 519 | O | A5 | A5 | B10 | B10 |
| Compound 520 | O | A5 | A5 | B16 | B16 |
| Compound 521 | O | A5 | A5 | B25 | B25 |
| Compound 522 | O | A5 | A5 | B28 | B28 |
| Compound 523 | O | A5 | A5 | B29 | B29 |
| Compound 524 | O | A5 | A5 | B30 | B30 |
| Compound 525 | O | A5 | A5 | B38 | B38 |
| Compound 526 | O | A5 | A5 | B39 | B39 |
| Compound 527 | O | A5 | A5 | B40 | B40 |
| Compound 528 | O | A5 | A5 | B41 | B41 |
| Compound 529 | O | A5 | A5 | B43 | B43 |
| Compound 530 | O | A5 | A5 | B52 | B52 |
| Compound 531 | O | A5 | A5 | B56 | B56 |
| Compound 532 | O | A5 | A5 | B67 | B67 |
| Compound 533 | O | A5 | A5 | B68 | B68 |
| Compound 534 | O | A5 | A5 | B69 | B69 |
| Compound 535 | O | A5 | A5 | B70 | B70 |
| Compound 536 | O | A5 | A5 | B71 | B71 |
| Compound 537 | O | A5 | A5 | B72 | B72 |
| Compound 538 | O | A5 | A5 | B74 | B74 |
| Compound 539 | O | A5 | A5 | B79 | B79 |
| Compound 540 | O | A5 | A5 | B80 | B80 |
| Compound 541 | O | A5 | A5 | B82 | B82 |
| Compound 542 | O | A5 | A5 | B83 | B83 |
| Compound 543 | O | A5 | A5 | B86 | B86 |
| Compound 544 | O | A5 | A5 | B88 | B88 |
| Compound 545 | S | A5 | A5 | B1 | B1 |
| Compound 546 | S | A5 | A5 | B6 | B6 |
| Compound 547 | S | A5 | A5 | B10 | B10 |
| Compound 548 | S | A5 | A5 | B16 | B16 |
| Compound 549 | S | A5 | A5 | B25 | B25 |
| Compound 550 | S | A5 | A5 | B28 | B28 |
| Compound 551 | S | A5 | A5 | B29 | B29 |
| Compound 552 | S | A5 | A5 | B30 | B30 |
| Compound 553 | S | A5 | A5 | B38 | B38 |
| Compound 554 | S | A5 | A5 | B39 | B39 |
| Compound 555 | S | A5 | A5 | B40 | B40 |
| Compound 556 | S | A5 | A5 | B41 | B41 |
| Compound 557 | S | A5 | A5 | B43 | B43 |
| Compound 558 | S | A5 | A5 | B52 | B52 |
| Compound 559 | S | A5 | A5 | B56 | B56 |
| Compound 560 | S | A5 | A5 | B67 | B67 |
| Compound 561 | S | A5 | A5 | B68 | B68 |
| Compound 562 | S | A5 | A5 | B69 | B69 |
| Compound 563 | S | A5 | A5 | B70 | B70 |
| Compound 564 | S | A5 | A5 | B71 | B71 |
| Compound 565 | S | A5 | A5 | B72 | B72 |
| Compound 566 | S | A5 | A5 | B74 | B74 |
| Compound 567 | S | A5 | A5 | B79 | B79 |
| Compound 568 | S | A5 | A5 | B80 | B80 |
| Compound 569 | S | A5 | A5 | B82 | B82 |
| Compound 570 | S | A5 | A5 | B83 | B83 |
| Compound 571 | S | A5 | A5 | B86 | B86 |
| Compound 572 | S | A5 | A5 | B88 | B88 |
| Compound 573 | Se | A5 | A5 | B1 | B1 |
| Compound 574 | Se | A5 | A5 | B6 | B6 |
| Compound 575 | Se | A5 | A5 | B10 | B10 |
| Compound 576 | Se | A5 | A5 | B16 | B16 |
| Compound 577 | Se | A5 | A5 | B25 | B25 |
| Compound 578 | Se | A5 | A5 | B28 | B28 |
| Compound 579 | Se | A5 | A5 | B29 | B29 |
| Compound 580 | Se | A5 | A5 | B30 | B30 |
| Compound 581 | Se | A5 | A5 | B38 | B38 |
| Compound 582 | Se | A5 | A5 | B39 | B39 |
| Compound 583 | Se | A5 | A5 | B40 | B40 |
| Compound 584 | Se | A5 | A5 | B41 | B41 |
| Compound 585 | Se | A5 | A5 | B43 | B43 |
| Compound 586 | Se | A5 | A5 | B52 | B52 |
| Compound 587 | Se | A5 | A5 | B56 | B56 |
| Compound 588 | Se | A5 | A5 | B67 | B67 |
| Compound 589 | Se | A5 | A5 | B68 | B68 |
| Compound 590 | Se | A5 | A5 | B69 | B69 |
| Compound 591 | Se | A5 | A5 | B70 | B70 |
| Compound 592 | Se | A5 | A5 | B71 | B71 |
| Compound 593 | Se | A5 | A5 | B72 | B72 |
| Compound 594 | Se | A5 | A5 | B74 | B74 |
| Compound 595 | Se | A5 | A5 | B79 | B79 |
| Compound 596 | Se | A5 | A5 | B80 | B80 |
| Compound 597 | Se | A5 | A5 | B82 | B82 |
| Compound 598 | Se | A5 | A5 | B83 | B83 |
| Compound 599 | Se | A5 | A5 | B86 | B86 |
| Compound 600 | Se | A5 | A5 | B88 | B88 |
| Compound 601 | O | A6 | A6 | B1 | B1 |
| Compound 602 | O | A6 | A6 | B6 | B6 |
| Compound 603 | O | A6 | A6 | B10 | B10 |
| Compound 604 | O | A6 | A6 | B16 | B16 |
| Compound 605 | O | A6 | A6 | B25 | B25 |
| Compound 606 | O | A6 | A6 | B28 | B28 |
| Compound 607 | O | A6 | A6 | B29 | B29 |
| Compound 608 | O | A6 | A6 | B30 | B30 |
| Compound 609 | O | A6 | A6 | B38 | B38 |
| Compound 610 | O | A6 | A6 | B39 | B39 |
| Compound 611 | O | A6 | A6 | B40 | B40 |
| Compound 612 | O | A6 | A6 | B41 | B41 |
| Compound 613 | O | A6 | A6 | B43 | B43 |
| Compound 614 | O | A6 | A6 | B52 | B52 |
| Compound 615 | O | A6 | A6 | B56 | B56 |
| Compound 616 | O | A6 | A6 | B67 | B67 |
| Compound 617 | O | A6 | A6 | B68 | B68 |
| Compound 618 | O | A6 | A6 | B69 | B69 |

-continued

| No. | Z | X | Y | R | R |
|---|---|---|---|---|---|
| Compound 619 | O | A6 | A6 | B70 | B70 |
| Compound 620 | O | A6 | A6 | B71 | B71 |
| Compound 621 | O | A6 | A6 | B72 | B72 |
| Compound 622 | O | A6 | A6 | B74 | B74 |
| Compound 623 | O | A6 | A6 | B79 | B79 |
| Compound 624 | O | A6 | A6 | B80 | B80 |
| Compound 625 | O | A6 | A6 | B82 | B82 |
| Compound 626 | O | A6 | A6 | B83 | B83 |
| Compound 627 | O | A6 | A6 | B86 | B86 |
| Compound 628 | O | A6 | A6 | B88 | B88 |
| Compound 629 | S | A6 | A6 | B1 | B1 |
| Compound 630 | S | A6 | A6 | B6 | B6 |
| Compound 631 | S | A6 | A6 | B10 | B10 |
| Compound 632 | S | A6 | A6 | B16 | B16 |
| Compound 633 | S | A6 | A6 | B25 | B25 |
| Compound 634 | S | A6 | A6 | B28 | B28 |
| Compound 635 | S | A6 | A6 | B29 | B29 |
| Compound 636 | S | A6 | A6 | B30 | B30 |
| Compound 637 | S | A6 | A6 | B38 | B38 |
| Compound 638 | S | A6 | A6 | B39 | B39 |
| Compound 639 | S | A6 | A6 | B40 | B40 |
| Compound 640 | S | A6 | A6 | B41 | B41 |
| Compound 641 | S | A6 | A6 | B43 | B43 |
| Compound 642 | S | A6 | A6 | B52 | B52 |
| Compound 643 | S | A6 | A6 | B56 | B56 |
| Compound 644 | S | A6 | A6 | B67 | B67 |
| Compound 645 | S | A6 | A6 | B68 | B68 |
| Compound 646 | S | A6 | A6 | B69 | B69 |
| Compound 647 | S | A6 | A6 | B70 | B70 |
| Compound 648 | S | A6 | A6 | B71 | B71 |
| Compound 649 | S | A6 | A6 | B72 | B72 |
| Compound 650 | S | A6 | A6 | B74 | B74 |
| Compound 651 | S | A6 | A6 | B79 | B79 |
| Compound 652 | S | A6 | A6 | B80 | B80 |
| Compound 653 | S | A6 | A6 | B82 | B82 |
| Compound 654 | S | A6 | A6 | B83 | B83 |
| Compound 655 | S | A6 | A6 | B86 | B86 |
| Compound 656 | S | A6 | A6 | B88 | B88 |
| Compound 657 | Se | A6 | A6 | B1 | B1 |
| Compound 658 | Se | A6 | A6 | B6 | B6 |
| Compound 659 | Se | A6 | A6 | B10 | B10 |
| Compound 660 | Se | A6 | A6 | B16 | B16 |
| Compound 661 | Se | A6 | A6 | B25 | B25 |
| Compound 662 | Se | A6 | A6 | B28 | B28 |
| Compound 663 | Se | A6 | A6 | B29 | B29 |
| Compound 664 | Se | A6 | A6 | B30 | B30 |
| Compound 665 | Se | A6 | A6 | B38 | B38 |
| Compound 666 | Se | A6 | A6 | B39 | B39 |
| Compound 667 | Se | A6 | A6 | B40 | B40 |
| Compound 668 | Se | A6 | A6 | B41 | B41 |
| Compound 669 | Se | A6 | A6 | B43 | B43 |
| Compound 670 | Se | A6 | A6 | B52 | B52 |
| Compound 671 | Se | A6 | A6 | B56 | B56 |
| Compound 672 | Se | A6 | A6 | B67 | B67 |
| Compound 673 | Se | A6 | A6 | B68 | B68 |
| Compound 674 | Se | A6 | A6 | B69 | B69 |
| Compound 675 | Se | A6 | A6 | B70 | B70 |
| Compound 676 | Se | A6 | A6 | B71 | B71 |
| Compound 677 | Se | A6 | A6 | B72 | B72 |
| Compound 678 | Se | A6 | A6 | B74 | B74 |
| Compound 679 | Se | A6 | A6 | B79 | B79 |
| Compound 680 | Se | A6 | A6 | B80 | B80 |
| Compound 681 | Se | A6 | A6 | B82 | B82 |
| Compound 682 | Se | A6 | A6 | B83 | B83 |
| Compound 683 | Se | A6 | A6 | B86 | B86 |
| Compound 684 | Se | A6 | A6 | B88 | B88 |
| Compound 685 | O | A7 | A7 | B1 | B1 |
| Compound 686 | O | A7 | A7 | B6 | B6 |
| Compound 687 | O | A7 | A7 | B10 | B10 |
| Compound 688 | O | A7 | A7 | B16 | B16 |
| Compound 689 | O | A7 | A7 | B25 | B25 |
| Compound 690 | O | A7 | A7 | B28 | B28 |
| Compound 691 | O | A7 | A7 | B29 | B29 |
| Compound 692 | O | A7 | A7 | B30 | B30 |
| Compound 693 | O | A7 | A7 | B38 | B38 |
| Compound 694 | O | A7 | A7 | B39 | B39 |
| Compound 695 | O | A7 | A7 | B40 | B40 |
| Compound 696 | O | A7 | A7 | B41 | B41 |
| Compound 697 | O | A7 | A7 | B43 | B43 |
| Compound 698 | O | A7 | A7 | B52 | B52 |
| Compound 699 | O | A7 | A7 | B56 | B56 |
| Compound 700 | O | A7 | A7 | B67 | B67 |
| Compound 701 | O | A7 | A7 | B68 | B68 |
| Compound 702 | O | A7 | A7 | B69 | B69 |
| Compound 703 | O | A7 | A7 | B70 | B70 |
| Compound 704 | O | A7 | A7 | B71 | B71 |
| Compound 705 | O | A7 | A7 | B72 | B72 |
| Compound 706 | O | A7 | A7 | B74 | B74 |
| Compound 707 | O | A7 | A7 | B79 | B79 |
| Compound 708 | O | A7 | A7 | B80 | B80 |
| Compound 709 | O | A7 | A7 | B82 | B82 |
| Compound 710 | O | A7 | A7 | B83 | B83 |
| Compound 711 | O | A7 | A7 | B86 | B86 |
| Compound 712 | O | A7 | A7 | B88 | B88 |
| Compound 713 | S | A7 | A7 | B1 | B1 |
| Compound 714 | S | A7 | A7 | B6 | B6 |
| Compound 715 | S | A7 | A7 | B10 | B10 |
| Compound 716 | S | A7 | A7 | B16 | B16 |
| Compound 717 | S | A7 | A7 | B25 | B25 |
| Compound 718 | S | A7 | A7 | B28 | B28 |
| Compound 719 | S | A7 | A7 | B29 | B29 |
| Compound 720 | S | A7 | A7 | B30 | B30 |
| Compound 721 | S | A7 | A7 | B38 | B38 |
| Compound 722 | S | A7 | A7 | B39 | B39 |
| Compound 723 | S | A7 | A7 | B40 | B40 |
| Compound 724 | S | A7 | A7 | B41 | B41 |
| Compound 725 | S | A7 | A7 | B43 | B43 |
| Compound 726 | S | A7 | A7 | B52 | B52 |
| Compound 727 | S | A7 | A7 | B56 | B56 |
| Compound 728 | S | A7 | A7 | B67 | B67 |
| Compound 729 | S | A7 | A7 | B68 | B68 |
| Compound 730 | S | A7 | A7 | B69 | B69 |
| Compound 731 | S | A7 | A7 | B70 | B70 |
| Compound 732 | S | A7 | A7 | B71 | B71 |
| Compound 733 | S | A7 | A7 | B72 | B72 |
| Compound 734 | S | A7 | A7 | B74 | B74 |
| Compound 735 | S | A7 | A7 | B79 | B79 |
| Compound 736 | S | A7 | A7 | B80 | B80 |
| Compound 737 | S | A7 | A7 | B82 | B82 |
| Compound 738 | S | A7 | A7 | B83 | B83 |
| Compound 739 | S | A7 | A7 | B86 | B86 |
| Compound 740 | S | A7 | A7 | B88 | B88 |
| Compound 741 | Se | A7 | A7 | B1 | B1 |
| Compound 742 | Se | A7 | A7 | B6 | B6 |
| Compound 743 | Se | A7 | A7 | B10 | B10 |
| Compound 744 | Se | A7 | A7 | B16 | B16 |
| Compound 745 | Se | A7 | A7 | B25 | B25 |
| Compound 746 | Se | A7 | A7 | B28 | B28 |
| Compound 747 | Se | A7 | A7 | B29 | B29 |
| Compound 748 | Se | A7 | A7 | B30 | B30 |
| Compound 749 | Se | A7 | A7 | B38 | B38 |
| Compound 750 | Se | A7 | A7 | B39 | B39 |
| Compound 751 | Se | A7 | A7 | B40 | B40 |
| Compound 752 | Se | A7 | A7 | B41 | B41 |
| Compound 753 | Se | A7 | A7 | B43 | B43 |
| Compound 754 | Se | A7 | A7 | B52 | B52 |
| Compound 755 | Se | A7 | A7 | B56 | B56 |
| Compound 756 | Se | A7 | A7 | B67 | B67 |
| Compound 757 | Se | A7 | A7 | B68 | B68 |
| Compound 758 | Se | A7 | A7 | B69 | B69 |
| Compound 759 | Se | A7 | A7 | B70 | B70 |
| Compound 760 | Se | A7 | A7 | B71 | B71 |
| Compound 761 | Se | A7 | A7 | B72 | B72 |
| Compound 762 | Se | A7 | A7 | B74 | B74 |
| Compound 763 | Se | A7 | A7 | B79 | B79 |
| Compound 764 | Se | A7 | A7 | B80 | B80 |
| Compound 765 | Se | A7 | A7 | B82 | B82 |
| Compound 766 | Se | A7 | A7 | B83 | B83 |
| Compound 767 | Se | A7 | A7 | B86 | B86 |
| Compound 768 | Se | A7 | A7 | B88 | B88 |
| Compound 769 | O | O | O | B1 | B1 |
| Compound 770 | O | O | O | B6 | B6 |
| Compound 771 | O | O | O | B10 | B10 |
| Compound 772 | O | O | O | B22 | B22 |

| No. | Z | X | Y | R | R |
|---|---|---|---|---|---|
| Compound 773 | O | O | O | B25 | B25 |
| Compound 774 | O | O | O | B28 | B28 |
| Compound 775 | O | O | O | B29 | B29 |
| Compound 776 | O | O | O | B30 | B30 |
| Compound 777 | O | O | O | B38 | B38 |
| Compound 778 | O | O | O | B39 | B39 |
| Compound 779 | O | O | O | B40 | B40 |
| Compound 780 | O | O | O | B41 | B41 |
| Compound 781 | O | O | O | B43 | B43 |
| Compound 782 | O | O | O | B52 | B52 |
| Compound 783 | O | O | O | B56 | B56 |
| Compound 784 | O | O | O | B67 | B67 |
| Compound 785 | O | O | O | B68 | B68 |
| Compound 786 | O | O | O | B69 | B69 |
| Compound 787 | O | O | O | B70 | B70 |
| Compound 788 | O | O | O | B71 | B71 |
| Compound 789 | O | O | O | B72 | B72 |
| Compound 790 | O | O | O | B74 | B74 |
| Compound 791 | O | O | O | B79 | B79 |
| Compound 792 | O | O | O | B80 | B80 |
| Compound 793 | O | O | O | B82 | B82 |
| Compound 794 | O | O | O | B83 | B83 |
| Compound 795 | O | O | O | B86 | B86 |
| Compound 796 | O | O | O | B88 | B88 |
| Compound 797 | S | O | O | B1 | B1 |
| Compound 798 | S | O | O | B6 | B6 |
| Compound 799 | S | O | O | B10 | B10 |
| Compound 800 | S | O | O | B22 | B22 |
| Compound 801 | S | O | O | B25 | B25 |
| Compound 802 | S | O | O | B28 | B28 |
| Compound 803 | S | O | O | B29 | B29 |
| Compound 804 | S | O | O | B30 | B30 |
| Compound 805 | S | O | O | B38 | B38 |
| Compound 806 | S | O | O | B39 | B39 |
| Compound 807 | S | O | O | B40 | B40 |
| Compound 808 | S | O | O | B41 | B41 |
| Compound 809 | S | O | O | B43 | B43 |
| Compound 810 | S | O | O | B52 | B52 |
| Compound 811 | S | O | O | B56 | B56 |
| Compound 812 | S | O | O | B67 | B67 |
| Compound 813 | S | O | O | B68 | B68 |
| Compound 814 | S | O | O | B69 | B69 |
| Compound 815 | S | O | O | B70 | B70 |
| Compound 816 | S | O | O | B71 | B71 |
| Compound 817 | S | O | O | B72 | B72 |
| Compound 818 | S | O | O | B74 | B74 |
| Compound 819 | S | O | O | B79 | B79 |
| Compound 820 | S | O | O | B80 | B80 |
| Compound 821 | S | O | O | B82 | B82 |
| Compound 822 | S | O | O | B83 | B83 |
| Compound 823 | S | O | O | B86 | B86 |
| Compound 824 | S | O | O | B88 | B88 |
| Compound 825 | Se | O | O | B1 | B1 |
| Compound 826 | Se | O | O | B6 | B6 |
| Compound 827 | Se | O | O | B10 | B10 |
| Compound 828 | Se | O | O | B22 | B22 |
| Compound 829 | Se | O | O | B25 | B25 |
| Compound 830 | Se | O | O | B28 | B28 |
| Compound 831 | Se | O | O | B29 | B29 |
| Compound 832 | Se | O | O | B30 | B30 |
| Compound 833 | Se | O | O | B38 | B38 |
| Compound 834 | Se | O | O | B39 | B39 |
| Compound 835 | Se | O | O | B40 | B40 |
| Compound 836 | Se | O | O | B41 | B41 |
| Compound 837 | Se | O | O | B43 | B43 |
| Compound 838 | Se | O | O | B52 | B52 |
| Compound 839 | Se | O | O | B56 | B56 |
| Compound 840 | Se | O | O | B67 | B67 |
| Compound 841 | Se | O | O | B68 | B68 |
| Compound 842 | Se | O | O | B69 | B69 |
| Compound 843 | Se | O | O | B70 | B70 |
| Compound 844 | Se | O | O | B71 | B71 |
| Compound 845 | Se | O | O | B72 | B72 |
| Compound 846 | Se | O | O | B74 | B74 |
| Compound 847 | Se | O | O | B79 | B79 |
| Compound 848 | Se | O | O | B80 | B80 |
| Compound 849 | Se | O | O | B82 | B82 |
| Compound 850 | Se | O | O | B83 | B83 |
| Compound 851 | Se | O | O | B86 | B86 |
| Compound 852 | Se | O | O | B88 | B88 |
| Compound 853 | O | S | S | B1 | B1 |
| Compound 854 | O | O | O | B6 | B6 |
| Compound 855 | O | S | S | B10 | B10 |
| Compound 856 | O | S | S | B22 | B22 |
| Compound 857 | O | S | S | B25 | B25 |
| Compound 858 | O | S | S | B28 | B28 |
| Compound 859 | O | S | S | B29 | B29 |
| Compound 860 | O | S | S | B30 | B30 |
| Compound 861 | O | S | S | B38 | B38 |
| Compound 862 | O | S | S | B39 | B39 |
| Compound 863 | O | S | S | B40 | B40 |
| Compound 864 | O | S | S | B41 | B41 |
| Compound 865 | O | S | S | B43 | B43 |
| Compound 866 | O | S | S | B52 | B52 |
| Compound 867 | O | S | S | B56 | B56 |
| Compound 868 | O | S | S | B67 | B67 |
| Compound 869 | O | S | S | B68 | B68 |
| Compound 870 | O | S | S | B69 | B69 |
| Compound 871 | O | S | S | B70 | B70 |
| Compound 872 | O | S | S | B71 | B71 |
| Compound 873 | O | S | S | B72 | B72 |
| Compound 874 | O | S | S | B74 | B74 |
| Compound 875 | O | S | S | B79 | B79 |
| Compound 876 | O | S | S | B80 | B80 |
| Compound 877 | O | S | S | B82 | B82 |
| Compound 878 | O | S | S | B83 | B83 |
| Compound 879 | O | S | S | B86 | B86 |
| Compound 880 | O | S | S | B88 | B88 |
| Compound 881 | S | S | S | B1 | B1 |
| Compound 882 | S | S | S | B6 | B6 |
| Compound 883 | S | S | S | B10 | B10 |
| Compound 884 | S | S | S | B22 | B22 |
| Compound 885 | S | S | S | B25 | B25 |
| Compound 886 | S | S | S | B28 | B28 |
| Compound 887 | S | S | S | B29 | B29 |
| Compound 888 | S | S | S | B30 | B30 |
| Compound 889 | S | S | S | B38 | B38 |
| Compound 890 | S | S | S | B39 | B39 |
| Compound 891 | S | S | S | B40 | B40 |
| Compound 892 | S | S | S | B41 | B41 |
| Compound 893 | S | S | S | B43 | B43 |
| Compound 894 | S | S | S | B52 | B52 |
| Compound 895 | S | S | S | B56 | B56 |
| Compound 896 | S | S | S | B67 | B67 |
| Compound 897 | S | S | S | B68 | B68 |
| Compound 898 | S | S | S | B69 | B69 |
| Compound 899 | S | S | S | B70 | B70 |
| Compound 900 | S | S | S | B71 | B71 |
| Compound 901 | S | S | S | B72 | B72 |
| Compound 902 | S | S | S | B74 | B74 |
| Compound 903 | S | S | S | B79 | B79 |
| Compound 904 | S | S | S | B80 | B80 |
| Compound 905 | S | S | S | B82 | B82 |
| Compound 906 | S | S | S | B83 | B83 |
| Compound 907 | S | S | S | B86 | B86 |
| Compound 908 | S | S | S | B88 | B88 |
| Compound 909 | Se | S | S | B1 | B1 |
| Compound 910 | Se | S | S | B6 | B6 |
| Compound 911 | Se | S | S | B10 | B10 |
| Compound 912 | Se | S | S | B22 | B22 |
| Compound 913 | Se | S | S | B25 | B25 |
| Compound 914 | Se | S | S | B28 | B28 |
| Compound 915 | Se | S | S | B29 | B29 |
| Compound 916 | Se | S | S | B30 | B30 |
| Compound 917 | Se | S | S | B38 | B38 |
| Compound 918 | Se | S | S | B39 | B39 |
| Compound 919 | Se | S | S | B40 | B40 |
| Compound 920 | Se | S | S | B41 | B41 |
| Compound 921 | Se | S | S | B43 | B43 |
| Compound 922 | Se | S | S | B52 | B52 |
| Compound 923 | Se | S | S | B56 | B56 |
| Compound 924 | Se | S | S | B67 | B67 |
| Compound 925 | Se | S | S | B68 | B68 |
| Compound 926 | Se | S | S | B69 | B69 |

| No. | Z | X | Y | R | R |
|---|---|---|---|---|---|
| Compound 927 | Se | S | S | B70 | B70 |
| Compound 928 | Se | S | S | B71 | B71 |
| Compound 929 | Se | S | S | B72 | B72 |
| Compound 930 | Se | S | S | B74 | B74 |
| Compound 931 | Se | S | S | B79 | B79 |
| Compound 932 | Se | S | S | B80 | B80 |
| Compound 933 | Se | S | S | B82 | B82 |
| Compound 934 | Se | S | S | B83 | B83 |
| Compound 935 | Se | S | S | B86 | B86 |
| Compound 936 | Se | S | S | B88 | B88 |
| Compound 937 | O | Se | Se | B1 | B1 |
| Compound 938 | O | Se | Se | B6 | B6 |
| Compound 939 | O | Se | Se | B10 | B10 |
| Compound 940 | O | Se | Se | B22 | B22 |
| Compound 941 | O | Se | Se | B25 | B25 |
| Compound 942 | O | Se | Se | B28 | B28 |
| Compound 943 | O | Se | Se | B29 | B29 |
| Compound 944 | O | Se | Se | B30 | B30 |
| Compound 945 | O | Se | Se | B38 | B38 |
| Compound 946 | O | Se | Se | B39 | B39 |
| Compound 947 | O | Se | Se | B40 | B40 |
| Compound 948 | O | Se | Se | B41 | B41 |
| Compound 949 | O | Se | Se | B43 | B43 |
| Compound 950 | O | Se | Se | B52 | B52 |
| Compound 951 | O | Se | Se | B56 | B56 |
| Compound 952 | O | Se | Se | B67 | B67 |
| Compound 953 | O | Se | Se | B68 | B68 |
| Compound 954 | O | Se | Se | B69 | B69 |
| Compound 955 | O | Se | Se | B70 | B70 |
| Compound 956 | O | Se | Se | B71 | B71 |
| Compound 957 | O | Se | Se | B72 | B72 |
| Compound 958 | O | Se | Se | B74 | B74 |
| Compound 959 | O | Se | Se | B79 | B79 |
| Compound 960 | O | Se | Se | B80 | B80 |
| Compound 961 | O | Se | Se | B82 | B82 |
| Compound 962 | O | Se | Se | B83 | B83 |
| Compound 963 | O | Se | Se | B86 | B86 |
| Compound 964 | O | Se | Se | B88 | B88 |
| Compound 965 | S | Se | Se | B1 | B1 |
| Compound 966 | S | Se | Se | B6 | B6 |
| Compound 967 | S | Se | Se | B10 | B10 |
| Compound 968 | S | Se | Se | B22 | B22 |
| Compound 969 | S | Se | Se | B25 | B25 |
| Compound 970 | S | Se | Se | B28 | B28 |
| Compound 971 | S | Se | Se | B29 | B29 |
| Compound 972 | S | Se | Se | B30 | B30 |
| Compound 973 | S | Se | Se | B38 | B38 |
| Compound 974 | S | Se | Se | B39 | B39 |
| Compound 975 | S | Se | Se | B40 | B40 |
| Compound 976 | S | Se | Se | B41 | B41 |
| Compound 977 | S | Se | Se | B43 | B43 |
| Compound 978 | S | Se | Se | B52 | B52 |
| Compound 979 | S | Se | Se | B56 | B56 |
| Compound 980 | S | Se | Se | B67 | B67 |
| Compound 981 | S | Se | Se | B68 | B68 |
| Compound 982 | S | Se | Se | B69 | B69 |
| Compound 983 | S | Se | Se | B70 | B70 |
| Compound 984 | S | Se | Se | B71 | B71 |
| Compound 985 | S | Se | Se | B72 | B72 |
| Compound 986 | S | Se | Se | B74 | B74 |
| Compound 987 | S | Se | Se | B79 | B79 |
| Compound 988 | S | Se | Se | B80 | B80 |
| Compound 989 | S | Se | Se | B82 | B82 |
| Compound 990 | S | Se | Se | B83 | B83 |
| Compound 991 | S | Se | Se | B86 | B86 |
| Compound 992 | S | Se | Se | B88 | B88 |
| Compound 993 | Se | Se | Se | B1 | B1 |
| Compound 994 | Se | Se | Se | B6 | B6 |
| Compound 995 | Se | Se | Se | B10 | B10 |
| Compound 996 | Se | Se | Se | B22 | B22 |
| Compound 997 | Se | Se | Se | B25 | B25 |
| Compound 998 | Se | Se | Se | B28 | B28 |
| Compound 999 | Se | Se | Se | B29 | B29 |
| Compound 1000 | Se | Se | Se | B30 | B30 |
| Compound 1001 | Se | Se | Se | B38 | B38 |
| Compound 1002 | Se | Se | Se | B39 | B39 |
| Compound 1003 | Se | Se | Se | B40 | B40 |
| Compound 1004 | Se | Se | Se | B41 | B41 |
| Compound 1005 | Se | Se | Se | B43 | B43 |
| Compound 1006 | Se | Se | Se | B52 | B52 |
| Compound 1007 | Se | Se | Se | B56 | B56 |
| Compound 1008 | Se | Se | Se | B67 | B67 |
| Compound 1009 | Se | Se | Se | B68 | B68 |
| Compound 1010 | Se | Se | Se | B69 | B69 |
| Compound 1011 | Se | Se | Se | B70 | B70 |
| Compound 1012 | Se | Se | Se | B71 | B71 |
| Compound 1013 | Se | Se | Se | B72 | B72 |
| Compound 1014 | Se | Se | Se | B74 | B74 |
| Compound 1015 | Se | Se | Se | B79 | B79 |
| Compound 1016 | Se | Se | Se | B80 | B80 |
| Compound 1017 | Se | Se | Se | B82 | B82 |
| Compound 1018 | Se | Se | Se | B83 | B83 |
| Compound 1019 | Se | Se | Se | B86 | B86 |
| Compound 1020 | Se | Se | Se | B88 | B88 |
| Compound 1021 | O | A1 | A1 | B1 | B6 |
| Compound 1022 | O | A1 | A1 | B2 | B6 |
| Compound 1023 | O | A1 | A1 | B25 | B26 |
| Compound 1024 | O | A1 | A1 | B27 | B28 |
| Compound 1025 | O | A1 | A1 | B29 | B30 |
| Compound 1026 | O | A1 | A1 | B39 | B40 |
| Compound 1027 | O | A1 | A1 | B54 | B41 |
| Compound 1028 | O | A1 | A1 | B54 | B52 |
| Compound 1029 | O | A1 | A1 | B52 | B56 |
| Compound 1030 | O | A1 | A1 | B55 | B56 |
| Compound 1031 | O | A1 | A1 | B64 | B56 |
| Compound 1032 | O | A1 | A1 | B68 | B69 |
| Compound 1033 | O | A1 | A1 | B69 | B70 |
| Compound 1034 | O | A1 | A1 | B71 | B72 |
| Compound 1035 | O | A1 | A1 | B68 | B80 |
| Compound 1036 | O | A1 | A1 | B68 | B83 |
| Compound 1037 | S | A1 | A1 | B1 | B6 |
| Compound 1038 | S | A1 | A1 | B2 | B6 |
| Compound 1039 | S | A1 | A1 | B25 | B26 |
| Compound 1040 | S | A1 | A1 | B27 | B28 |
| Compound 1041 | S | A1 | A1 | B29 | B30 |
| Compound 1042 | S | A1 | A1 | B39 | B40 |
| Compound 1043 | S | A1 | A1 | B54 | B41 |
| Compound 1044 | S | A1 | A1 | B54 | B52 |
| Compound 1045 | S | A1 | A1 | B52 | B56 |
| Compound 1046 | S | A1 | A1 | B55 | B56 |
| Compound 1047 | S | A1 | A1 | B64 | B56 |
| Compound 1048 | S | A1 | A1 | B68 | B69 |
| Compound 1049 | S | A1 | A1 | B69 | B70 |
| Compound 1050 | S | A1 | A1 | B71 | B72 |
| Compound 1051 | S | A1 | A1 | B68 | B80 |
| Compound 1052 | S | A1 | A1 | B68 | B83 |
| Compound 1053 | Se | A1 | A1 | B1 | B6 |
| Compound 1054 | Se | A1 | A1 | B2 | B6 |
| Compound 1055 | Se | A1 | A1 | B25 | B26 |
| Compound 1056 | Se | A1 | A1 | B27 | B28 |
| Compound 1057 | Se | A1 | A1 | B29 | B30 |
| Compound 1058 | Se | A1 | A1 | B39 | B40 |
| Compound 1059 | Se | A1 | A1 | B54 | B41 |
| Compound 1060 | Se | A1 | A1 | B54 | B52 |
| Compound 1061 | Se | A1 | A1 | B52 | B56 |
| Compound 1062 | Se | A1 | A1 | B55 | B56 |
| Compound 1063 | Se | A1 | A1 | B64 | B56 |
| Compound 1064 | Se | A1 | A1 | B68 | B69 |
| Compound 1065 | Se | A1 | A1 | B69 | B70 |
| Compound 1066 | Se | A1 | A1 | B71 | B72 |
| Compound 1067 | Se | A1 | A1 | B68 | B80 |
| Compound 1068 | Se | A1 | A1 | B68 | B83 |
| Compound 1069 | O | A2 | A2 | B1 | B6 |
| Compound 1070 | O | A2 | A2 | B2 | B6 |
| Compound 1071 | O | A2 | A2 | B25 | B26 |
| Compound 1072 | O | A2 | A2 | B27 | B28 |
| Compound 1073 | O | A2 | A2 | B29 | B30 |
| Compound 1074 | O | A2 | A2 | B39 | B40 |
| Compound 1075 | O | A2 | A2 | B54 | B41 |
| Compound 1076 | O | A2 | A2 | B54 | B52 |
| Compound 1077 | O | A2 | A2 | B52 | B56 |
| Compound 1078 | O | A2 | A2 | B55 | B56 |
| Compound 1079 | O | A2 | A2 | B64 | B56 |
| Compound 1080 | O | A2 | A2 | B68 | B69 |

| No. | Z | X | Y | R | R |
|---|---|---|---|---|---|
| Compound 1081 | O | A2 | A2 | B69 | B70 |
| Compound 1082 | O | A2 | A2 | B71 | B72 |
| Compound 1083 | O | A2 | A2 | B68 | B80 |
| Compound 1084 | O | A2 | A2 | B68 | B83 |
| Compound 1085 | S | A2 | A2 | B1 | B6 |
| Compound 1086 | S | A2 | A2 | B2 | B6 |
| Compound 1087 | S | A2 | A2 | B25 | B26 |
| Compound 1088 | S | A2 | A2 | B27 | B28 |
| Compound 1089 | S | A2 | A2 | B29 | B30 |
| Compound 1090 | S | A2 | A2 | B39 | B40 |
| Compound 1091 | S | A2 | A2 | B54 | B41 |
| Compound 1092 | S | A2 | A2 | B54 | B52 |
| Compound 1093 | S | A2 | A2 | B52 | B56 |
| Compound 1094 | S | A2 | A2 | B55 | B56 |
| Compound 1095 | S | A2 | A2 | B64 | B56 |
| Compound 1096 | S | A2 | A2 | B68 | B69 |
| Compound 1097 | S | A2 | A2 | B69 | B70 |
| Compound 1098 | S | A2 | A2 | B71 | B72 |
| Compound 1099 | S | A2 | A2 | B68 | B80 |
| Compound 1100 | S | A2 | A2 | B68 | B83 |
| Compound 1101 | Se | A2 | A2 | B1 | B6 |
| Compound 1102 | Se | A2 | A2 | B2 | B6 |
| Compound 1103 | Se | A2 | A2 | B25 | B26 |
| Compound 1104 | Se | A2 | A2 | B27 | B28 |
| Compound 1105 | Se | A2 | A2 | B29 | B30 |
| Compound 1106 | Se | A2 | A2 | B39 | B40 |
| Compound 1107 | Se | A2 | A2 | B54 | B41 |
| Compound 1108 | Se | A2 | A2 | B54 | B52 |
| Compound 1109 | Se | A2 | A2 | B52 | B56 |
| Compound 1110 | Se | A2 | A2 | B55 | B56 |
| Compound 1111 | Se | A2 | A2 | B64 | B56 |
| Compound 1112 | Se | A2 | A2 | B68 | B69 |
| Compound 1113 | Se | A2 | A2 | B69 | B70 |
| Compound 1114 | Se | A2 | A2 | B71 | B72 |
| Compound 1115 | Se | A2 | A2 | B68 | B80 |
| Compound 1116 | Se | A2 | A2 | B68 | B83 |
| Compound 1117 | O | A3 | A3 | B1 | B1 |
| Compound 1118 | O | A3 | A3 | B6 | B6 |
| Compound 1119 | O | A3 | A3 | B25 | B25 |
| Compound 1120 | O | A3 | A3 | B28 | B28 |
| Compound 1121 | O | A3 | A3 | B29 | B29 |
| Compound 1122 | O | A3 | A3 | B30 | B30 |
| Compound 1123 | O | A3 | A3 | B56 | B56 |
| Compound 1124 | O | A3 | A3 | B67 | B67 |
| Compound 1125 | O | A3 | A3 | B68 | B68 |
| Compound 1126 | O | A3 | A3 | B69 | B69 |
| Compound 1127 | O | A3 | A3 | B70 | B70 |
| Compound 1128 | O | A3 | A3 | B71 | B71 |
| Compound 1129 | O | A3 | A3 | B72 | B72 |
| Compound 1130 | O | A3 | A3 | B74 | B74 |
| Compound 1131 | O | A3 | A3 | B80 | B80 |
| Compound 1132 | O | A3 | A3 | B83 | B83 |
| Compound 1133 | S | A3 | A3 | B1 | B1 |
| Compound 1134 | S | A3 | A3 | B6 | B6 |
| Compound 1135 | S | A3 | A3 | B25 | B25 |
| Compound 1136 | S | A3 | A3 | B28 | B28 |
| Compound 1137 | S | A3 | A3 | B29 | B29 |
| Compound 1138 | S | A3 | A3 | B30 | B30 |
| Compound 1139 | S | A3 | A3 | B56 | B56 |
| Compound 1140 | S | A3 | A3 | B67 | B67 |
| Compound 1141 | S | A3 | A3 | B68 | B68 |
| Compound 1142 | S | A3 | A3 | B69 | B69 |
| Compound 1143 | S | A3 | A3 | B70 | B70 |
| Compound 1144 | S | A3 | A3 | B71 | B71 |
| Compound 1145 | S | A3 | A3 | B72 | B72 |
| Compound 1146 | S | A3 | A3 | B74 | B74 |
| Compound 1147 | S | A3 | A3 | B80 | B80 |
| Compound 1148 | S | A3 | A3 | B83 | B83 |
| Compound 1149 | Se | A3 | A3 | B1 | B1 |
| Compound 1150 | Se | A3 | A3 | B6 | B6 |
| Compound 1151 | Se | A3 | A3 | B25 | B25 |
| Compound 1152 | Se | A3 | A3 | B28 | B28 |
| Compound 1153 | Se | A3 | A3 | B29 | B29 |
| Compound 1154 | Se | A3 | A3 | B30 | B30 |
| Compound 1155 | Se | A3 | A3 | B56 | B56 |
| Compound 1156 | Se | A3 | A3 | B67 | B67 |
| Compound 1157 | Se | A3 | A3 | B68 | B68 |
| Compound 1158 | Se | A3 | A3 | B69 | B69 |
| Compound 1159 | Se | A3 | A3 | B70 | B70 |
| Compound 1160 | Se | A3 | A3 | B71 | B71 |
| Compound 1161 | Se | A3 | A3 | B72 | B72 |
| Compound 1162 | Se | A3 | A3 | B74 | B74 |
| Compound 1163 | Se | A3 | A3 | B80 | B80 |
| Compound 1164 | Se | A3 | A3 | B83 | B83 |
| Compound 1165 | O | O | A1 | B1 | B1 |
| Compound 1166 | O | O | A1 | B6 | B6 |
| Compound 1167 | O | O | A1 | B25 | B25 |
| Compound 1168 | O | O | A1 | B28 | B28 |
| Compound 1169 | O | O | A1 | B29 | B29 |
| Compound 1170 | O | O | A1 | B30 | B30 |
| Compound 1171 | O | O | A1 | B56 | B56 |
| Compound 1172 | O | O | A1 | B67 | B67 |
| Compound 1173 | O | O | A1 | B68 | B68 |
| Compound 1174 | O | O | A1 | B69 | B69 |
| Compound 1175 | O | O | A1 | B70 | B70 |
| Compound 1176 | O | O | A1 | B71 | B71 |
| Compound 1177 | O | O | A1 | B72 | B72 |
| Compound 1178 | O | O | A1 | B74 | B74 |
| Compound 1179 | O | O | A1 | B80 | B80 |
| Compound 1180 | O | O | A1 | B83 | B83 |
| Compound 1181 | S | O | A1 | B1 | B1 |
| Compound 1182 | S | O | A1 | B6 | B6 |
| Compound 1183 | S | O | A1 | B25 | B25 |
| Compound 1184 | S | O | A1 | B28 | B28 |
| Compound 1185 | S | O | A1 | B29 | B29 |
| Compound 1186 | S | O | A1 | B30 | B30 |
| Compound 1187 | S | O | A1 | B56 | B56 |
| Compound 1188 | S | O | A1 | B67 | B67 |
| Compound 1189 | S | O | A1 | B68 | B68 |
| Compound 1190 | S | O | A1 | B69 | B69 |
| Compound 1191 | S | O | A1 | B70 | B70 |
| Compound 1192 | S | O | A1 | B71 | B71 |
| Compound 1193 | S | O | A1 | B72 | B72 |
| Compound 1194 | S | O | A1 | B74 | B74 |
| Compound 1195 | S | O | A1 | B80 | B80 |
| Compound 1196 | S | O | A1 | B83 | B83 |
| Compound 1197 | Se | O | A1 | B1 | B1 |
| Compound 1198 | Se | O | A1 | B6 | B6 |
| Compound 1199 | Se | O | A1 | B25 | B25 |
| Compound 1200 | Se | O | A1 | B28 | B28 |
| Compound 1201 | Se | O | A1 | B29 | B29 |
| Compound 1202 | Se | O | A1 | B30 | B30 |
| Compound 1203 | Se | O | A1 | B56 | B56 |
| Compound 1204 | Se | O | A1 | B67 | B67 |
| Compound 1205 | Se | O | A1 | B68 | B68 |
| Compound 1206 | Se | O | A1 | B69 | B69 |
| Compound 1207 | Se | O | A1 | B70 | B70 |
| Compound 1208 | Se | O | A1 | B71 | B71 |
| Compound 1209 | Se | O | A1 | B72 | B72 |
| Compound 1210 | Se | O | A1 | B74 | B74 |
| Compound 1211 | Se | O | A1 | B80 | B80 |
| Compound 1212 | Se | O | A1 | B83 | B83 |
| Compound 1213 | O | A1 | A2 | B1 | B1 |
| Compound 1214 | O | A1 | A2 | B6 | B6 |
| Compound 1215 | O | A1 | A2 | B25 | B25 |
| Compound 1216 | O | A1 | A2 | B28 | B28 |
| Compound 1217 | O | A1 | A2 | B29 | B29 |
| Compound 1218 | O | A1 | A2 | B30 | B30 |
| Compound 1219 | O | A1 | A2 | B56 | B56 |
| Compound 1220 | O | A1 | A2 | B67 | B67 |
| Compound 1221 | O | A1 | A2 | B68 | B68 |
| Compound 1222 | O | A1 | A2 | B69 | B69 |
| Compound 1223 | O | A1 | A2 | B70 | B70 |
| Compound 1224 | O | A1 | A2 | B71 | B71 |
| Compound 1225 | O | A1 | A2 | B72 | B72 |
| Compound 1226 | O | A1 | A2 | B74 | B74 |
| Compound 1227 | O | A1 | A2 | B80 | B80 |
| Compound 1228 | O | A1 | A2 | B83 | B83 |
| Compound 1229 | S | A1 | A2 | B1 | B1 |
| Compound 1230 | S | A1 | A2 | B6 | B6 |
| Compound 1231 | S | A1 | A2 | B25 | B25 |
| Compound 1232 | S | A1 | A2 | B28 | B28 |
| Compound 1233 | S | A1 | A2 | B29 | B29 |
| Compound 1234 | S | A1 | A2 | B30 | B30 |

| No. | Z | X | Y | R | R |
|---|---|---|---|---|---|
| Compound 1235 | S | A1 | A2 | B56 | B56 |
| Compound 1236 | S | A1 | A2 | B67 | B67 |
| Compound 1237 | S | A1 | A2 | B68 | B68 |
| Compound 1238 | S | A1 | A2 | B69 | B69 |
| Compound 1239 | S | A1 | A2 | B70 | B70 |
| Compound 1240 | S | A1 | A2 | B71 | B71 |
| Compound 1241 | S | A1 | A2 | B72 | B72 |
| Compound 1242 | S | A1 | A2 | B74 | B74 |
| Compound 1243 | S | A1 | A2 | B80 | B80 |
| Compound 1244 | S | A1 | A2 | B83 | B83 |
| Compound 1245 | Se | A1 | A2 | B1 | B1 |
| Compound 1246 | Se | A1 | A2 | B6 | B6 |
| Compound 1247 | Se | A1 | A2 | B25 | B25 |
| Compound 1248 | Se | A1 | A2 | B28 | B28 |
| Compound 1249 | Se | A1 | A2 | B29 | B29 |
| Compound 1250 | Se | A1 | A2 | B30 | B30 |
| Compound 1251 | Se | A1 | A2 | B56 | B56 |
| Compound 1252 | Se | A1 | A2 | B67 | B67 |
| Compound 1253 | Se | A1 | A2 | B68 | B68 |
| Compound 1254 | Se | A1 | A2 | B69 | B69 |
| Compound 1255 | Se | A1 | A2 | B70 | B70 |
| Compound 1256 | Se | A1 | A2 | B71 | B71 |
| Compound 1257 | Se | A1 | A2 | B72 | B72 |
| Compound 1258 | Se | A1 | A2 | B74 | B74 |
| Compound 1259 | Se | A1 | A2 | B80 | B80 |
| Compound 1260 | Se | A1 | A2 | B83 | B83 |
| Compound 1261 | O | A1 | A3 | B1 | B1 |
| Compound 1262 | O | A1 | A3 | B6 | B6 |
| Compound 1263 | O | A1 | A3 | B25 | B25 |
| Compound 1264 | O | A1 | A3 | B28 | B28 |
| Compound 1265 | O | A1 | A3 | B29 | B29 |
| Compound 1266 | O | A1 | A3 | B30 | B30 |
| Compound 1267 | O | A1 | A3 | B56 | B56 |
| Compound 1268 | O | A1 | A3 | B67 | B67 |
| Compound 1269 | O | A1 | A3 | B68 | B68 |
| Compound 1270 | O | A1 | A3 | B69 | B69 |
| Compound 1271 | O | A1 | A3 | B70 | B70 |
| Compound 1272 | O | A1 | A3 | B71 | B71 |
| Compound 1273 | O | A1 | A3 | B72 | B72 |
| Compound 1274 | O | A1 | A3 | B74 | B74 |
| Compound 1275 | O | A1 | A3 | B80 | B80 |
| Compound 1276 | O | A1 | A3 | B83 | B83 |
| Compound 1277 | S | A1 | A3 | B1 | B1 |
| Compound 1278 | S | A1 | A3 | B6 | B6 |
| Compound 1279 | S | A1 | A3 | B25 | B25 |
| Compound 1280 | S | A1 | A3 | B28 | B28 |
| Compound 1281 | S | A1 | A3 | B29 | B29 |
| Compound 1282 | S | A1 | A3 | B30 | B30 |
| Compound 1283 | S | A1 | A3 | B56 | B56 |
| Compound 1284 | S | A1 | A3 | B67 | B67 |
| Compound 1285 | S | A1 | A3 | B68 | B68 |
| Compound 1286 | S | A1 | A3 | B69 | B69 |
| Compound 1287 | S | A1 | A3 | B70 | B70 |
| Compound 1288 | S | A1 | A3 | B71 | B71 |
| Compound 1289 | S | A1 | A3 | B72 | B72 |
| Compound 1290 | S | A1 | A3 | B74 | B74 |
| Compound 1291 | S | A1 | A3 | B80 | B80 |
| Compound 1292 | S | A1 | A3 | B83 | B83 |
| Compound 1293 | Se | A1 | A3 | B1 | B1 |
| Compound 1294 | Se | A1 | A3 | B6 | B6 |
| Compound 1295 | Se | A1 | A3 | B25 | B25 |
| Compound 1296 | Se | A1 | A3 | B28 | B28 |
| Compound 1297 | Se | A1 | A3 | B29 | B29 |
| Compound 1298 | Se | A1 | A3 | B30 | B30 |
| Compound 1299 | Se | A1 | A3 | B56 | B56 |
| Compound 1300 | Se | A1 | A3 | B67 | B67 |
| Compound 1301 | Se | A1 | A3 | B68 | B68 |
| Compound 1302 | Se | A1 | A3 | B69 | B69 |
| Compound 1303 | Se | A1 | A3 | B70 | B70 |
| Compound 1304 | Se | A1 | A3 | B71 | B71 |
| Compound 1305 | Se | A1 | A3 | B72 | B72 |
| Compound 1306 | Se | A1 | A3 | B74 | B74 |
| Compound 1307 | Se | A1 | A3 | B80 | B80 |
| Compound 1308 | Se | A1 | A3 | B83 | B83 |
| Compound 1309 | O | A2 | A6 | B1 | B1 |
| Compound 1310 | O | A2 | A6 | B6 | B6 |
| Compound 1311 | O | A2 | A6 | B25 | B25 |
| Compound 1312 | O | A2 | A6 | B28 | B28 |
| Compound 1313 | O | A2 | A6 | B29 | B29 |
| Compound 1314 | O | A2 | A6 | B30 | B30 |
| Compound 1315 | O | A2 | A6 | B56 | B56 |
| Compound 1316 | O | A2 | A6 | B67 | B67 |
| Compound 1317 | O | A2 | A6 | B68 | B68 |
| Compound 1318 | O | A2 | A6 | B69 | B69 |
| Compound 1319 | O | A2 | A6 | B70 | B70 |
| Compound 1320 | O | A2 | A6 | B71 | B71 |
| Compound 1321 | O | A2 | A6 | B72 | B72 |
| Compound 1322 | O | A2 | A6 | B74 | B74 |
| Compound 1323 | O | A2 | A6 | B80 | B80 |
| Compound 1324 | O | A2 | A6 | B83 | B83 |
| Compound 1325 | S | A2 | A6 | B1 | B1 |
| Compound 1326 | S | A2 | A6 | B6 | B6 |
| Compound 1327 | S | A2 | A6 | B25 | B25 |
| Compound 1328 | S | A2 | A6 | B28 | B28 |
| Compound 1329 | S | A2 | A6 | B29 | B29 |
| Compound 1330 | S | A2 | A6 | B30 | B30 |
| Compound 1331 | S | A2 | A6 | B56 | B56 |
| Compound 1332 | S | A2 | A6 | B67 | B67 |
| Compound 1333 | S | A2 | A6 | B68 | B68 |
| Compound 1334 | S | A2 | A6 | B69 | B69 |
| Compound 1335 | S | A2 | A6 | B70 | B70 |
| Compound 1336 | S | A2 | A6 | B71 | B71 |
| Compound 1337 | S | A2 | A6 | B72 | B72 |
| Compound 1338 | S | A2 | A6 | B74 | B74 |
| Compound 1339 | S | A2 | A6 | B80 | B80 |
| Compound 1340 | S | A2 | A6 | B83 | B83 |
| Compound 1341 | Se | A2 | A6 | B1 | B1 |
| Compound 1342 | Se | A2 | A6 | B6 | B6 |
| Compound 1343 | Se | A2 | A6 | B25 | B25 |
| Compound 1344 | Se | A2 | A6 | B28 | B28 |
| Compound 1345 | Se | A2 | A6 | B29 | B29 |
| Compound 1346 | Se | A2 | A6 | B30 | B30 |
| Compound 1347 | Se | A2 | A6 | B56 | B56 |
| Compound 1348 | Se | A2 | A6 | B67 | B67 |
| Compound 1349 | Se | A2 | A6 | B68 | B68 |
| Compound 1350 | Se | A2 | A6 | B69 | B69 |
| Compound 1351 | Se | A2 | A6 | B70 | B70 |
| Compound 1352 | Se | A2 | A6 | B71 | B71 |
| Compound 1353 | Se | A2 | A6 | B72 | B72 |
| Compound 1354 | Se | A2 | A6 | B74 | B74 |
| Compound 1355 | Se | A2 | A6 | B80 | B80 |
| Compound 1356 | Se | A2 | A6 | B83 | B83. |

12. The organic electroluminescence device according to claim 1, wherein L is selected from a substituted or unsubstituted phenylene group, a substituted or unsubstituted biphenylene group, a substituted or unsubstituted terphenylene group, a substituted or unsubstituted naphthylene group, a substituted or unsubstituted fluorenylidene group, a substituted or unsubstituted silafluorenylidene group, a substituted or unsubstituted carbazolylene group, a substituted or unsubstituted dibenzofurylidene group, a substituted or unsubstituted dibenzothienylene group, a substituted or unsubstituted dibenzoselenophenylene group, a substituted or unsubstituted phenanthrylene group, a substituted or unsubstituted triphenylenylene group, a substituted or unsubstituted pyridylene group, a substituted or unsubstituted spirobifluorenylidene group, a substituted or unsubstituted anthrylene group, a substituted or unsubstituted pyrenylene group, or combinations thereof; optionally, L is selected from a substituted or unsubstituted phenylene group or a substituted or unsubstituted biphenylene group; and optionally, L is a phenylene group or a biphenylene group.

13. The organic electroluminescence device according to claim 1, wherein $R_1$ is selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted aryl group having 6 to 30 carbon atoms, or a substituted or unsubstituted heteroaryl group having 3 to 30 carbon atoms; optionally, $R_1$ is selected from hydrogen, deuterium, a substituted or unsubstituted aryl group having 6 to 30 carbon atoms, or a substituted or unsubstituted heteroaryl group having 3 to 30 carbon atoms.

14. The organic electroluminescence device according to claim 1, wherein $Ar_1$ and $Ar_2$ are selected from a substituted or unsubstituted aryl group having 6 to 20 carbon atoms or a substituted or unsubstituted heteroaryl group having 3 to 20 carbon atoms; optionally, $Ar_1$ and $Ar_2$ are selected from a phenyl group, a biphenylyl group, a terphenyl group, a naphthyl group, a fluorenyl group, a dibenzothienyl group, a spirobifluorenyl group, a pyridyl group, or a pyrimidinyl group.

15. The organic electroluminescence device according to claim 1, wherein the compound having the structure of Formula 2 is selected from a group consisting of the following compounds:

H-1
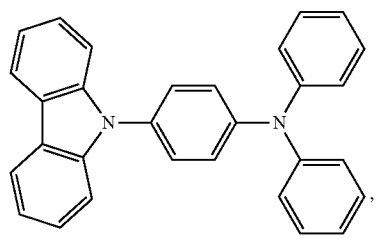

H-2
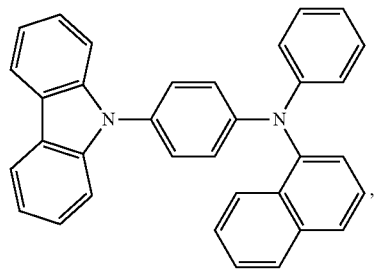

H-3
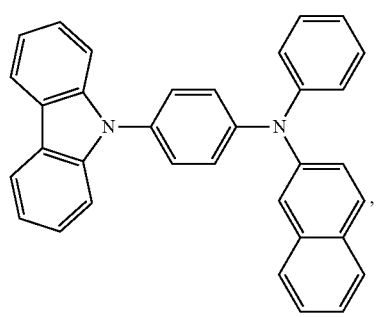

H-4
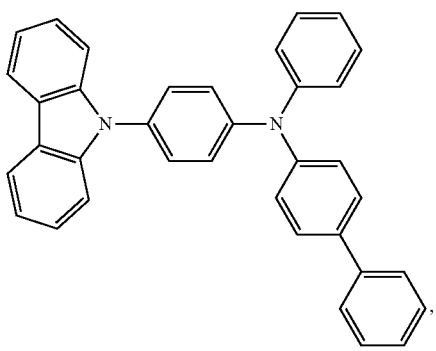

H-5
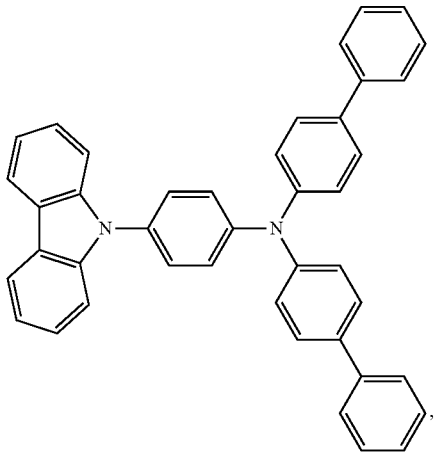

H-6
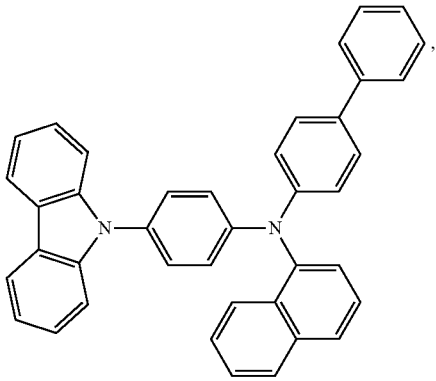

H-7
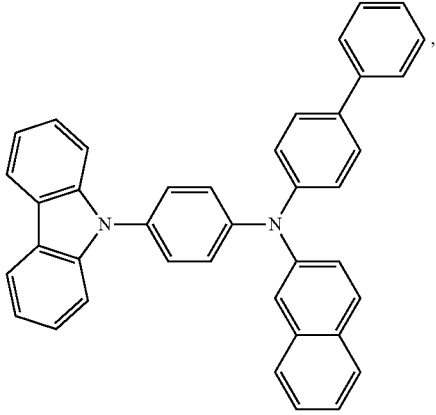

H-8
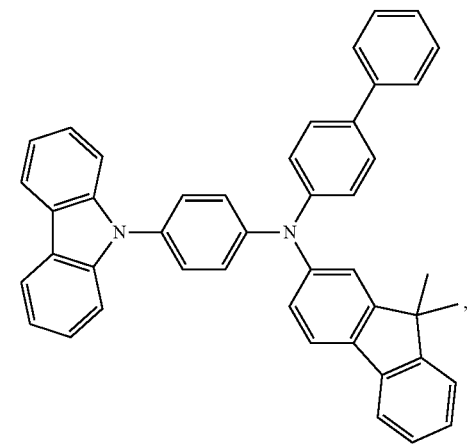
H-9
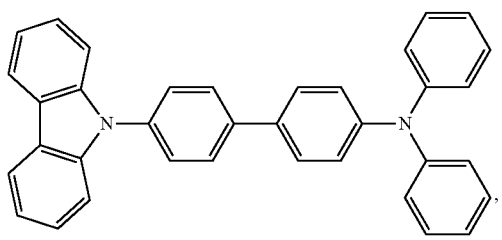
H-10
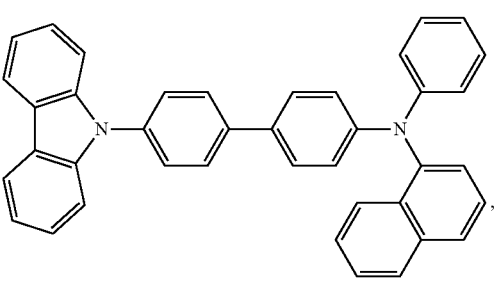
H-11
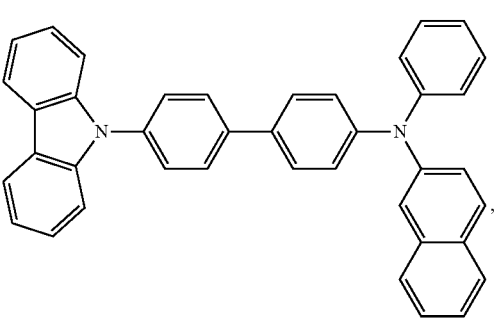
H-12
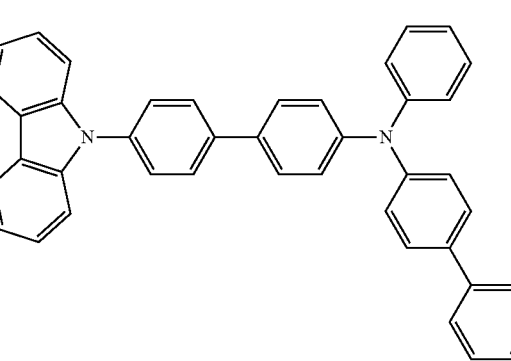
H-13
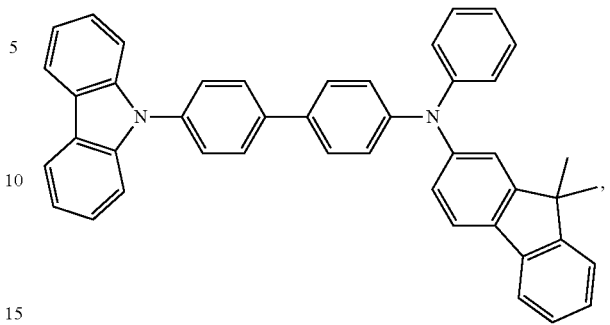
H-14
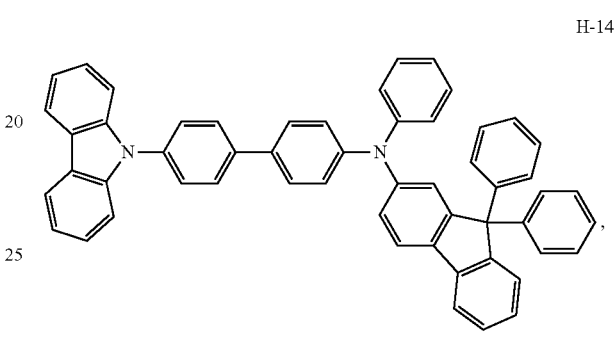
H-15
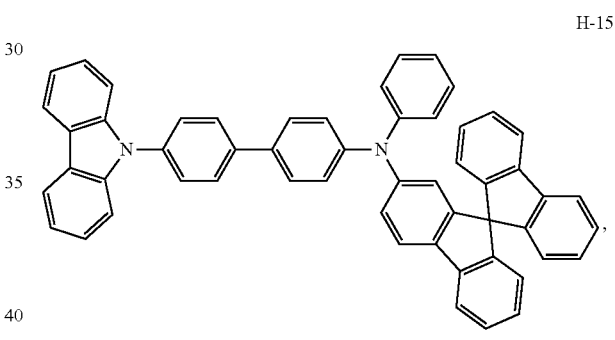
H-16
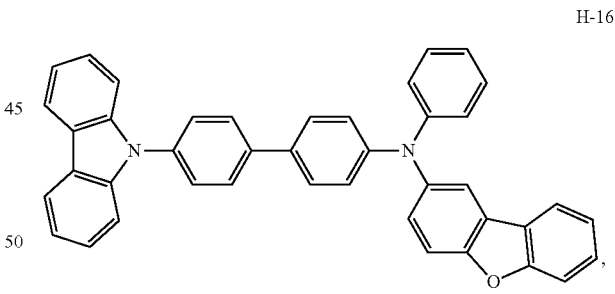
H-17
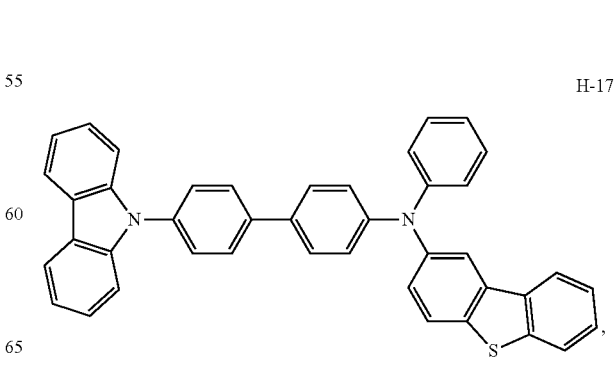

H-18
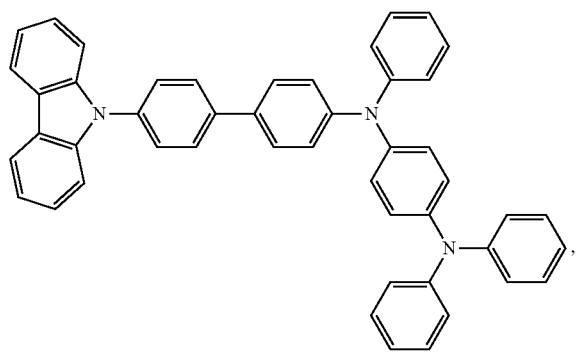
H-19
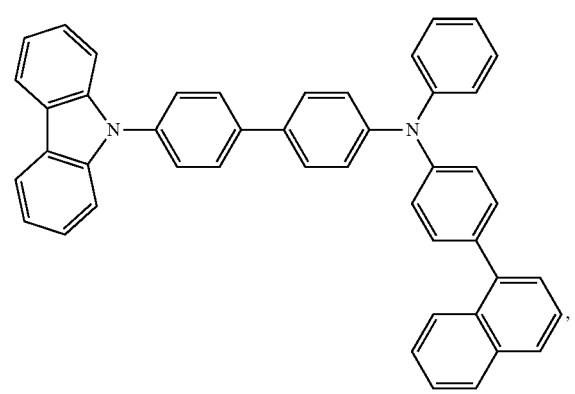
H-20
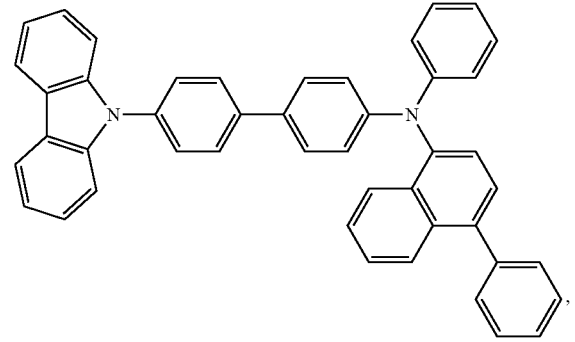
H-21
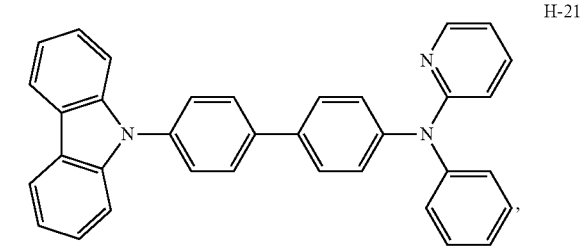
H-22
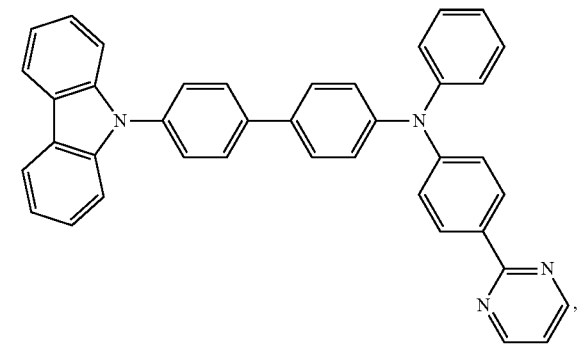
H-23
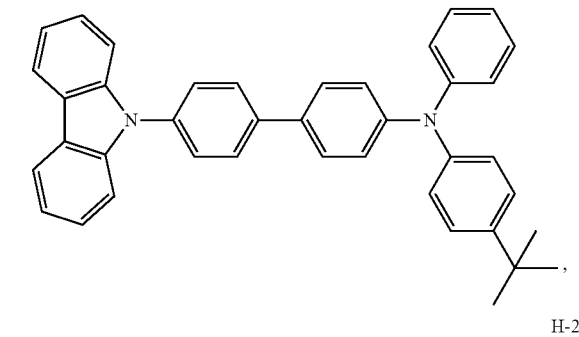
H-24
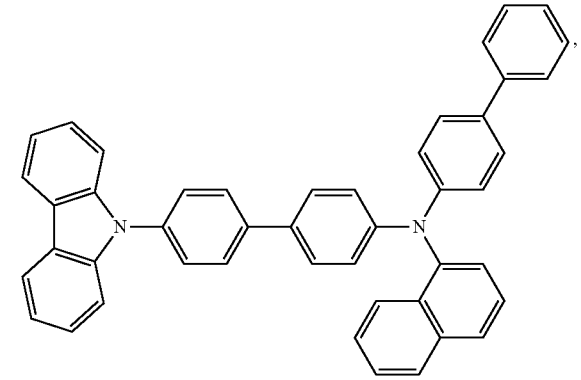
H-25
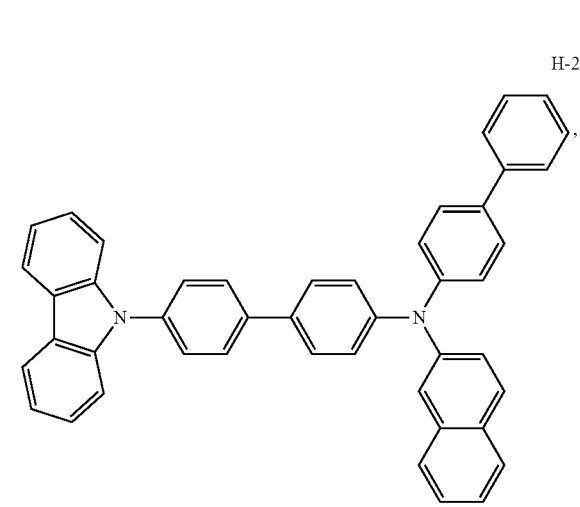

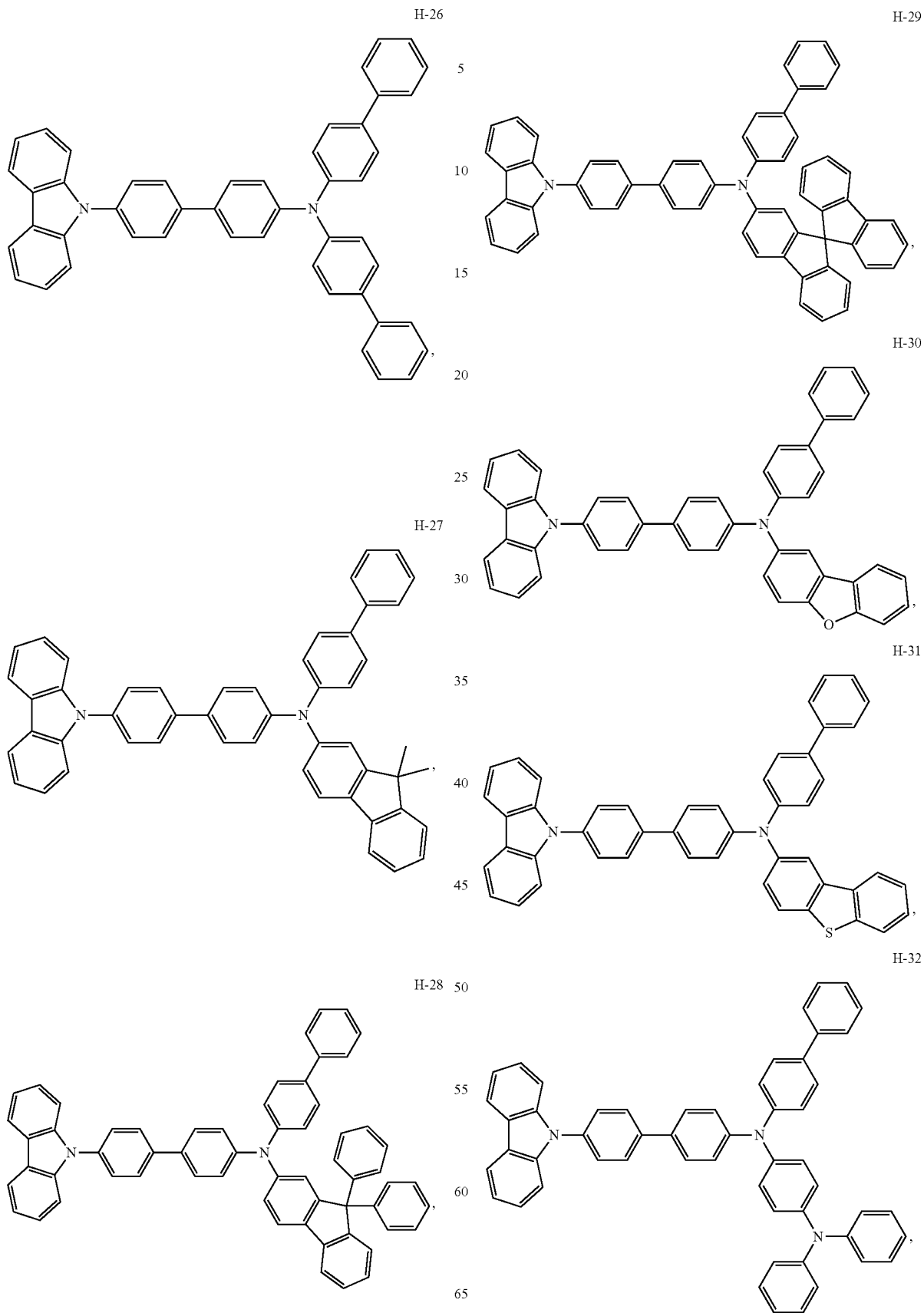

-continued
H-33
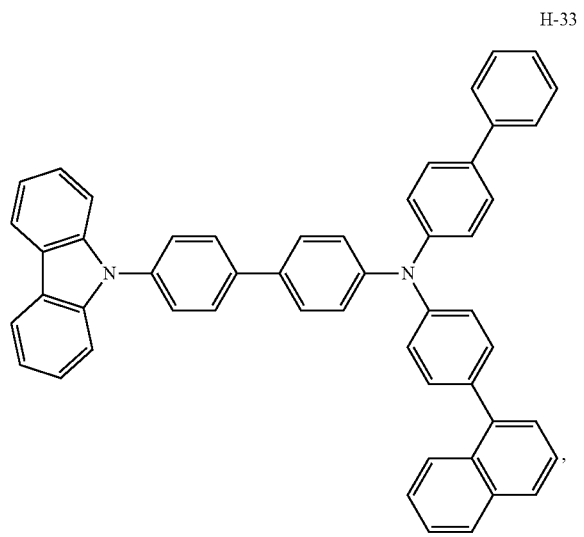
H-36
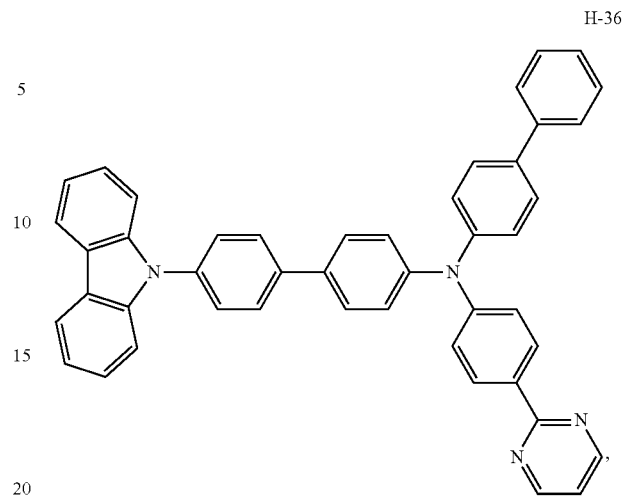
H-34
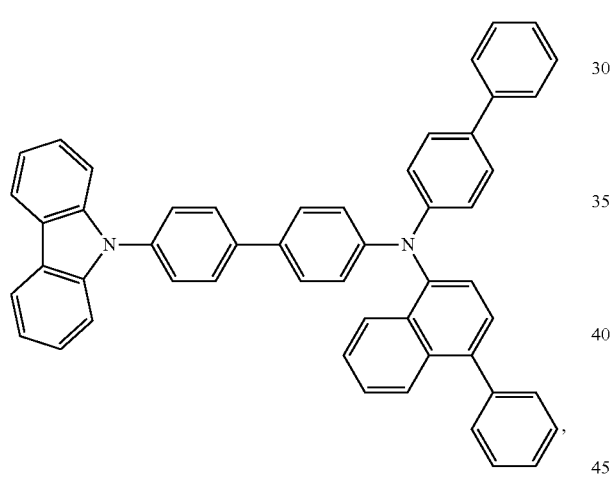
H-37
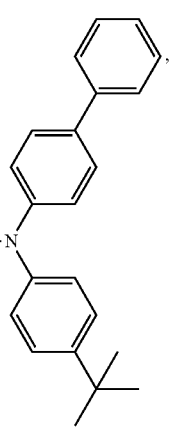
H-35
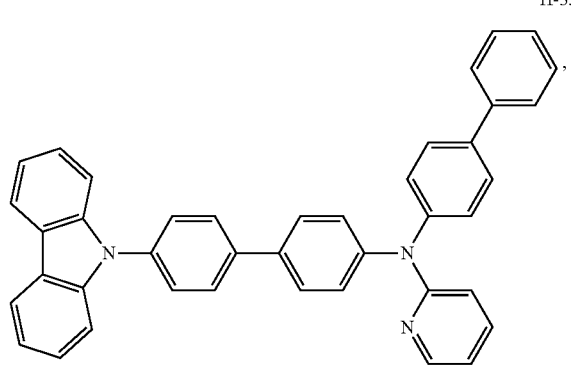
H-38
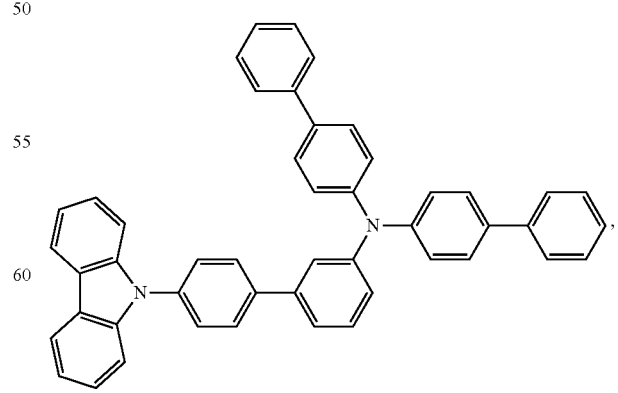

H-39
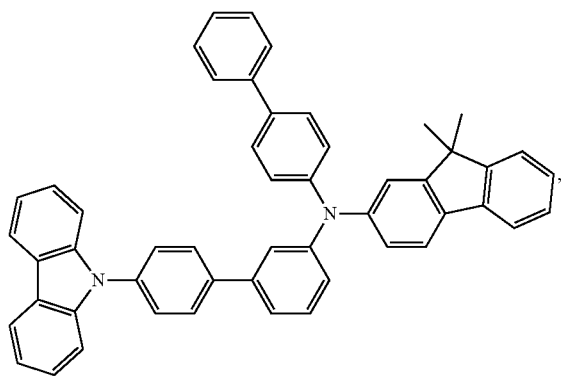
H-43
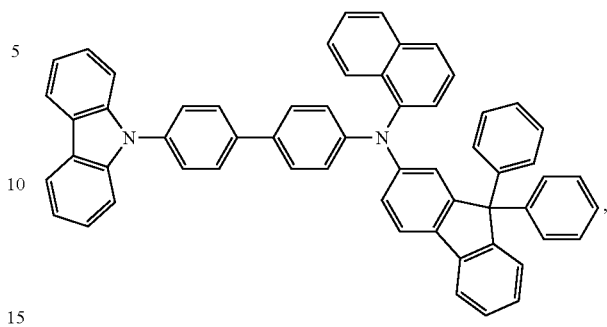
H-40
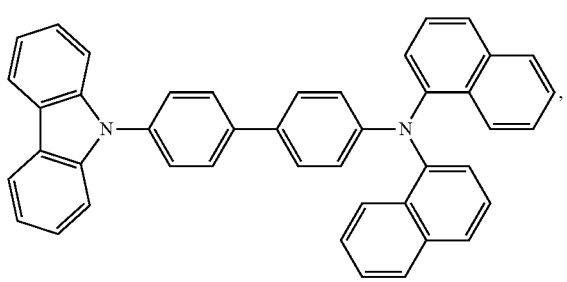
H-44
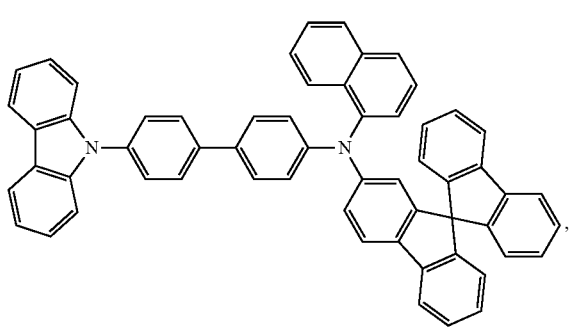
H-41
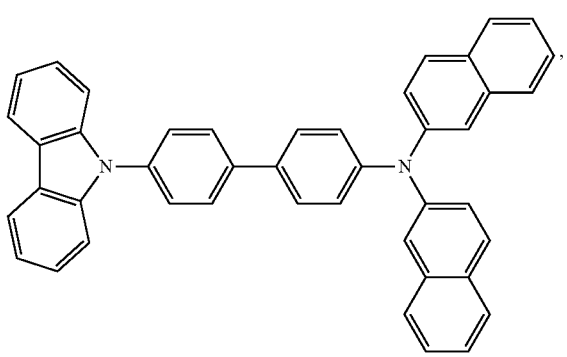
H-45
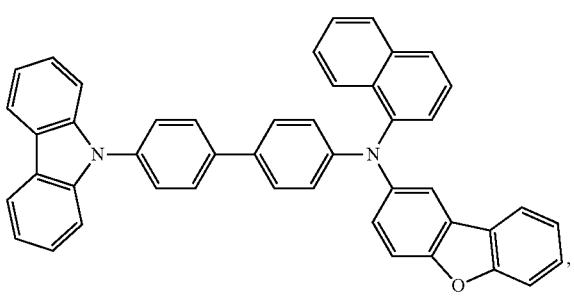
H-42
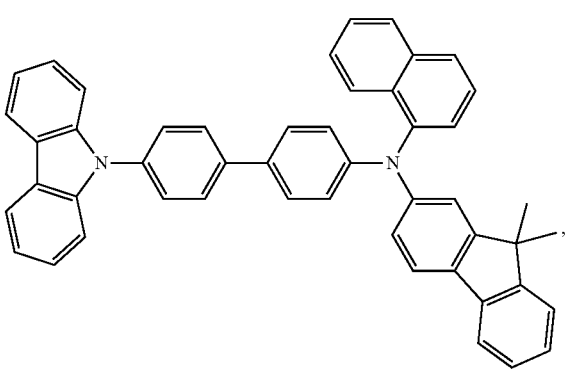
H-46
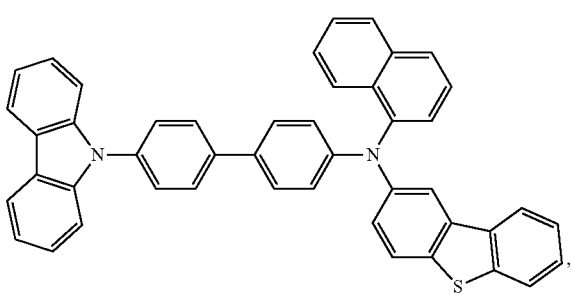

H-47
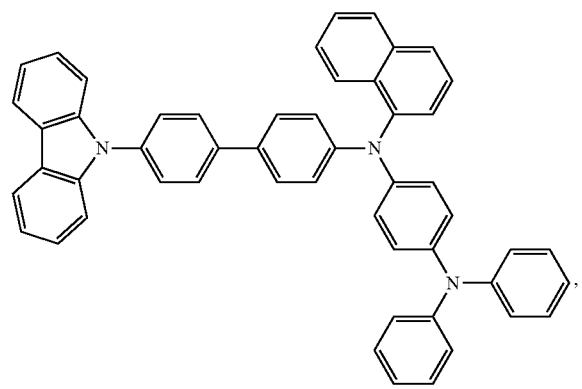
H-48
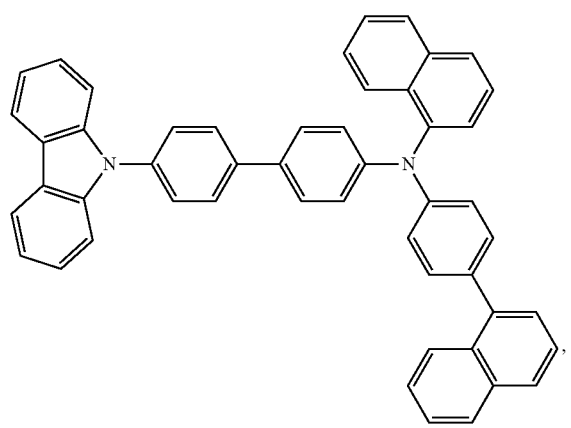
H-49
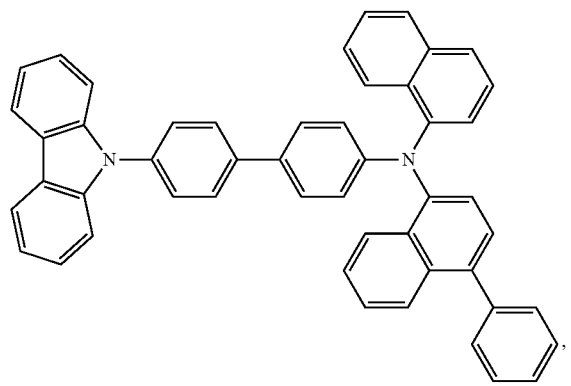
H-50
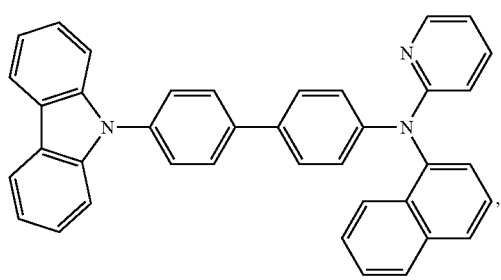
H-51
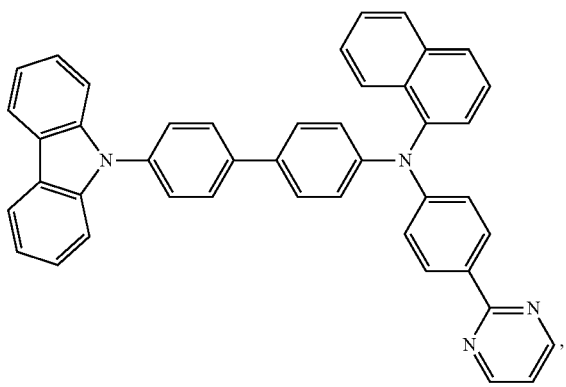
H-52
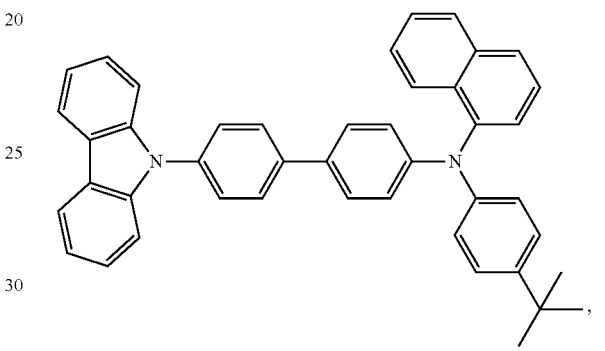
H-53
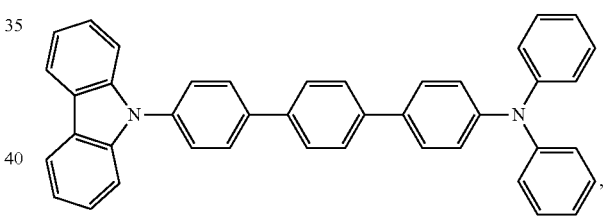
H-54
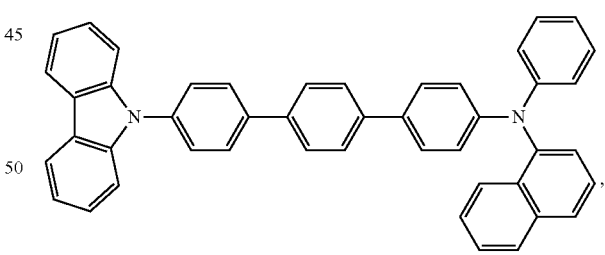
H-55
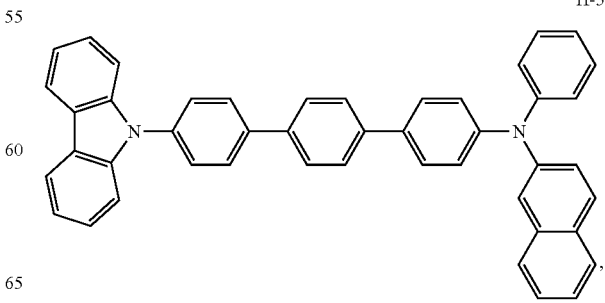

H-56
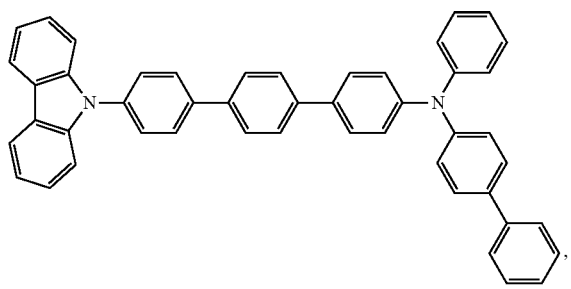
H-57
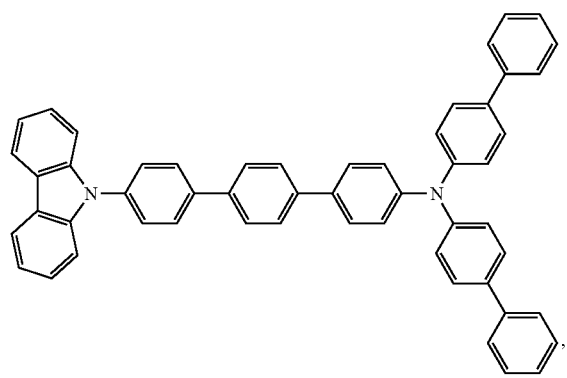
H-58
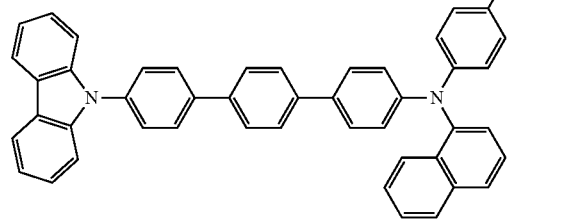
H-59
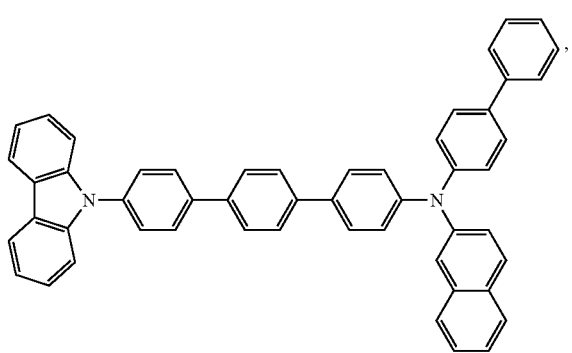
H-60
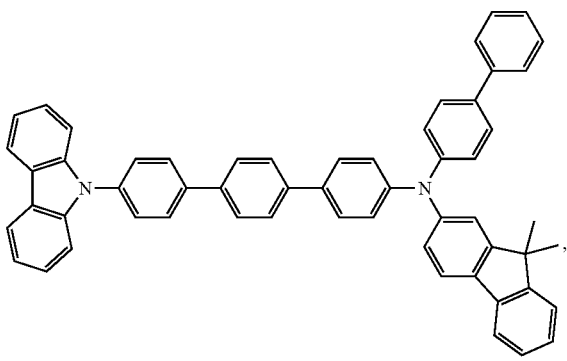
H-61
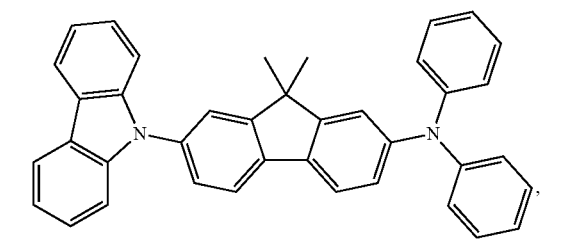
H-62
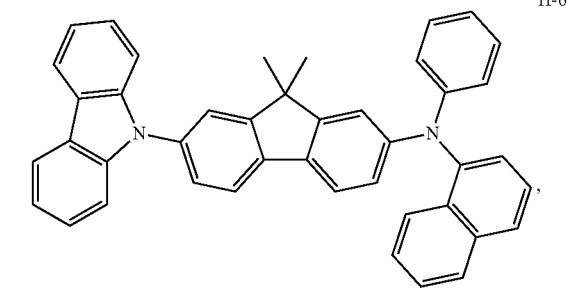
H-63
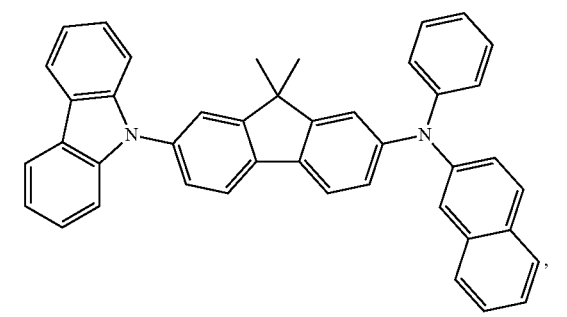
H-64
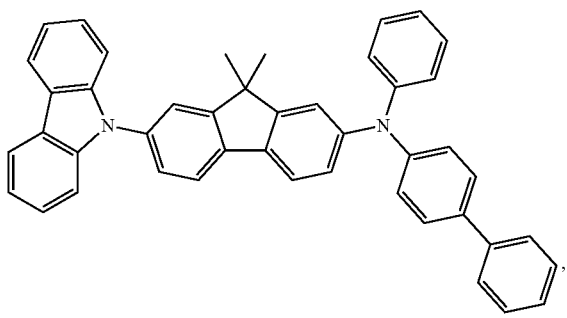

97
-continued
H-65
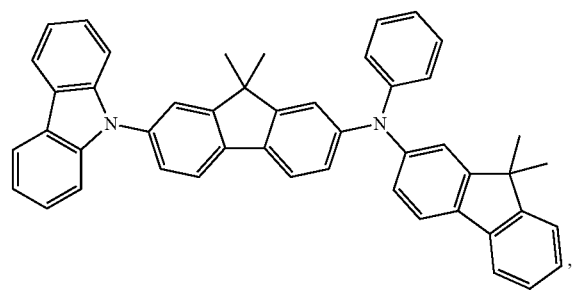
H-66
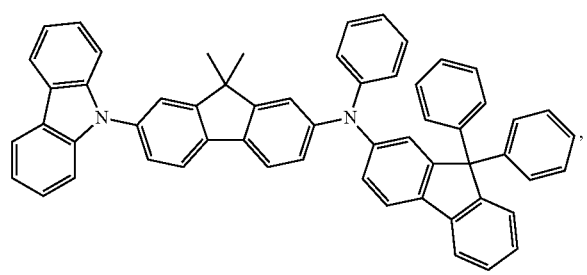
H-67
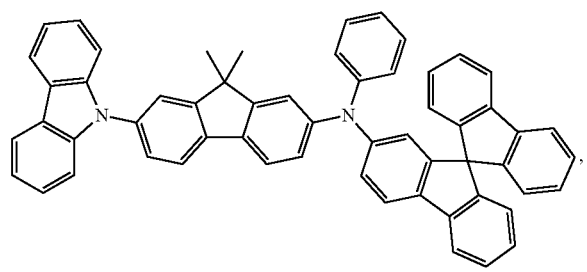
H-68
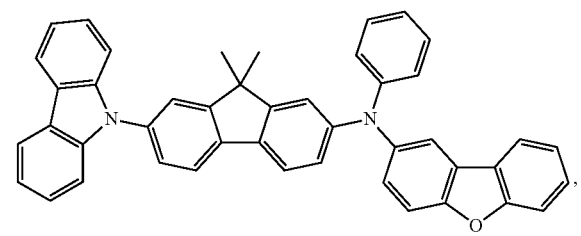
H-69
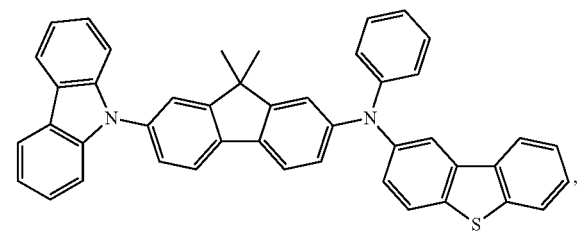
98
-continued
H-70
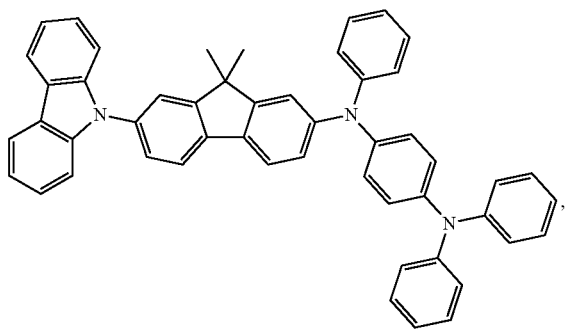
H-71
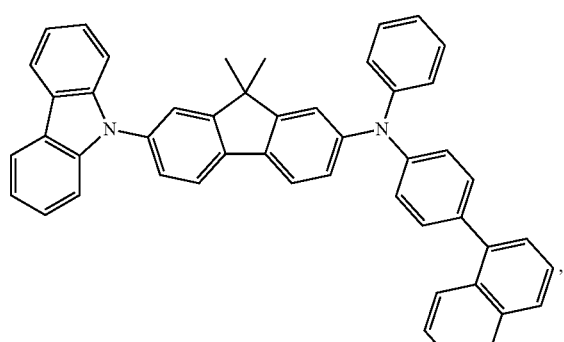
H-72
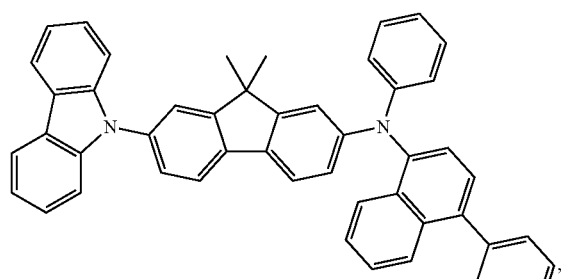
H-73
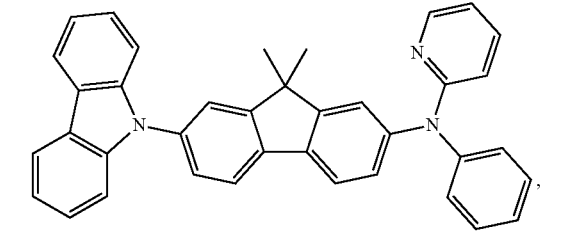
H-74
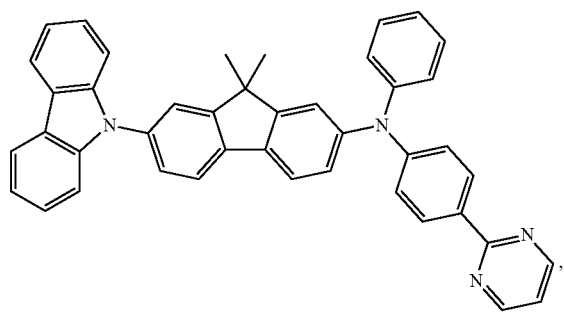

H-75
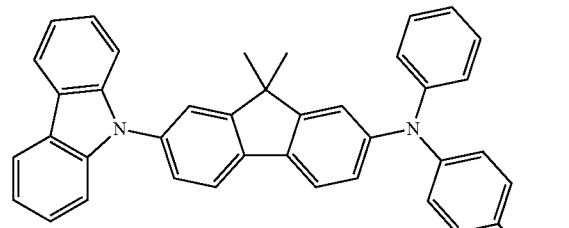
H-76
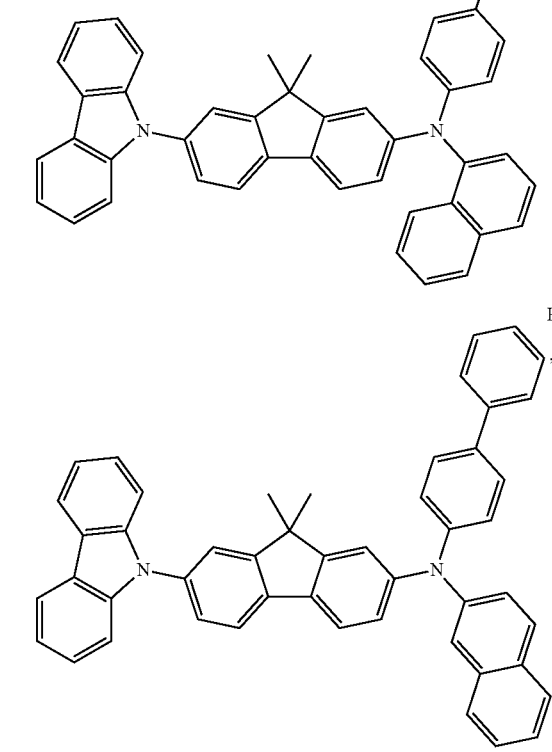
H-77
H-78
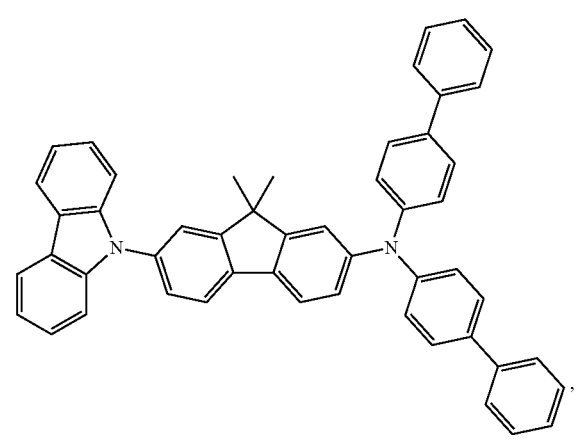
H-79
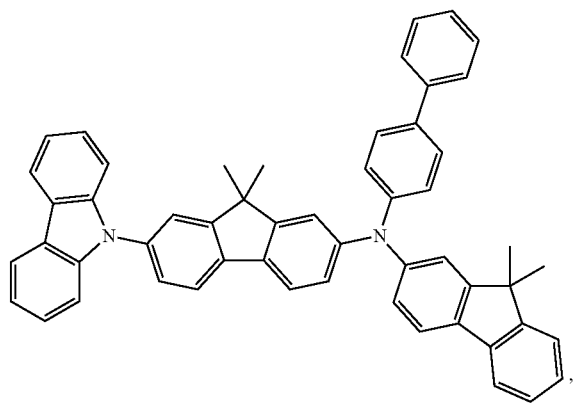
H-80
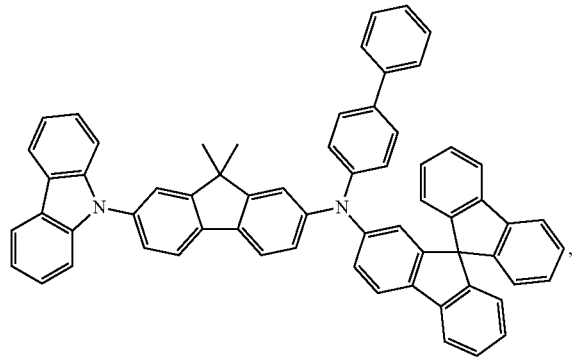
H-81
H-82
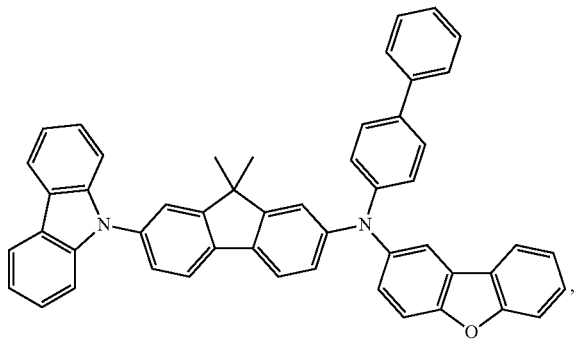

H-83
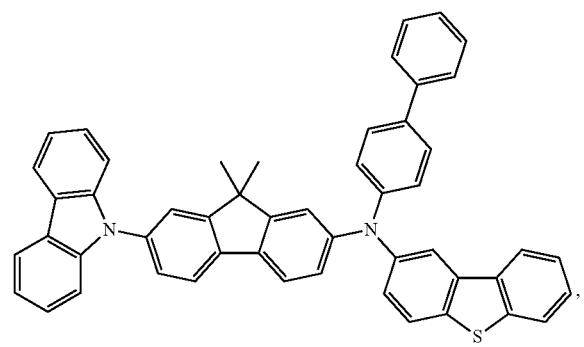
H-84
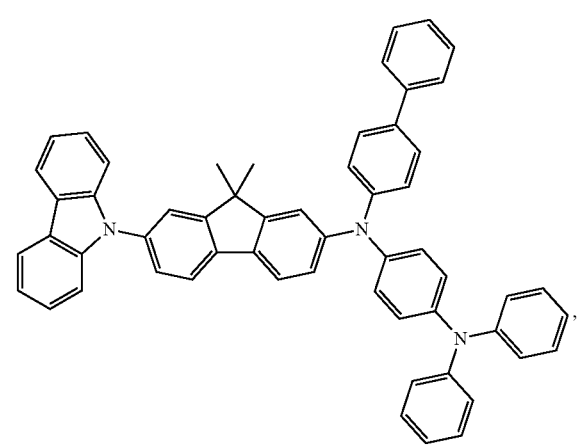
H-85
H-86
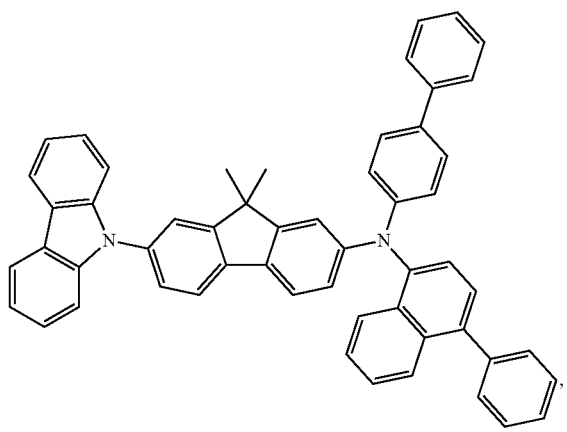
H-87
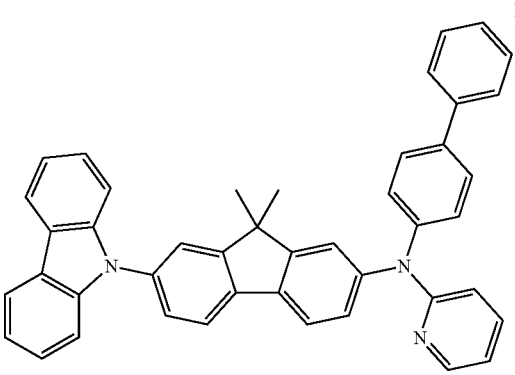
H-88
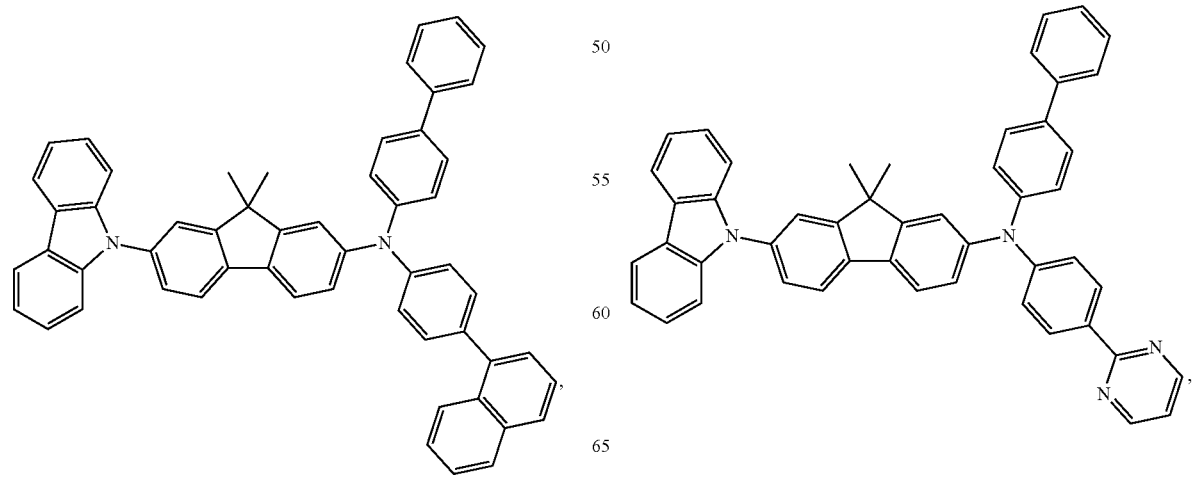

-continued
H-89
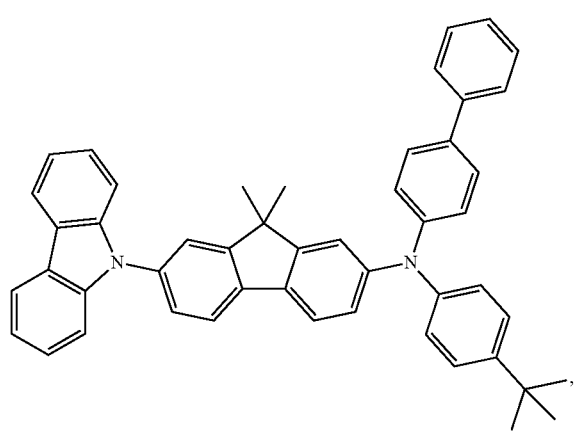
H-90
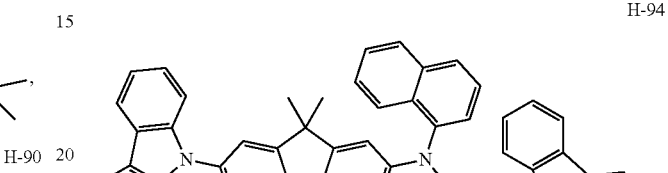
H-91
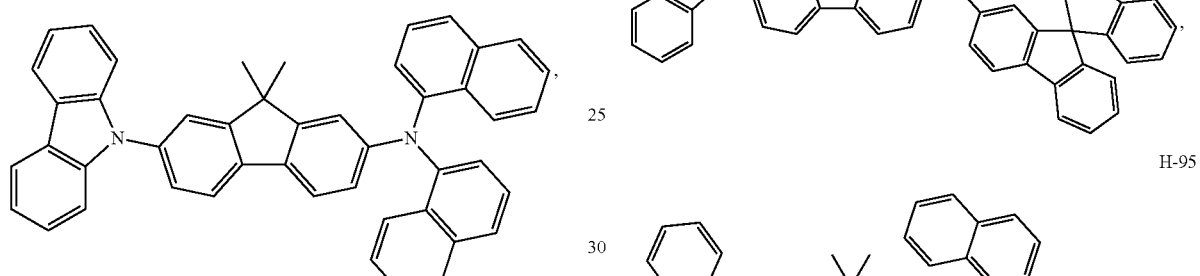
H-92
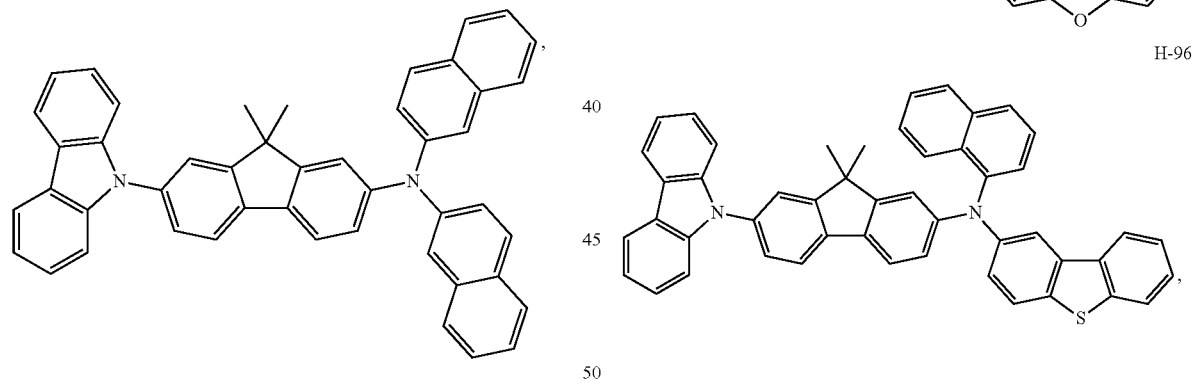
-continued
H-93
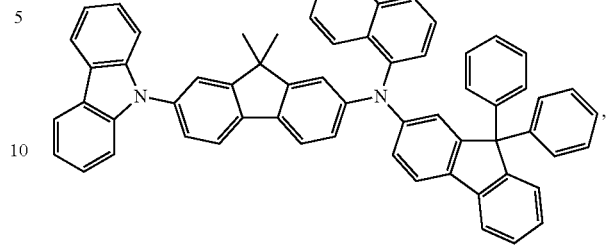
H-94
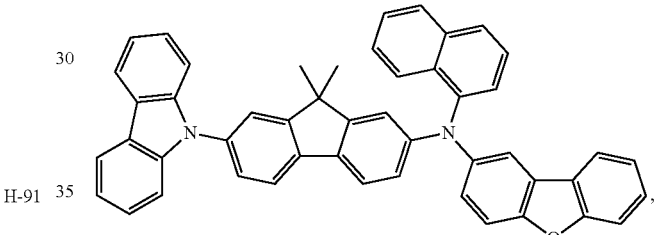
H-95
H-96
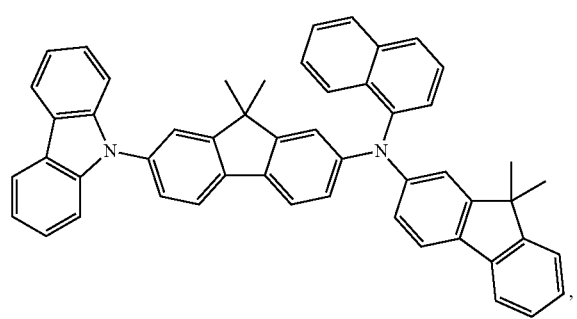
H-97
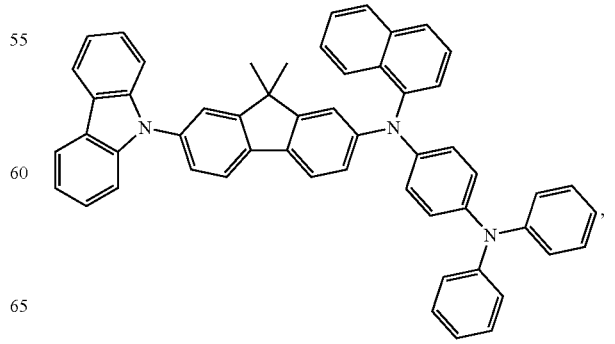

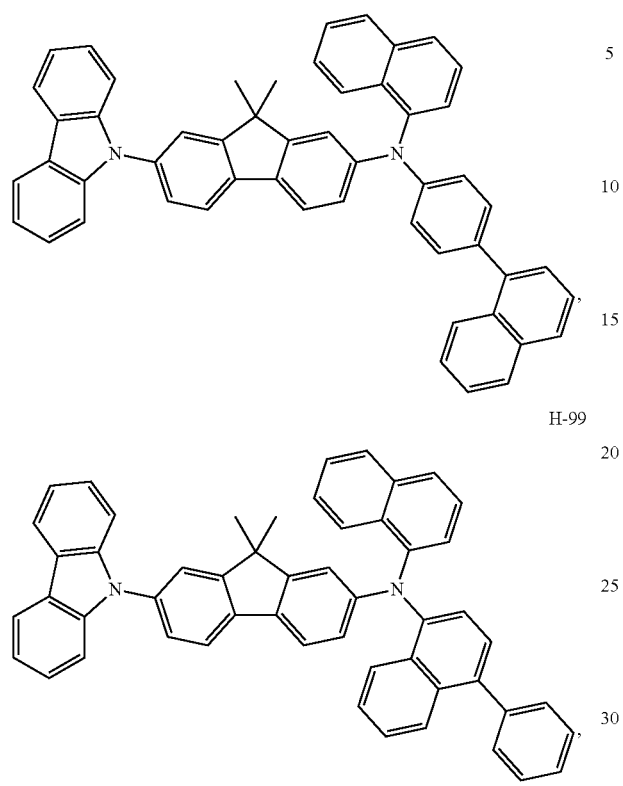
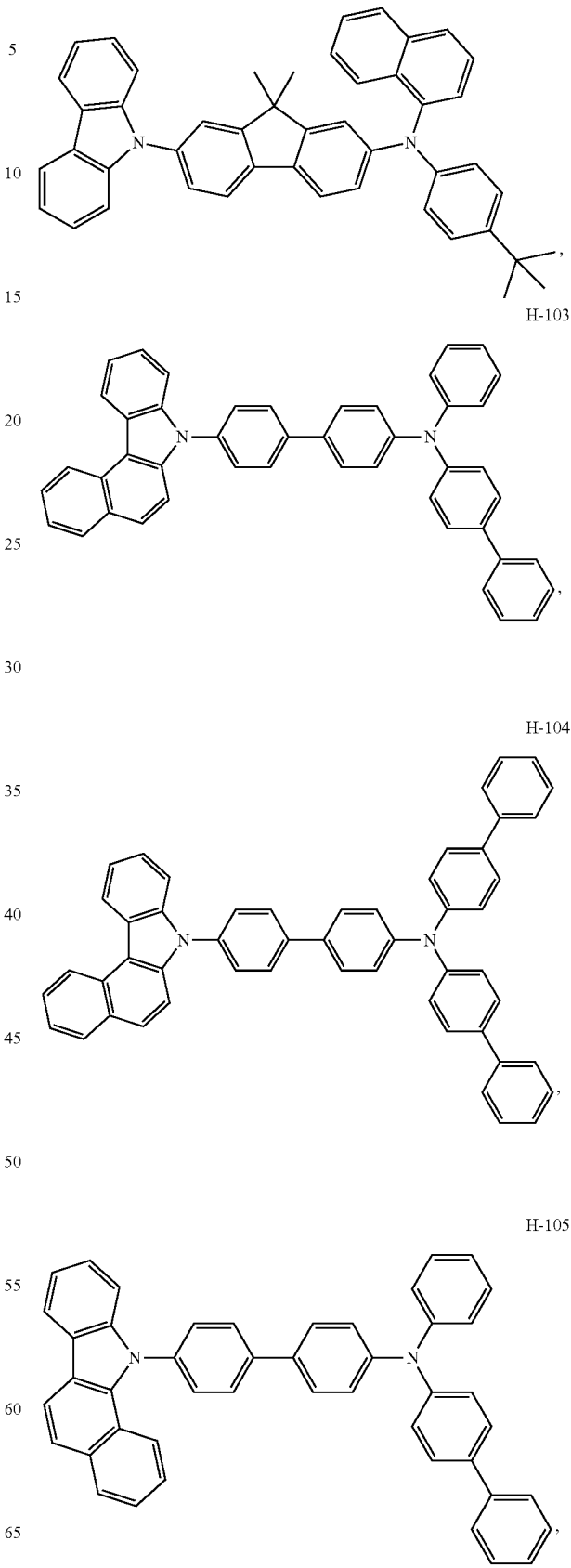

H-106
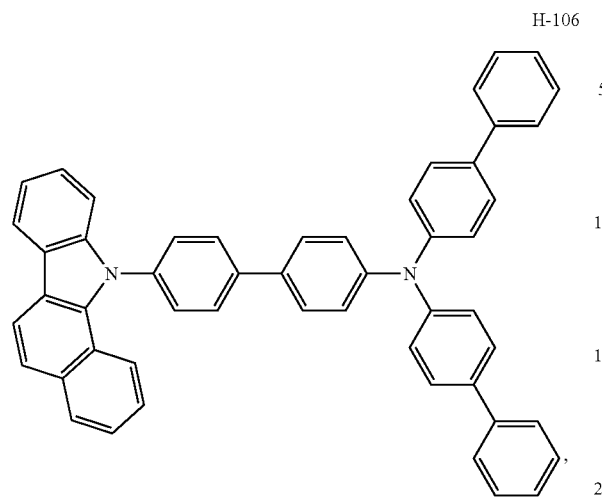
H-107
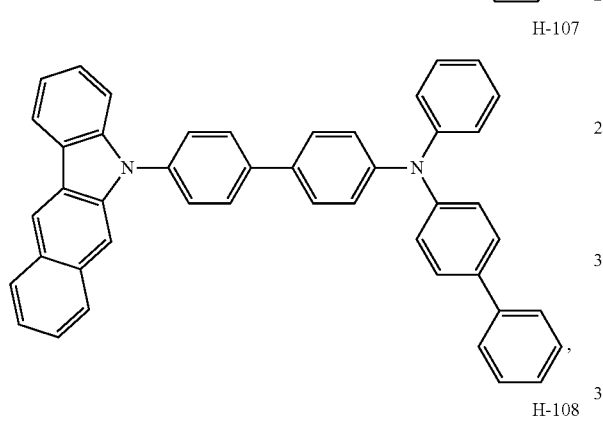
H-108
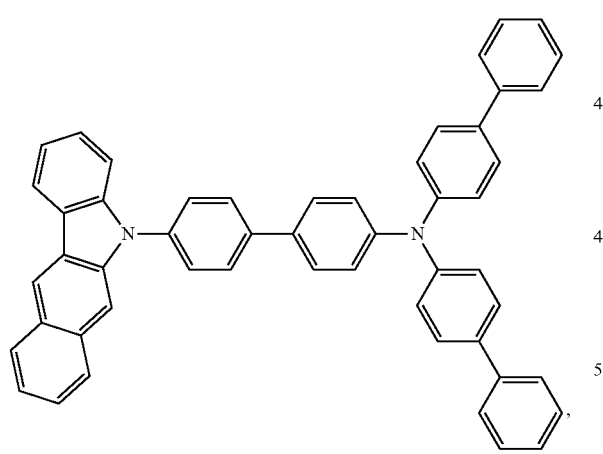
H-109
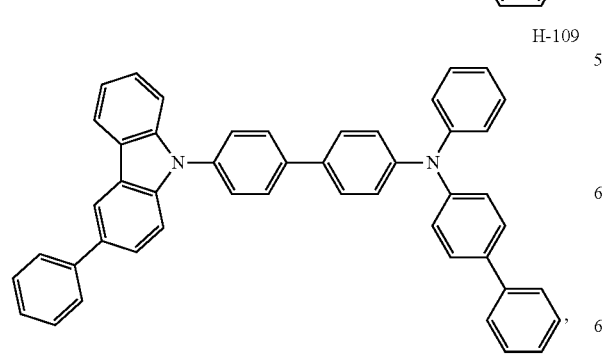
H-110
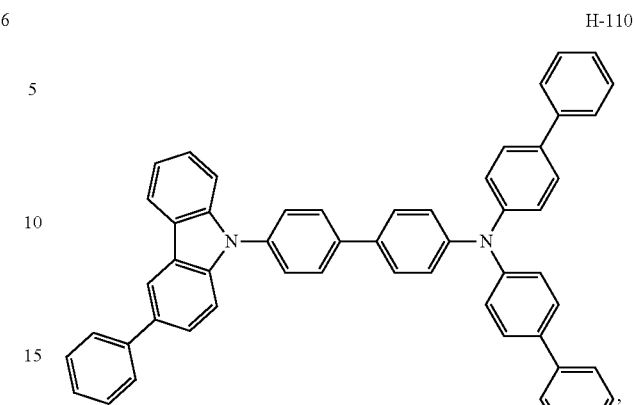
H-111
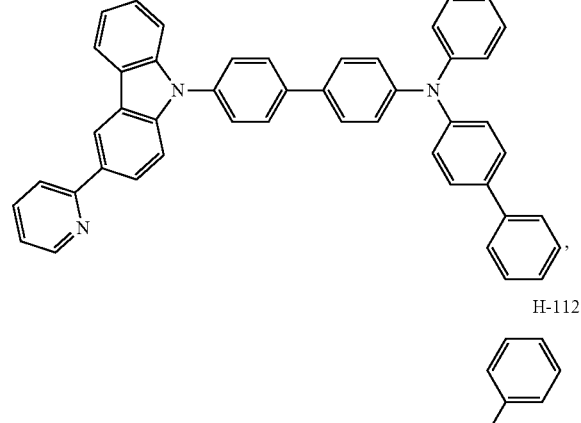
H-112
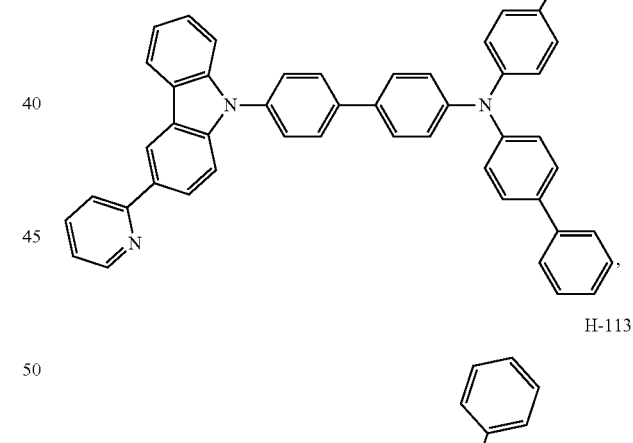
H-113
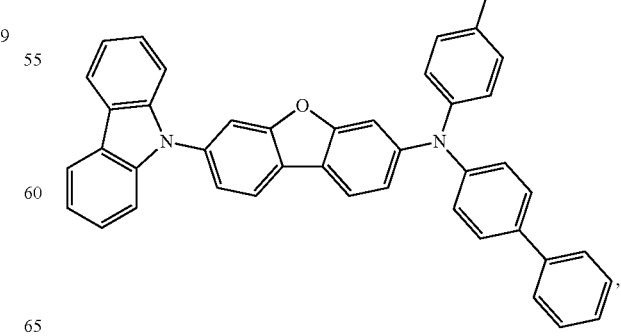

H-114
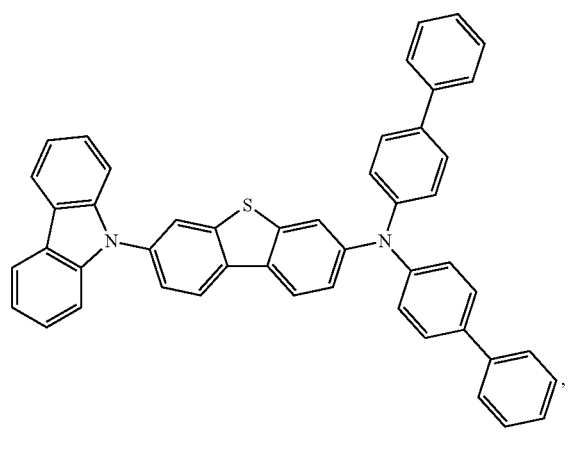
H-115
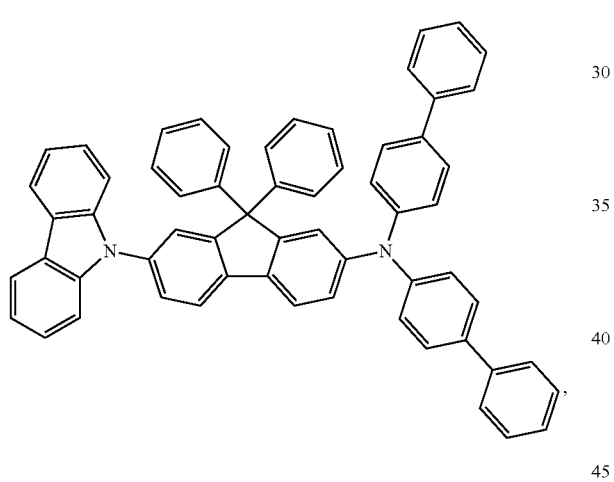
H-116
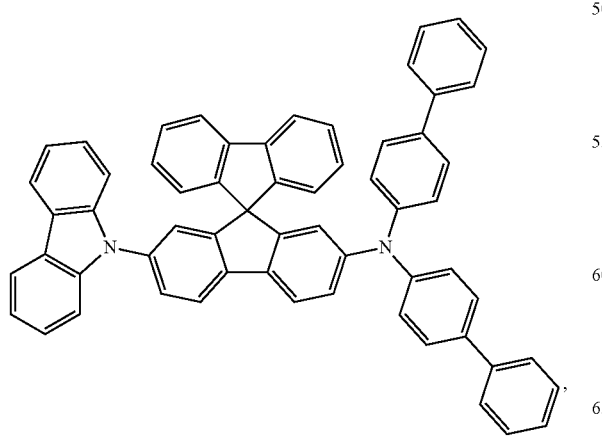
H-117
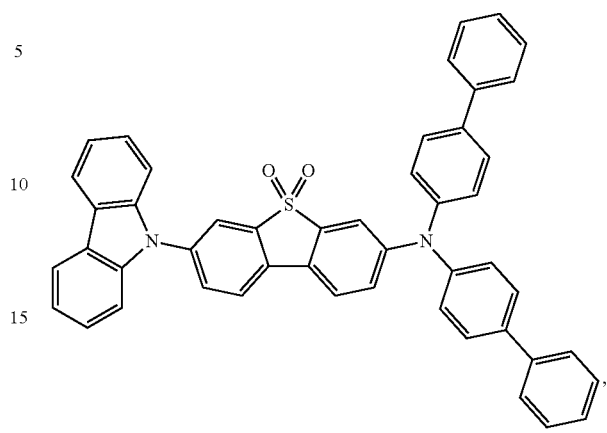
H-118
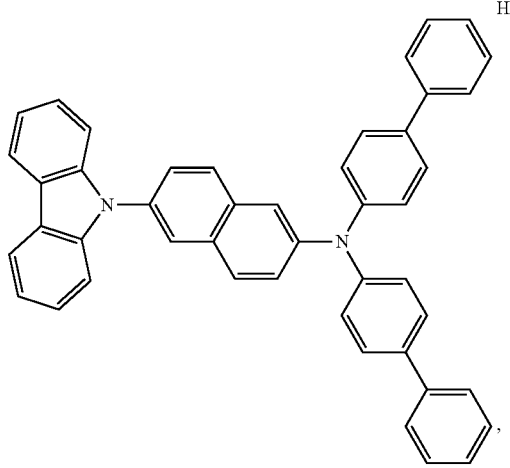
H-119
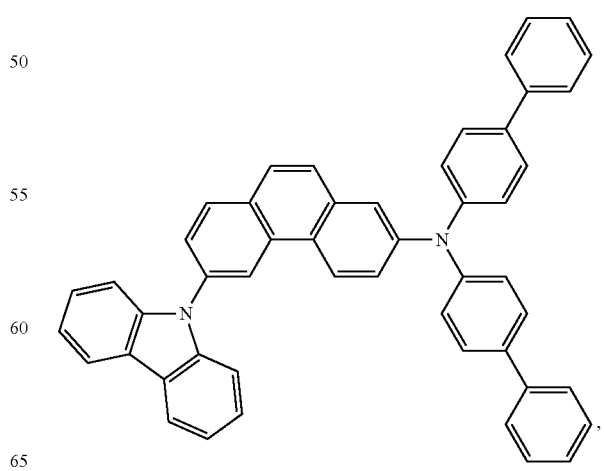

-continued
H-120
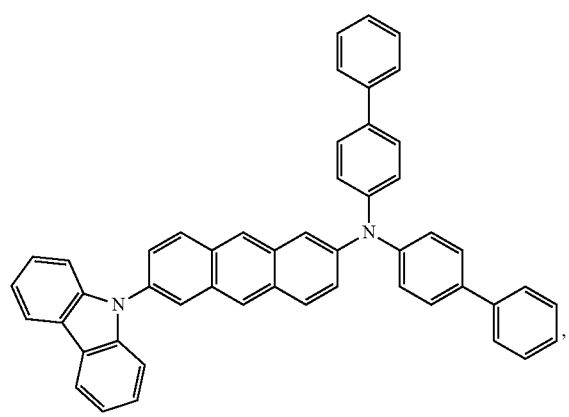
H-121
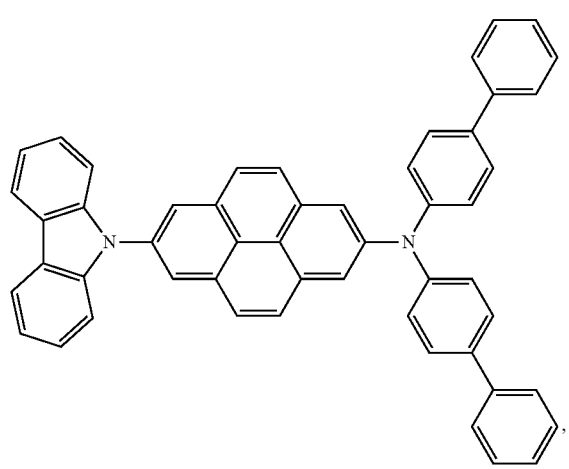
H-122
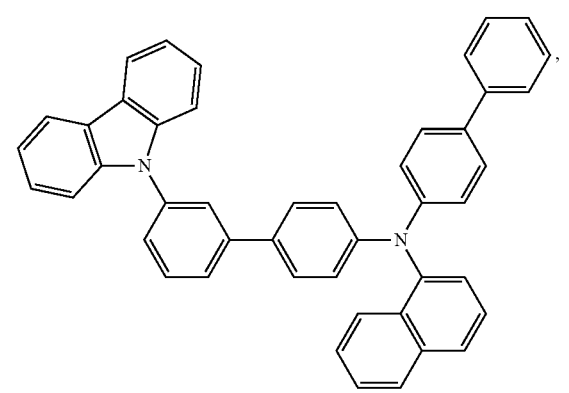
-continued
H-123
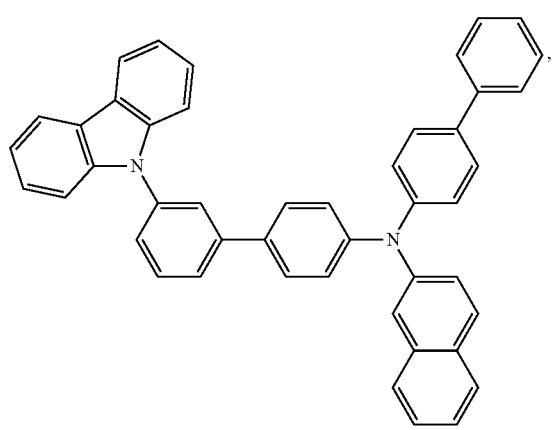
H-124
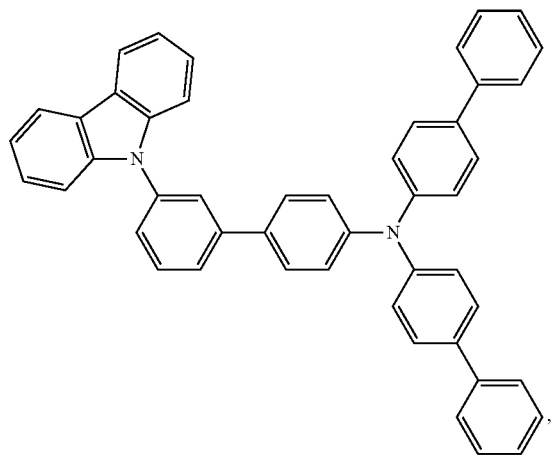
H-125
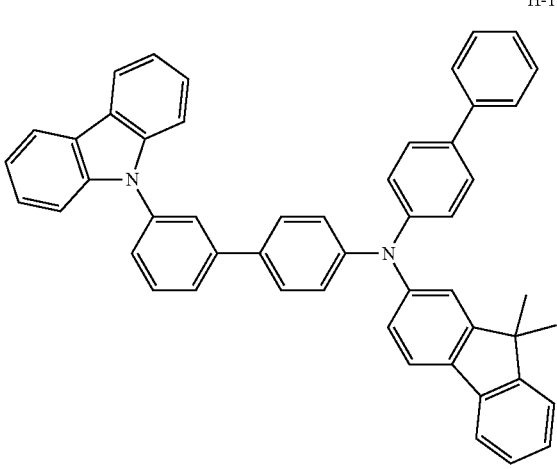

H-126
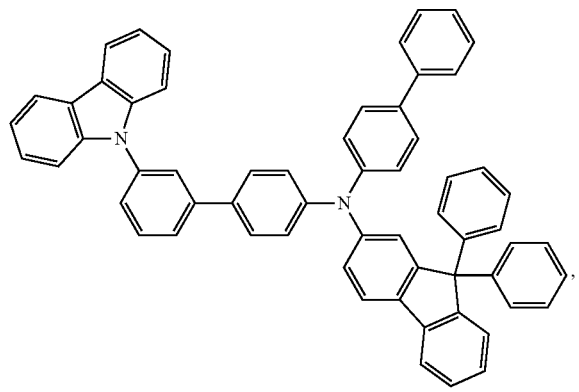
H-127
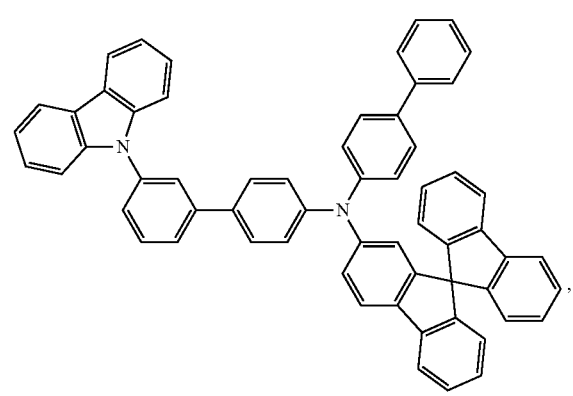
H-128
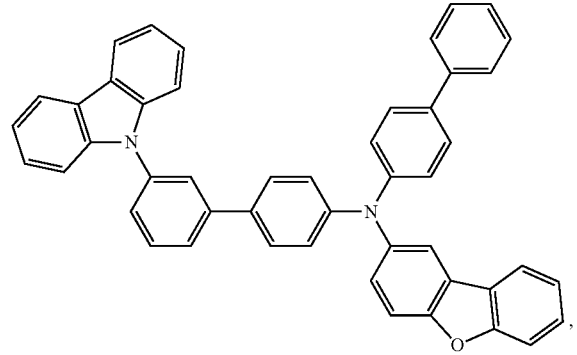
H-129
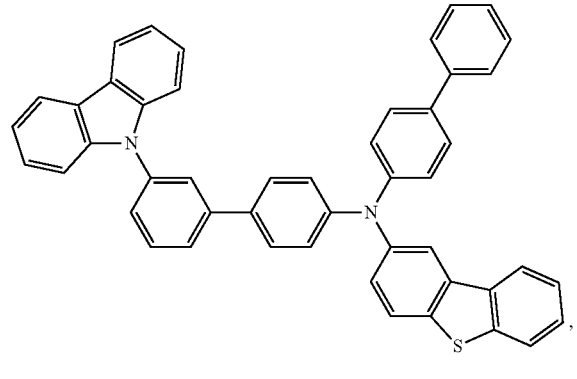
H-130
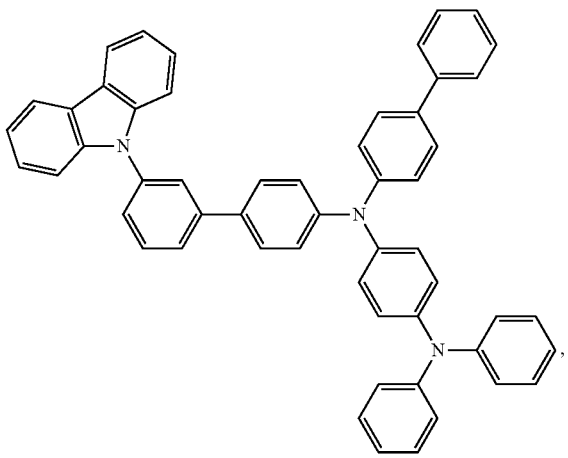
H-131
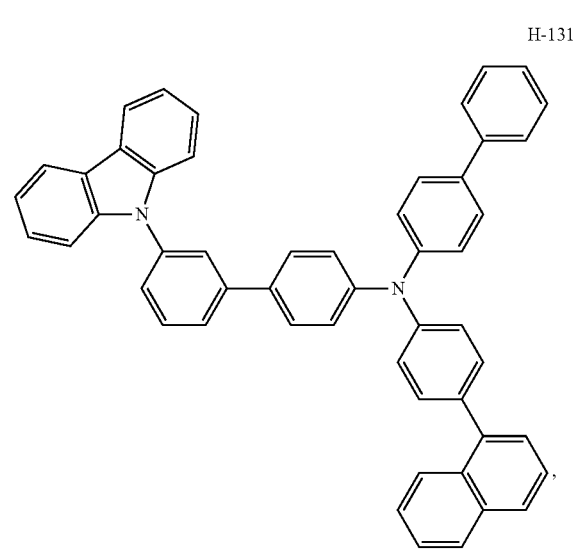
H-132
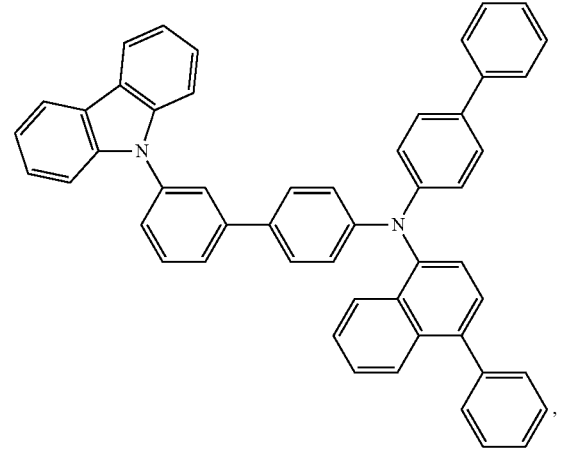

H-133
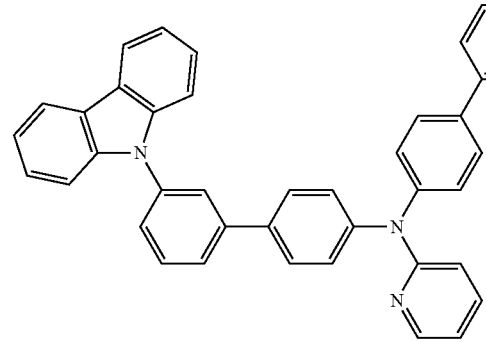
H-134
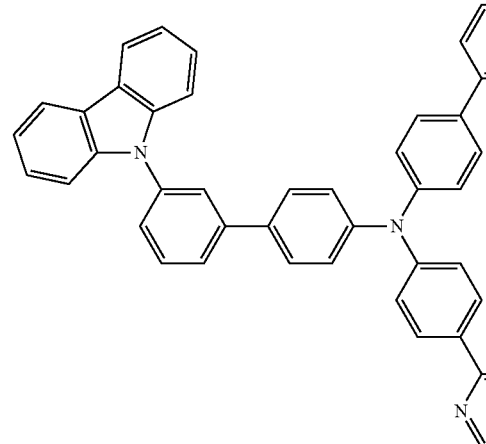
H-135
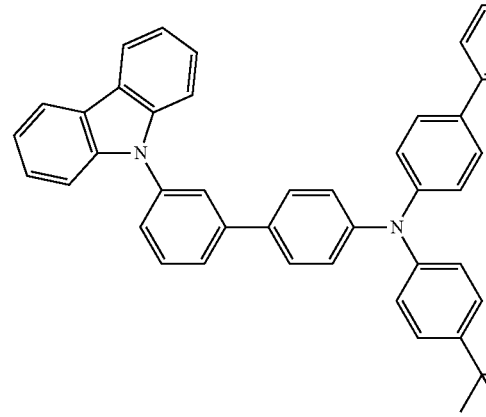
H-136
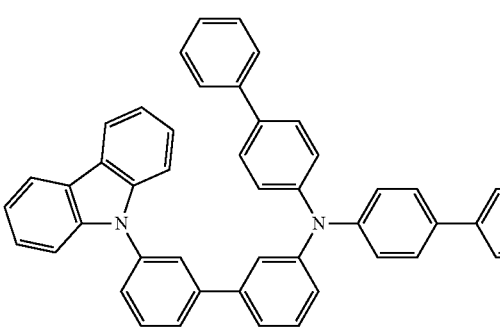
H-137
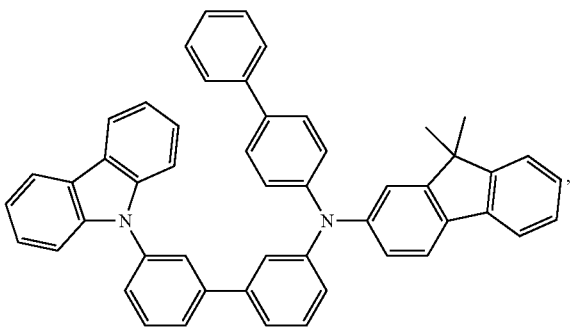
H-138
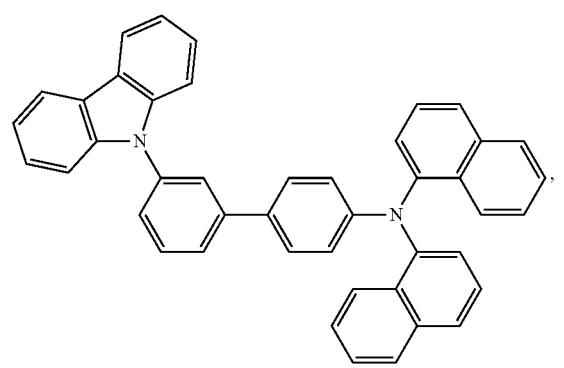
H-139
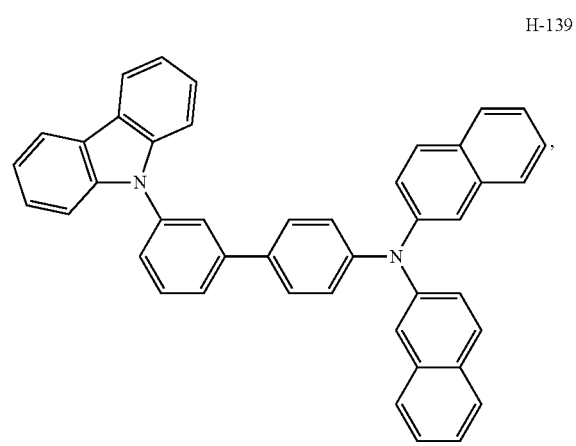
H-140
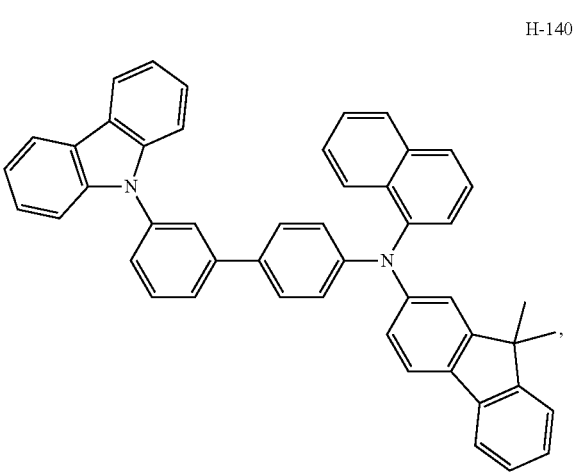

H-141
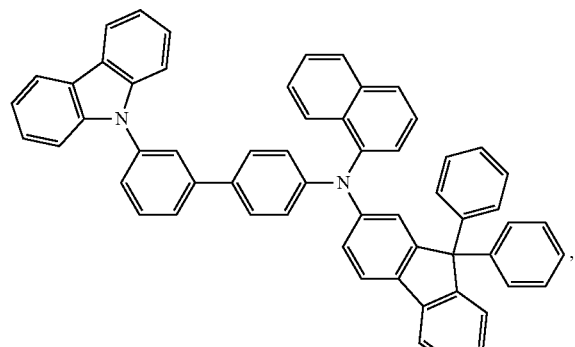
H-142
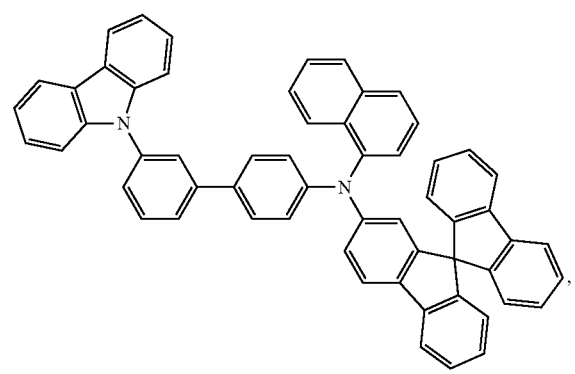
H-143
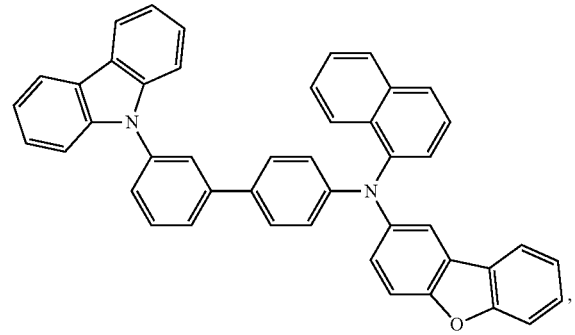
H-144
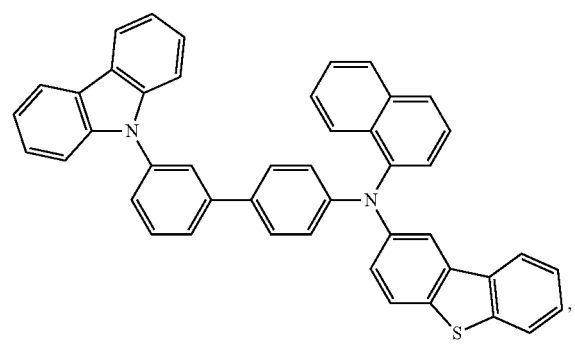
H-145
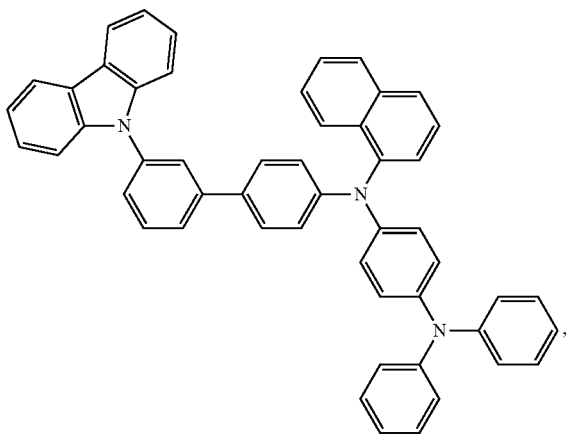
H-146
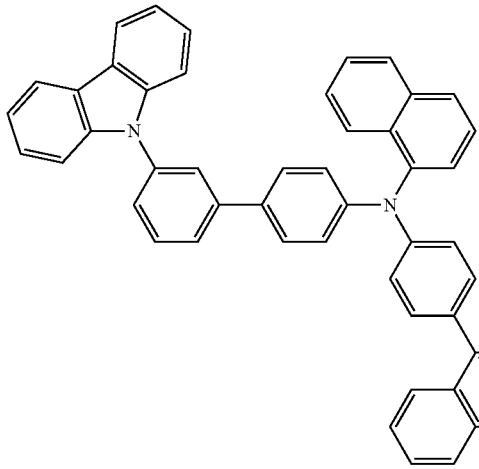
H-147
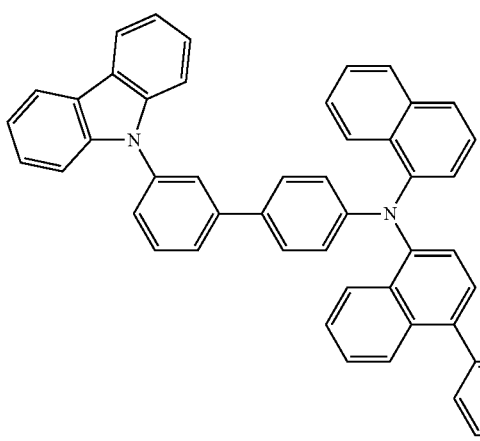

H-148
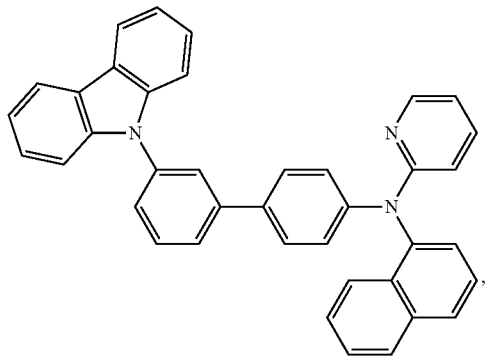
H-149
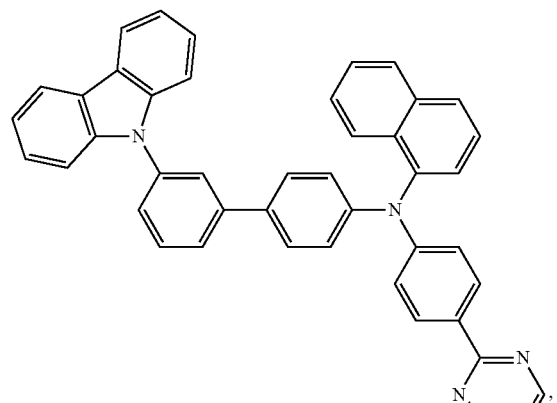
H-150
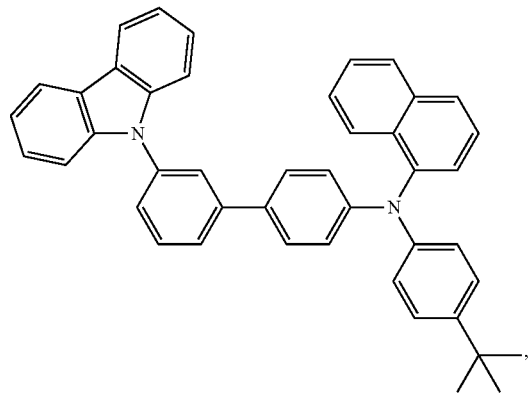
H-151
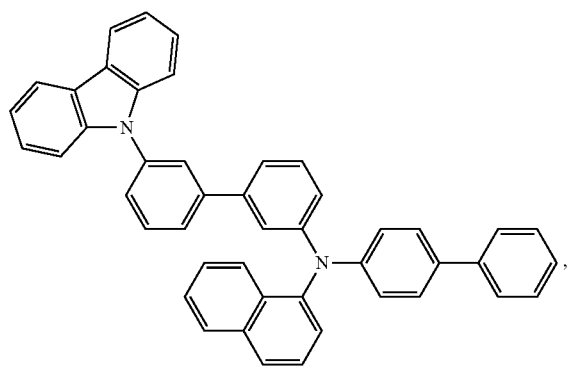
H-152
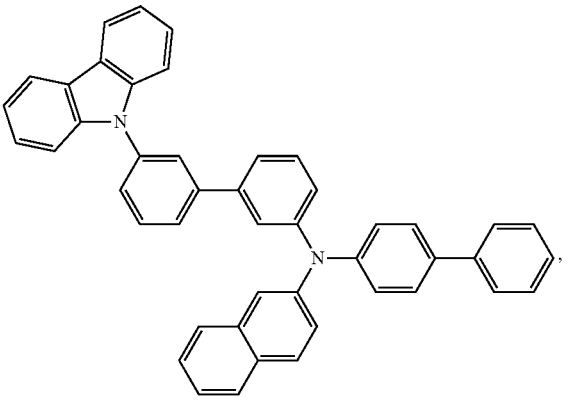
H-153
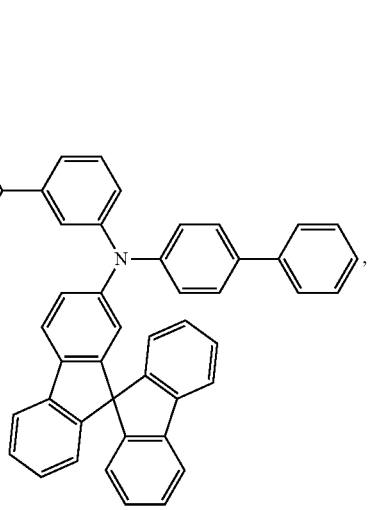
H-154
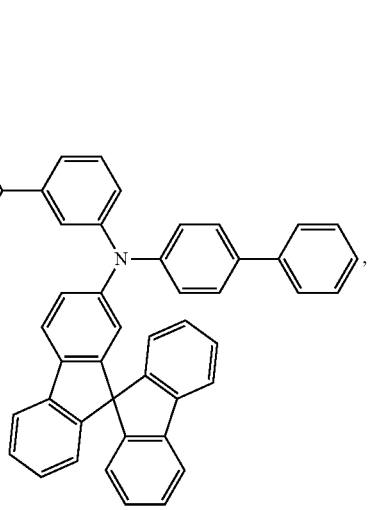

H-155
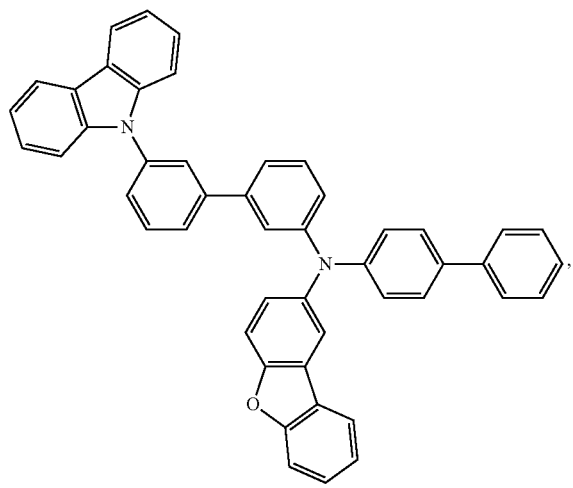
H-156
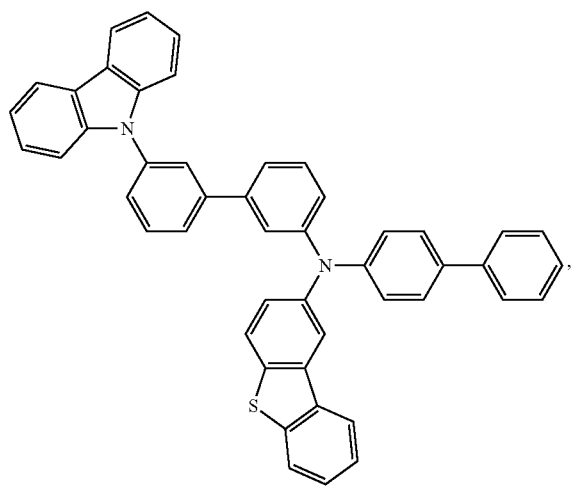
H-157
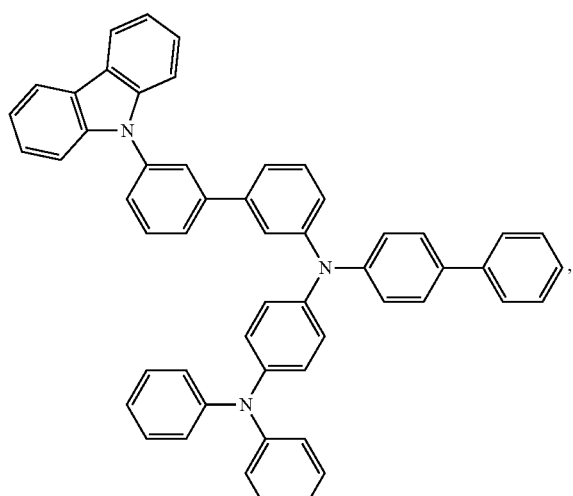
H-158
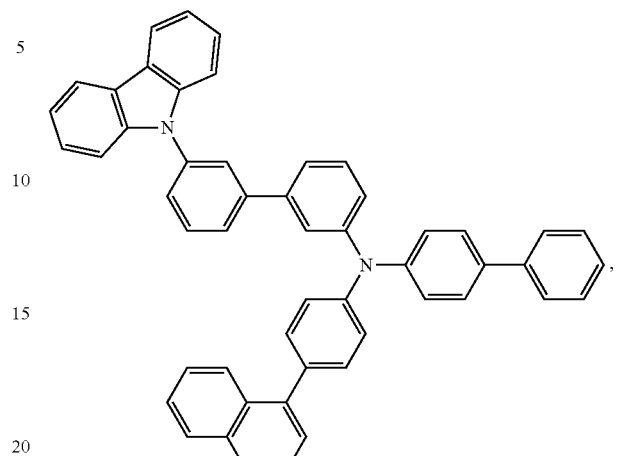
H-159
H-160

-continued
H-161
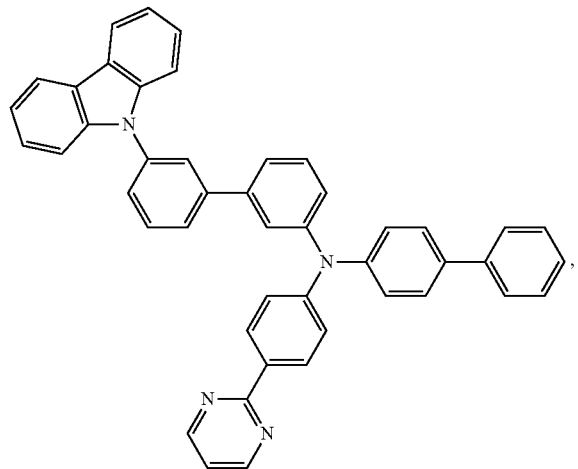
H-162
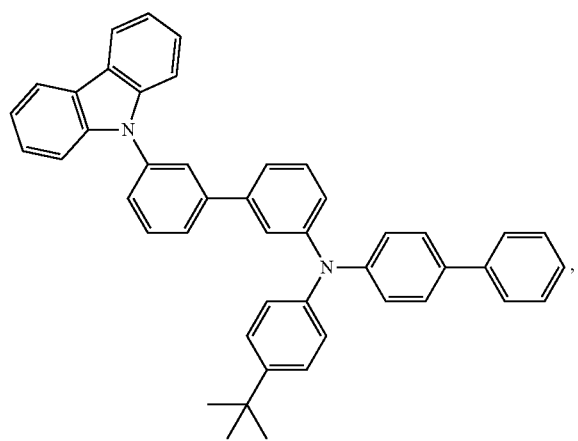
H-163
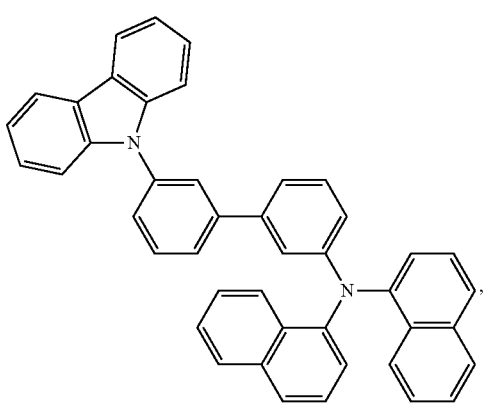
-continued
H-164
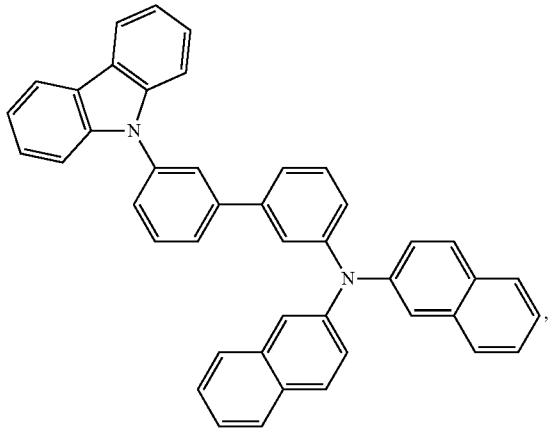
H-165
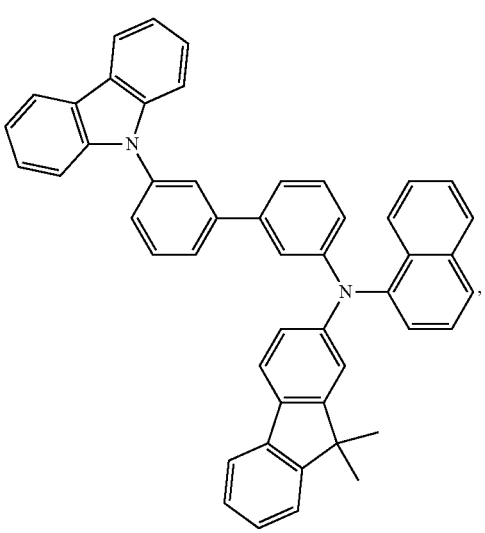
H-166
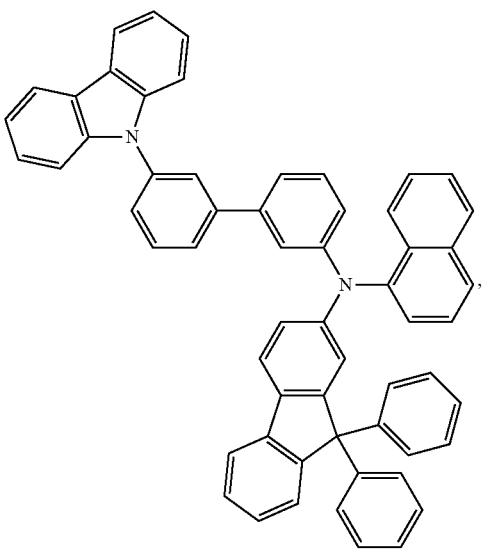

-continued
H-167
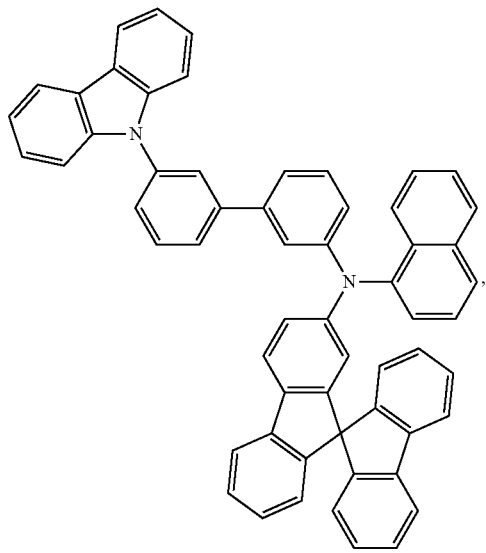
H-168
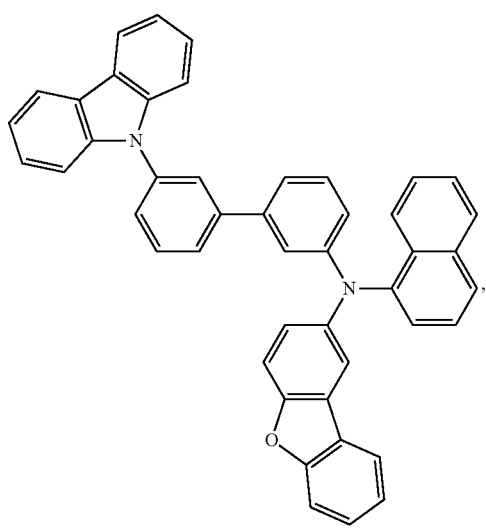
H-169
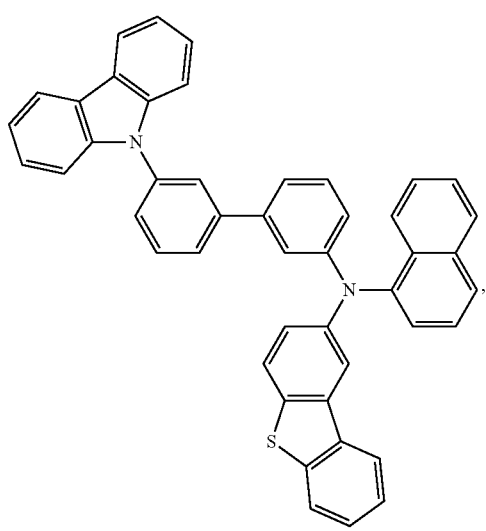
-continued
H-170
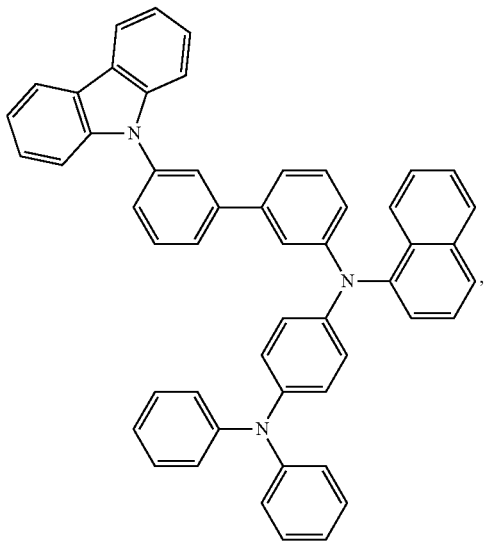
H-171
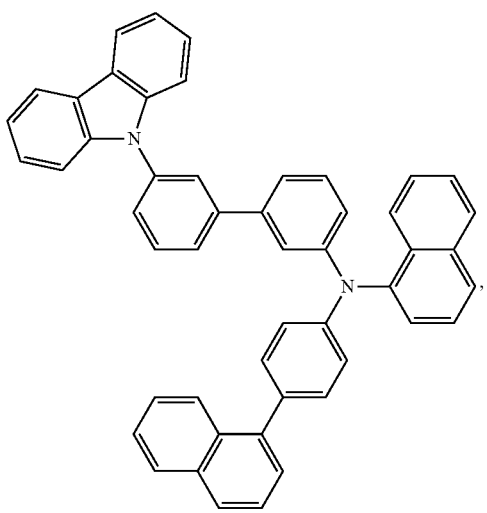
H-172
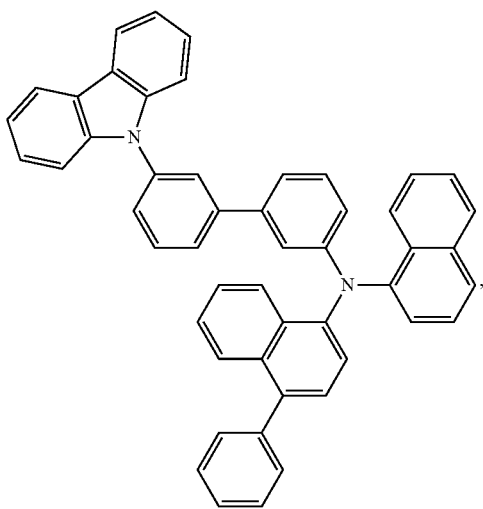

-continued

H-173

H-174

H-175

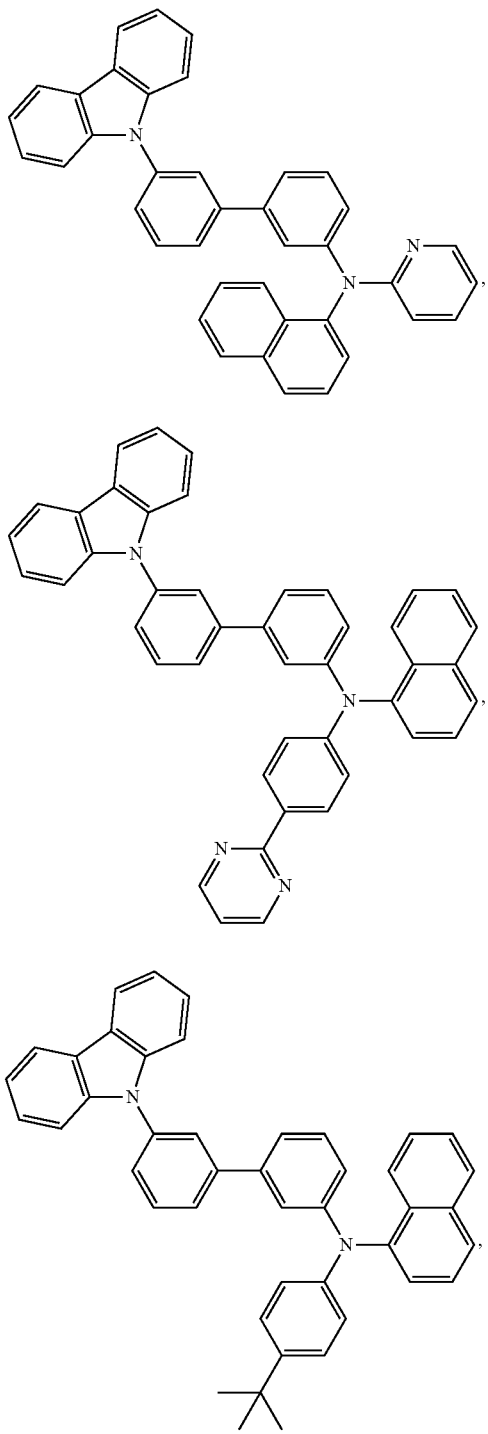

-continued

H-176

16. The organic electroluminescence device according to claim 1, further comprising a second organic layer disposed between the anode and the light-emitting layer, wherein the second organic layer comprises the compound of Formula 2.

17. The organic electroluminescence device according to claim 16, wherein the first organic layer is in contact with the anode.

18. The organic electroluminescence device according to claim 1, wherein the compound of Formula 1 comprised in the first organic layer accounts for not higher than 5%, or not higher than 3%, or not higher than 2%, or not higher than 1% by weight of the entire first organic layer.

19. The organic electroluminescence device according to claim 16, wherein the second organic layer is in contact with the light-emitting layer.

20. The organic electroluminescence device according to claim 1, further comprising a third organic layer disposed between the anode and the light-emitting layer, wherein the third organic layer comprises a compound different from the compound comprised in the second organic layer.

21. A display assembly, comprising the organic electroluminescence device according to claim 1.

* * * * *